United States Patent
Takashima et al.

(10) Patent No.: US 7,662,540 B2
(45) Date of Patent: Feb. 16, 2010

(54) PATTERN FORMING MATERIAL, PATTERN FORMING APPARATUS AND PATTERN FORMING PROCESS

(75) Inventors: Masanobu Takashima, Shizuoka (JP); Shinichiro Serizawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 39 days.

(21) Appl. No.: 11/661,855

(22) PCT Filed: Sep. 5, 2005

(86) PCT No.: PCT/JP2005/016264

§ 371 (c)(1),
(2), (4) Date: Dec. 20, 2007

(87) PCT Pub. No.: WO2006/028060

PCT Pub. Date: Mar. 16, 2006

(65) Prior Publication Data

US 2008/0088813 A1    Apr. 17, 2008

(30) Foreign Application Priority Data

Sep. 6, 2004    (JP)    ............... 2004-258877

(51) Int. Cl.
*G03F 7/00*    (2006.01)
*G03F 7/004*    (2006.01)

(52) U.S. Cl. ............... 430/273.1; 430/270.1; 430/271.1; 430/281.1; 430/284.1; 430/523; 430/527; 430/533; 430/913

(58) Field of Classification Search ............. 430/275.1, 430/533, 270.1, 271.1, 273.1, 523, 527, 281.1, 430/284.1, 311
See application file for complete search history.

(56) References Cited

U.S. PATENT DOCUMENTS 4,360,582 A * 11/1982 Taguchi et al. ............... 430/260
4,975,485 A * 12/1990 Sato et al. ..................... 525/53

(Continued)

FOREIGN PATENT DOCUMENTS

JP    63-74052 A    4/1988

(Continued)

*Primary Examiner*—Amanda C. Walke
(74) *Attorney, Agent, or Firm*—Sughrue Mion, PLLC

(57) ABSTRACT

The present invention aims to provide a pattern forming material that is capable of suppressing generation of wrinkles and static electric charge on a substrate in a lamination step in which the pattern forming material is laminated on the substrate as well as capable of forming a fine and precise pattern; a pattern forming apparatus provided with the pattern forming material; and a pattern forming process using the pattern forming material.

To this end, the present invention provides a pattern forming material having a support, a photosensitive layer, and a protective film, the photosensitive layer and the protective film being formed in this order on the support, wherein the number of fish-eyes each having an area of $2,000\mu m^2$ or more and a maximum height measured from the film surface of $1\mu m$ to $7\mu m$ residing in the protective film is $50/m^2$ to $1,000/m^2$.

16 Claims, 25 Drawing Sheets

U.S. PATENT DOCUMENTS

| | | | |
|---|---|---|---|
| 5,198,484 A * | 3/1993 | Mannion | 524/108 |
| 5,457,013 A * | 10/1995 | Christian et al. | 430/496 |
| 6,233,035 B1 * | 5/2001 | Toshiyuki et al. | 355/22 |
| 6,391,575 B1 * | 5/2002 | Fritz et al. | 435/23 |
| 2006/0051703 A1 * | 3/2006 | Kimura et al. | 430/270.1 |
| 2006/0155073 A1 * | 7/2006 | Oobayashi et al. | 525/242 |
| 2007/0092835 A1 * | 4/2007 | Kimura et al. | 430/270.1 |

FOREIGN PATENT DOCUMENTS

| | | |
|---|---|---|
| JP | 4-129732 A | 4/1992 |
| JP | 07-104463 A | 4/1995 |
| JP | 3019075 B2 | 1/2000 |
| JP | 2000-273203 A | 10/2000 |
| JP | 2001-264971 A | 9/2001 |
| JP | 2001-290278 A | 10/2001 |
| JP | 2002-60426 A | 2/2002 |
| JP | 2003-11289 A | 1/2003 |
| JP | 2003-228168 A | 8/2003 |
| JP | 2003-231759 A | 8/2003 |
| JP | 2003-248320 A | 9/2003 |
| JP | 2004-1244 A | 1/2004 |

* cited by examiner

FIG.3A
FIG.3B
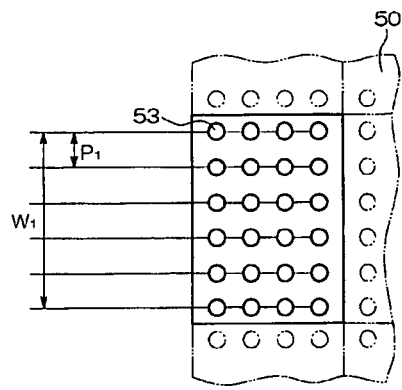
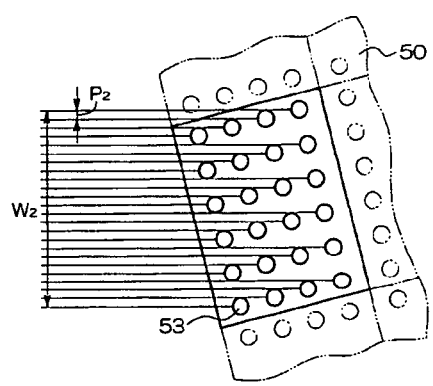
Sub-Scanning Direction
Sub-Scanning Direction
FIG.4A
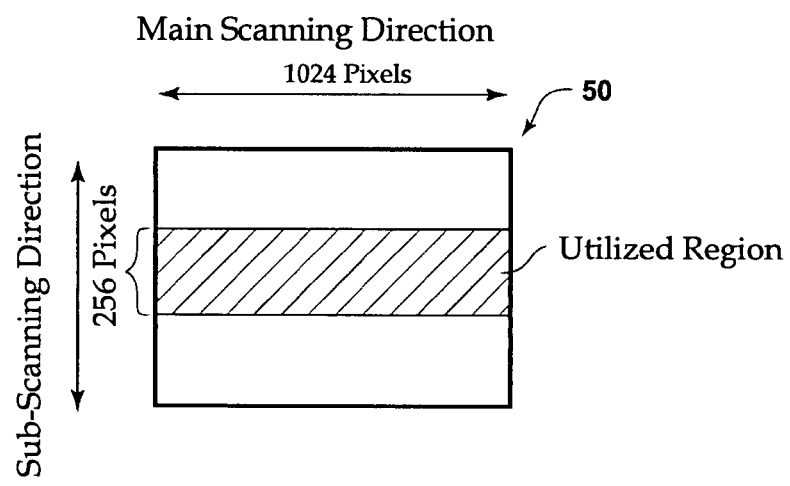
FIG.4B
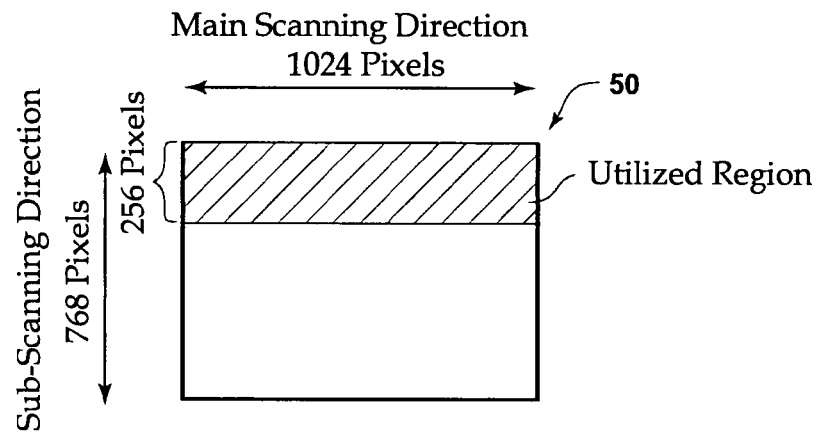

m th row n th line

FIG. 12
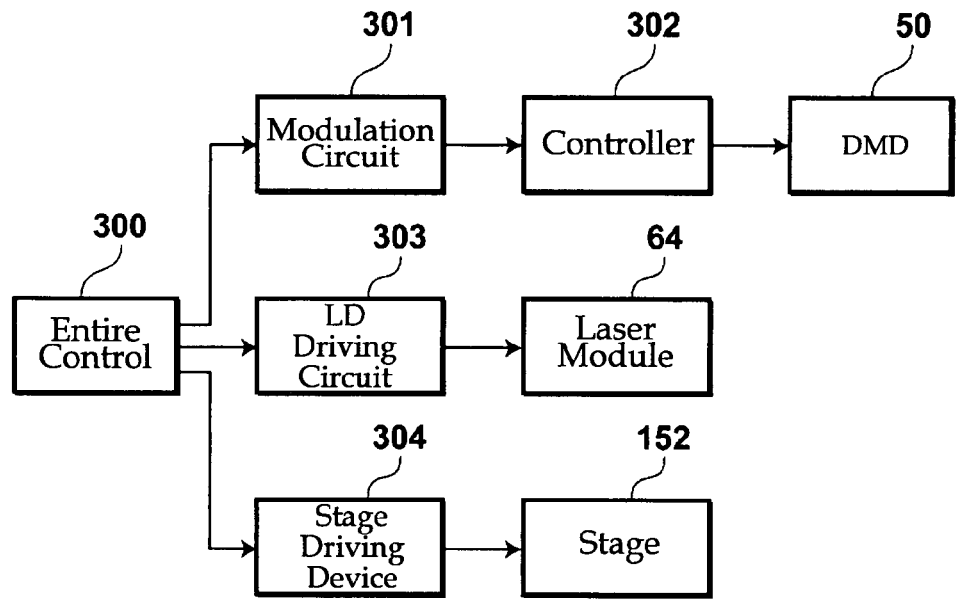
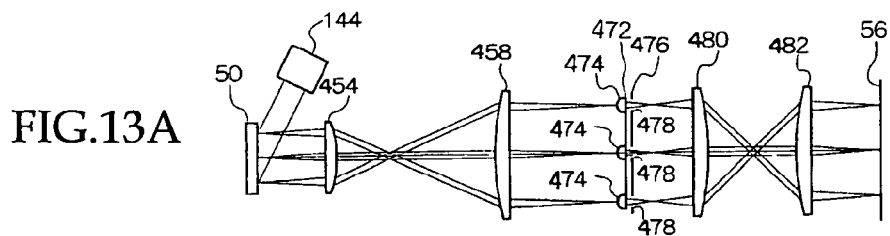
FIG.13A
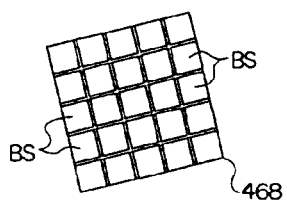
FIG.13B
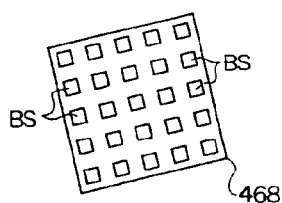
FIG.13C

Cross Section in X Direction
(Rotating Direction)

Cross Section in Y Direction
(Rotating Axis Direction)

FIG. 16A
FIG. 16B
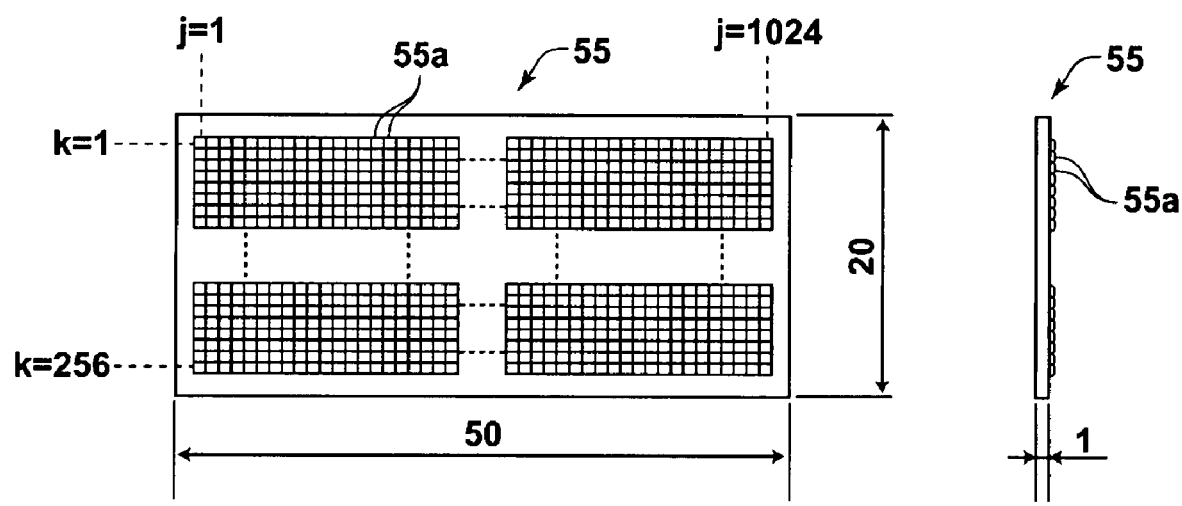
FIG. 17A
FIG. 17B
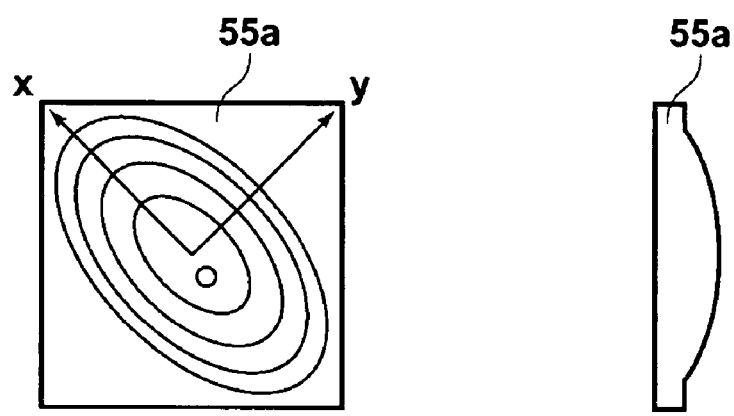

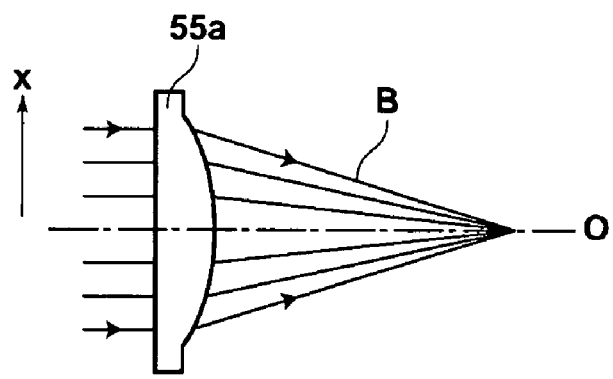
FIG. 18A
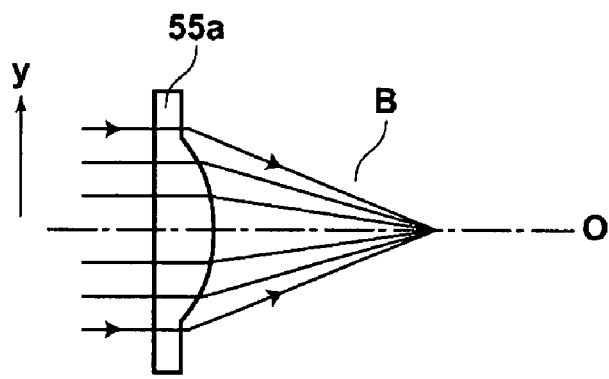
FIG. 18B
FIG. 19A
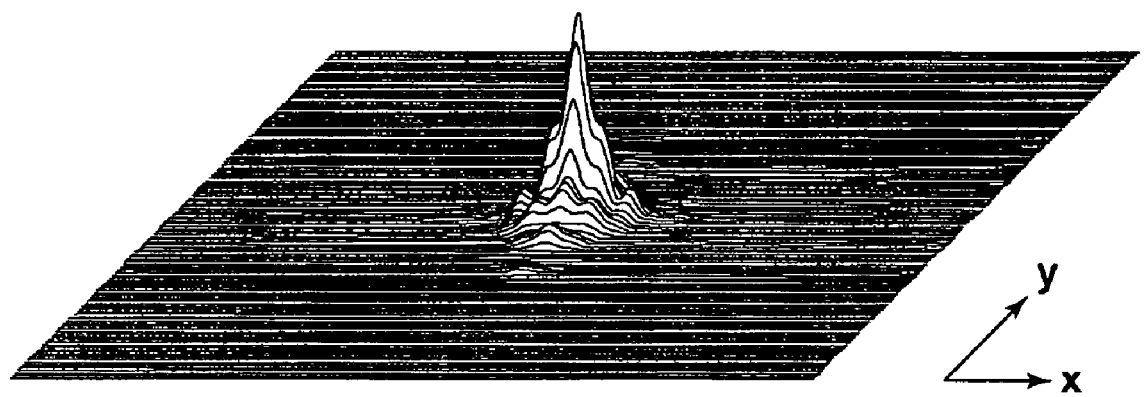
z=0.18mm z=0.2mm z=0.22mm z=0.24mm z=0.18mm z=0.2mm z=0.22mm z=0.24mm

PATTERN FORMING MATERIAL, PATTERN FORMING APPARATUS AND PATTERN FORMING PROCESS

TECHNICAL FIELD

The present invention relates to a pattern forming material that can be preferably used for dry film resist (DFR) and the like, a pattern forming apparatus provided with the pattern forming material, and a pattern forming process using the pattern forming material.

BACKGROUND ART

Conventionally, when forming a permanent pattern such as interconnection pattern, a pattern forming material which is prepared by applying a photosensitive resin composition over a surface of a support, drying the support surface to form a photosensitive layer, and laminating a protective film on the photosensitive layer is used. For a method of producing such an permanent pattern, for example, a pattern forming material is laminated on a substrate such as a copper clad laminate on which a permanent pattern is to be formed while peeling off a protective film from the pattern forming material to form a laminate on the substrate surface, a photosensitive layer in the laminate is then exposed, and after the exposure, the photosensitive layer is developed to thereby form a pattern, and the pattern forming material is subjected to an etching treatment and the like, thereby a permanent pattern can be formed.

For the protective film, typically, a polyolefin film is used. However, in a polyolefin film, defective structure of protrusions called fish-eyes is observed. For this reason, regions of the photosensitive layer which make contact with fish-eyes residing in the protective film are pushed and get thinner, and when the photosensitive layer is exposed and developed, the photosensitive layer may cause pattern defects at the regions.

To solve the problem, a polyethylene film in which fish-eyes are reduced (see Patent Literature 1), and a pattern forming material using a film having substantially less fish-eyes as a protective film (see Patent Literature 2 to Patent Literature 4) have been proposed.

However, since a protective film that has substantially less fish-eyes and is excellent in smoothness excessively adhere to a photosensitive layer, such a protective film may cause wrinkles on a support and the photosensitive layer when successively subjected to a consecutive lamination step such as autocut lamination, and may cause a problem that static electric charge is generated when the protective film is peeled off from the pattern forming material.

Patent Literature 1 to Patent Literature 4 do not disclose, to solve these problems, a pattern forming material that is excellent in laminating property and chargeability can be obtained without degrading photosensitivity of the photosensitive layer and resolution by using a protective film of which the size and the number of fish-eyes are respectively limited within a certain range.

Summarizing the above, a pattern forming material that is capable of suppressing generation of wrinkles and static electric charge on a substrate in a lamination step in which the pattern forming material is laminated on the substrate as well as capable of forming a fine and precise pattern, a pattern forming apparatus provided with the pattern forming material, and a pattern forming process using the pattern forming material have not yet been provided so far, and further improvement and development are still needed.

Patent Literature 1 Japanese Patent Application Laid-Open (JP-A) No. 2000-273203

Patent Literature 2 Japanese Patent (JP-B) No. 3019075

Patent Literature 3 Japanese Patent Application Laid-Open (JP-A) No. 2003-228168

Patent Literature 4 Japanese Patent Application Laid-Open (JP-A) No. 2003-248320

DESCRIPTION OF THE INVENTION

The present invention is proposed in view of the present situation of the technologies and aims to solve the various conventional problems and achieve the following objects. Namely, the present invention aims to provide a pattern forming material that is capable of suppressing generation of wrinkles and static electric charge on a substrate in a lamination step of laminating the pattern forming material on the substrate as well as forming a fine and precise pattern; a pattern forming apparatus provided with the pattern forming material; and a pattern forming process using the pattern forming material.

The means to solve aforesaid problems are as follows:

<1> A pattern forming material which contains a support, a photosensitive layer, and a protective film, the photosensitive layer and the protective film being formed in this order on the support, wherein the number of fish-eyes each having an area of 2,000 $\mu m^2$ or more and a maximum height measured from the film surface of 1 $\mu m$ to 7 $\mu m$ residing in the protective film is 50/$m^2$ to 1,000/$m^2$.

<2> The pattern forming material according to claim 1, wherein the maximum length of the fish-eyes is 80 $\mu m$ or more.

<3> The pattern forming material according to any one of claims 1 to 2, wherein the each of the fish-eyes is a region surrounded by the outer circumference of an interference fringe or a Newton ring appeared around a foreign substance in the protective film when the protective film is irradiated with a transmissive light beam.

<4> The pattern forming material according to any one of claims 1 to 3, wherein the protective film comprises at least one selected from polypropylene resins, ethylene-propylene copolymer resins, and polyethylene terephthalate resins.

<5> The pattern forming material according to any one of claims 1 to 4, wherein the support is a polyethylene terephthalate film.

<6> The pattern forming material according to any one of claims 1 to 5, wherein at least the surface of the support on which the photosensitive layer is not laminated comprises a conductive material; and the surface electrical resistance value of the support surface is $1 \times 10^{18} \Omega/\square$ or less under the environment of a temperature of 10° C. and a relative humidity of 35%.

<7> The pattern forming material according to any one of claims 1 to 6, wherein the support is a polyethylene terephthalate film containing a conductive material.

<8> The pattern forming material according to any one of claims 1 to 7, wherein the photosensitive layer comprises a binder, a polymerizable compound, a photopolymerization initiator, and a photosensitizer; and the photosensitizer is a condensed ring compound.

<9> The pattern forming material according to the item <8>, wherein the binder has an acidic group.

<10> The pattern forming material according to any one of the items <8> to <9>, wherein the binder contains a vinyl copolymer.

<11> The pattern forming material according to any one of the items <8> to <10>, wherein the binder comprises a copolymer of at least any one of a styrene and a styrene derivative.

<12> The pattern forming material according to any one of the items <8> to <11>, wherein the acid value of the binder is 70 mgKOH/g to 250 mgKOH/g.

<13> The pattern forming material according to any one of the items <8> to <12>, wherein the polymerizable compound comprises at least one selected from compounds each containing a propylene oxide group, compounds each containing an ethylene oxide group, compounds each containing a urethane group, and compounds each containing an aryl group.

<14> The pattern forming material according to any one of the items <8> to <13>, wherein the polymerizable compound has a bisphenol skeleton.

<15> The pattern forming material according to any one of the items <8> to <14>, wherein the photopolymerization initiator contains at least one selected from the group consisting of halogenated hydrocarbon derivatives, hexaaryl-biimidazoles, oxime derivatives, organic peroxides, thio compounds, ketone compounds, aromatic onium salts, and metallocenes.

<16> The pattern forming material according to any one of the items <8> to <15>, wherein the photopolymerization initiator contains a hexaaryl-biimidazole.

<17> The pattern forming material according to any one of the items <8> to <16>, wherein the maximum absorption wavelength of the photosensitizer is 380 nm to 450 nm.

<18> The pattern forming material according to any one of the items 5<8> to <17>, wherein the photosensitizer is at least one selected from acridones, acridines, and coumarins.

<19> The pattern forming material according to any one of the items <1> to <18>, wherein the photosensitive layer contains a polymerization inhibitor.

<20> The pattern forming material according to the item <19>, wherein the polymerization inhibitor contains at least one selected from aromatic rings, heterocyclic rings, imino groups, and phenolic hydroxyl groups.

<21> The pattern forming material according to any one of the items <19> to <20>, wherein the polymerization inhibitor is at least one selected from compounds each having at least two phenolic hydroxyl groups, compounds each having an aromatic ring substituted by an imino group, compounds each having a heterocyclic ring substituted by an imino group, and hindered amine compounds.

<22> The pattern forming material according to any one of the items <19> to <21>, wherein the polymerization inhibitor is at least one selected from catechols, phenothiazines, phenoxazines, hindered amines, and derivatives thereof.

<23> The pattern forming material according to any one of the items <19> to <22>, wherein the content of the polymerization inhibitor is 0.005% by mass to 0.5% by mass relative to the polymerized compound.

<24> The pattern forming material according to any one of the items <1> to <23>, wherein the thickness of the photosensitive layer is 1 μm to 100 μm.

<25> The pattern forming material according to any one of the items <1> to <24>, wherein the photosensitive layer contains the binder in an amount of 30% by mass to 90% by mass, the polymerized compound in an amount of 5% by mass to 60% by mass, and the photopolymerization initiator in an amount of 0.1% by mass to 30% by mass.

<26> The pattern forming material according to any one of the items <1> to <25>, wherein the pattern forming material is formed in an elongated shape and rolled in a roll shape.

<27> The pattern forming material according to any one of the items <1> to <26>, wherein when the photosensitive layer is exposed and developed, the minimum optical energy of a light beam used for exposing the photosensitive layer so as not to change the thickness of exposed sites after the exposure and developing is 10 mJ/cm$^2$ or less.

<28> The pattern forming material according to any one of the items <1> to <27>, wherein the exposure wavelength used when the minimum optical energy of the light beam used for exposing the photosensitive layer is 405 nm.

<29> The pattern forming material according to any one of the items 20<1> to <28>, wherein after a light beam from a light irradiation unit is modulated by a light modulating unit having "n" imaging portions that can receive the light beam from the light irradiating unit and can output the light beam, the photosensitive layer is exposed with the light beam passed through a microlens array having an array of microlenses each having a non-spherical surface capable of compensating the aberration due to distortion at irradiating surface of an imaging portion in the light modulating unit.

<30> A pattern forming apparatus equipped with a light irradiation unit configured to irradiate the pattern forming material with a light beam, and a light modulating unit configured to modulate the light beam emitted from the light irradiation unit and expose a photosensitive layer in the pattern forming material, wherein the pattern forming material is a pattern forming material according to any one of the items <1> to <29>. In the pattern forming apparatus according to the item <30>, the light irradiation unit is configured to emit a light beam toward the light modulating unit. The light modulation unit is configured to modulate the light beam received from the light irradiation unit. The photosensitive layer is exposed with the light beam modulated by the light modulating unit. Thereafter, for example, the photosensitive layer is developed, then a fine and precise pattern can be formed.

<31> The pattern forming apparatus according to the item <30>, wherein the light modulating unit is further equipped with a pattern signal generating unit configured to generate control signals based on the information of a pattern to be formed, and the light modulating unit is configured to modulate the light beam emitted from the light irradiation unit according to the control signals generated by the pattern signal generating unit. In the pattern forming apparatus according to the item <31>, by providing with the pattern signal generating unit to the light modulating unit, the light beam emitted from the light irradiation unit is modulated according to the control signals generated by the pattern signal generating unit.

<32> The pattern forming apparatus according to any one of the items <30> to <31>, wherein the light modulating unit has "n" imaging portions, and is able to control any imaging portions of less than arbitrarily selected "n" imaging portions disposed successively from among the "n" imaging portions depending on the information of a pattern to be formed. In the pattern forming apparatus according to the item <32>, by controlling any imaging portions of less than arbitrarily selected "n" imaging portions disposed successively from among the "n" imaging portions in the light modulating unit depending on the information of a pattern to be formed, the light beam emitted from the light irradiation unit can be modulated at high speed.

<33> The pattern forming apparatus according to any one of the items <30> to <32>, wherein the light modulating unit is a spatial light modulator.

<34> The pattern forming apparatus according to the item <33>, wherein the spatial light modulator is a digital micromirror device (DMD).

<35> The pattern forming apparatus according to any one of the items <32> to <34>, wherein the imaging portions are micromirrors.

<36> The pattern forming apparatus according to any one of the items <30> to <35>, wherein the light irradiation unit can combine two or more types of light for irradiation. In the pattern forming apparatus according to the item <36>, the light irradiation unit allowing for combining two or more types of light for irradiation enables exposures with deeper focal depth. As the result, the photosensitive layer can be finely and precisely exposed. For example, thereafter, the photosensitive layer is developed, then a highly fine and precise pattern can be formed.

<37> The pattern forming apparatus according to any one of the items <30> to <36>, wherein the light irradiation unit has plural laser irradiating devices, a multimode optical fiber, and a collecting optical system that collects respective laser beams and connect them to the multimode optical fiber. In the pattern forming apparatus according to the item <37>, the light irradiation unit can collect laser beams respectively emitted from the plural lasers by the use of the collecting optical system and connect them to the multimode optical fiber, and thus it enables exposures with deeper focal depth. As the result, the photosensitive layer can be finely and precisely exposed. For example, thereafter, the photosensitive layer is developed, then a highly fine and precise pattern can be formed.

<38> A pattern forming process including at least exposing a photosensitive layer in a pattern forming material according to any one of the items <1> to <29>. In the pattern forming process according to the item <38>, the pattern forming material is exposed. For example, thereafter, the photosensitive layer is developed, then a highly fine and precise pattern can be formed.

<39> The pattern forming process according to the item <38>, wherein the pattern forming material is laminated on a substrate while performing at least any one of heating and pressurizing the pattern forming material and then exposed.

<40> The pattern forming process according to any one of the items <38> to <39>, wherein the photosensitive layer is imagewisely exposed based on the information of a pattern to be formed.

<41> The pattern forming process according to any one of the items <38> to <40>, wherein the photosensitive layer is exposed with the use of a light beam which is modulated according to control signals generated based on the information of the pattern to be formed. In the pattern forming process according to the item <41>, control signals are generated based on the information of a pattern to be formed, and the light beam is modulated depending on the control signals.

<42> The pattern forming process according to any one of the items 5<38> to <41>, wherein the photosensitive layer is exposed using a light irradiation unit configured to irradiate a light beam and a light modulating unit configured to modulate the light beam emitted from the light irradiation unit based on the information of the pattern to be formed.

<43> The pattern forming process according to the item <42>, wherein after the light beam is modulated by the light modulating unit, the photosensitive layer is exposed through a microlens array having an array of microlenses each having a non-spherical surface capable of compensating the aberration due to distortion at irradiating surface of an imaging portion in the light modulating unit. In the pattern forming process according to the item <43>, the light beam modulated by the light modulating unit passes through the non-spherical surface in the microlens array. With this configuration, the aberration due to distortion at irradiating surface of the imaging portion can be compensated. As the result, distortion of an image to be formed on the pattern forming material is prevented, and the photosensitive layer can be finely and pre-cisely exposed. For example, thereafter, the photosensitive layer is developed, then a highly fine and precise pattern can be formed.

<44> The pattern forming process according to the item <43>, wherein the non-spherical surface is a toric surface. In the pattern forming process according to the item <44>, the non-spherical surface is a toric surface, and thus aberration due to distortion at irradiating surface of the imaging portion can be efficiently compensated, and distortion of an image to be formed on the pattern forming material can be efficiently prevented. As the result, the photosensitive layer can be finely and precisely exposed. For example, thereafter, the photosensitive layer is developed, then a highly fine and precise pattern can be formed.

<45> The pattern forming process according to any one of the items <38> to <44>, wherein the photosensitive layer is exposed through an aperture array. In the pattern forming process according to the item <45>, by exposing the photosensitive layer through the aperture array, the extinction ratio can be increased. As the result, the photosensitive layer can be finely and precisely exposed. For example, thereafter, the photosensitive layer is developed, then a highly fine and precise pattern can be formed.

<46> The pattern forming process according to any one of the items <38> to <45>, wherein the photosensitive layer is exposed while relatively moving the exposure laser beam and the thermosensitive layer. In the pattern forming process according to the item <46>, by relatively moving the modulated laser beam and the photosensitive layer, the exposure can be carried out at high speed. For example, thereafter, the photosensitive layer is developed, then a highly fine and precise pattern can be formed.

<47> The pattern forming process according to any one of the items <38> to <46>, wherein part of region of the photosensitive layer is exposed.

<48> The pattern forming process according to any one of the items <38> to <47>, wherein after exposing the photosensitive layer, the photosensitive layer is developed. In the pattern forming process according to the item <48>, a fine and precise pattern can be formed by exposing the photosensitive layer and developing the exposed photosensitive layer.

<49> The pattern forming process according to any one of the items <38> to <48>, wherein after developing the photosensitive layer, a permanent pattern is formed on the surface of the photosensitive layer.

<50> The pattern forming process according to the item <49>, wherein the permanent pattern is an interconnection pattern, and the permanent pattern is formed by at least any one of an etching treatment and a plating treatment.

According to the present invention, it is possible to provide a pattern forming material that is capable of suppressing generation of wrinkles and static electric charge on a substrate in a lamination step of laminating the pattern forming material on the substrate as well as forming a fine and precise pattern; a pattern forming apparatus provided with the pattern forming material; and a pattern forming process using the pattern forming material.

BRIEF DESCRIPTION OF DRAWINGS

FIG. 3A is an exemplary plan view that shows the exposing beam and the scanning line in the case where the DMD is not inclined, as compared to the exposing beam and the scanning line in the case where the DMD is inclined.

FIG. 3B is an exemplary plan view that shows the exposing beam and the scanning line in the case where a DMD similar to that shown in FIG. 3A is not inclined, as compared to the exposing beam and the scanning line in the case where the DVD is inclined.

FIG. 4A is an exemplary view that shows an available region of the DMD.

FIG. 4B is an exemplary view that shows another available region of the DMD, which is similar to that shown in FIG. 4A.

FIG. 12 shows an exemplary controller configured to control the DMD based on pattern information.

FIG. 13A is an exemplary cross sectional view that shows a construction of another exposing head in other connecting optical system along the optical axis.

FIG. 13B is an exemplary plan view that shows an optical image projected on an exposed surface when a microlens array is not employed.

FIG. 13C is an exemplary plan view that shows an optical image projected on an exposed surface when a microlens array is employed.

FIG. 16A is an exemplary front view that shows a microlens array employed in a pattern forming apparatus in the present invention.

FIG. 16B is an exemplary side view that shows a microlens array employed in a pattern forming apparatus in the present invention.

FIG. 17A is an exemplary front view that shows a microlens constituting a microlens array.

FIG. 17B is an exemplary side view that shows a microlens constituting a microlens array.

FIG. 18A is an exemplary view that schematically shows a laser collecting condition in a cross section of a microlens.

FIG. 18B is an exemplary view that schematically shows a laser collecting condition in another cross section of a microlens.

FIG. 19A is an exemplary view that shows a simulation of beam diameters near the focal point of a microlens in accordance with the present invention.

FIG. 27A (B) is a partially enlarged view of FIG. 27A (A).

FIG. 27A (C) is an exemplary plan view that shows an arrangement of emitting sites of laser output.

FIG. 27A (D) is an exemplary plan view that shows another arrangement of laser emitting sites.

Figure 1:
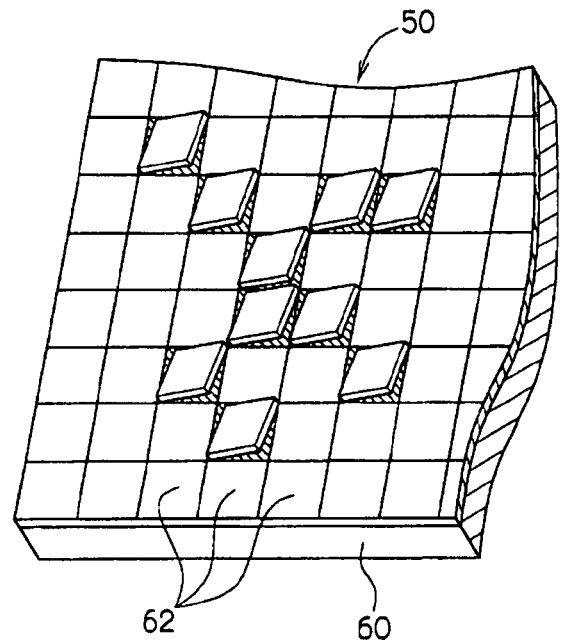
FIG. 1 is a partially enlarged view that shows exemplarily a construction of a digital micromirror device (DMD).

BEST MODE FOR CARRYING OUT THE INVENTION (Pattern Forming Material)

The pattern forming material of the present invention has at least a photosensitive layer and a protective film formed in this order on a support and may have other layers suitably selected in accordance with the necessity. For the photosensitive layer, a single layer or two or more layers may be employed.

The area of a fish-eye residing in the protective film is 2,000 $\mu m^2$ or more, and the number of fish-eyes each having a maximum height of 1 $\mu m$ to 7 $\mu m$ measured from the film surface is 50/$m^2$ to 1,000/$m^2$.

<Protective Film>

In the protective film, the area of a fish-eye residing in the protective film is 2,000 $\mu m^2$ or more, and the number of fish-eyes each having a maximum height of 1 $\mu m$ to 7 $\mu m$ measured from the film surface is 50/$m^2$ to 1,000/$m^2$, more preferably 100/$m^2$ to 900/$m^2$.

When the number of fish-eyes is less than 50/$m^2$, the adhesiveness between the protective film and the photosensitive layer may be excessively high, and when the protective film is peeled in a lamination step for laminating the pattern forming material on the substrate, the pattern forming material is charged to deliver a shock to workers, the charged pattern forming material may be a cause of failures of device, and dust adheres to the photosensitive layer to cause unexposed regions in a subsequent exposure step to thereby cause pattern defects.

In contrast, the number of fish-eyes is more than 1,000/$m^2$, the fish-eyes may be a cause of pattern defects.

Particularly, since fish-eyes each having an area of about 7,000 $\mu m^2$ or more and a maximum length more than 130 $\mu m$ or a maximum height more than 3 $\mu m$ affect the smoothness of the film to cause significant pattern defects, the number of fish-eyes in the protective film is preferably 200/$m^2$ or less, and more preferably 100/$m^2$ or less.

The maximum length of fish-eyes is 80 $\mu m$ or more.

In the present invention, a fish-eye has a core of a foreign substance in the substantially center thereof and indicates an optically nonuniform region in which an interference fringe (a Newton ring) is observed when the film is irradiated with a transmissive light beam, and the area and the length of a fish-eye respectively indicate an area and a length of a region surrounded by the outer circumference of the interference fringe (Newton ring).

Examples of the foreign substance include components whose viscosity and molecular mass are different from those of the raw material resin of the film, gel substances, unmelted resin, oxidized and degraded resin, flakes of wrapping materials for raw materials, and dust. These foreign substances are mixed in raw materials of a film in a film forming process, and then fish-eyes i.e. defective structure are formed in the film in a state where the fish-eyes respectively have a foreign substance as the core.

The size and the number of fish-eyes formed in a film can be controlled by controlling the composition of raw materials, kneading condition, and melting condition, and by filtering the melted raw materials.

The presence or absence of fish-eyes can be visually checked, however, the area, height, and the maximum length of fish-eyes can be measured by using an optical microscope, a polarized-light microscope, or a laser microscope.

For example, fish-eyes are found using an optical microscope at 100-fold magnification, positions near fish-eyes are marked with a permanent marker and numbered, and then the area, the maximum height, the maximum length of the fish-eyes can be measured using a laser microscope.

Materials contained in the protective film are not particularly limited and may be suitably selected in accordance with the intended use. Examples thereof include polypropylene resins, polyethylene resins, ethylene-propylene copolymer resins, polyethylene terephthalate resins. Each of these materials may be used alone or in combination with two or more. The protective film may be a laminate film having two or more layers formed in a laminate structure. Preferred examples of the laminate film include a laminate film in which a polypropylene resin film and an ethylene-propylene copolymer resin film are formed in a laminate structure.

The thickness of the protective film is not particularly limited and may be suitably adjusted in accordance with the intended use, however, the thickness is preferably 5 $\mu m$ to 100 $\mu m$, more preferably 8 $\mu m$ to 50 $\mu m$, and particularly preferably 10 $\mu m$ to 30 $\mu m$, for example.

The adhesive force between the protective film and the photosensitive layer is preferably smaller than the adhesive force between the photosensitive layer and layers disposed adjacent to the photosensitive layer other than the protective film (for example, a support).

The protective film may be subjected to a surface treatment to control the adhesiveness to the photosensitive layer. The surface treatment of the protective film can be carried out as follows. For example, on a surface of the protective film, an undercoat layer composed of polymer such as polyorganosiloxane, fluorinated polyolefin, polyfluoroethylene, and polyvinyl alcohol is formed. A coating solution of the polymer is applied over a surface of the protective film, and the protective film surface is dried at 30° C. to 150° C. (particularly at 50° C. to 120° C.) for 1 minute to 30 minutes to thereby form an undercoat layer on the protective film.

In order to increase the adhesive force between the support and the photosensitive layer, the support may be subjected to a surface treatment.

Examples of the surface treatment include forming an undercoat layer on the support, corona discharge treatment, flame treatment, ultraviolet ray irradiation treatment, radiofrequency irradiation treatment, glow discharge treatment, active plasma irradiation treatment, and laser beam irradiation treatment.

<Support>

The support is not particularly limited and may be suitably selected in accordance with the intended use, however, the support is preferably the one that can be peeled off from the photosensitive layer and is excellent in light transmission, and the one further having excellent smoothness is more preferably used.

When peeling-off the protective film from the pattern forming material in the lamination step for laminating the pattern forming material on the substrate, and when peeling-off a support after the lamination step, the pattern forming material is charged to deliver a shock to workers, the charged pattern forming material may be a cause of failures of device, dust adheres to the photosensitive layer to cause unexposed regions in a subsequent exposure step to thereby cause pattern defects. To prevent these troubles, the support preferably contain a conductive material in at least the surface on which the photosensitive layer is not formed, or the support preferably has a conductive layer on the surface on which the photosensitive layer is not formed, or the support itself preferably has electrical conductivity.

The support preferably contains a conductive material in at least the surface on which the photosensitive layer is not laminated, and the surface electrical resistance of the support is preferably $1 \times 10^{18} \Omega/\square$ or less under the environment of a temperature of 10° C. and a relative humidity of 35%.

Examples of the conductive material include metal oxide fine particles and antistatic agents. For the method of adding a conductive material to the support, a method of applying metal oxide fine particles or an antistatic agent over the support surface, and a method of kneading metal oxide fine particles or an antistatic agent into the support are exemplified.

The used amount of the dry weight-based conductive material is preferably 0.005 g/m² to 20 g/m² relative to the surface area of the support, and more preferably 0.01 g/m² to 10 g/m².

Examples of the metal oxide fine particles include fine particles of at least one crystalline metal oxide selected from zinc oxides, titanium oxides, tin oxides, aluminum oxides, indium oxides, silicon oxides, magnesium oxides, barium oxides, and molybdenum oxides, and fine particles of composite oxide composed of the crystalline metal oxide.

The volume resistance of the metal oxide fine particles is preferably $10^7 \Omega \cdot cm$ or less, more preferably $10^5 \Omega \cdot cm$ or less, and the particle diameter is preferably 0.01 μm to 0.7 μm, and more preferably 0.02 μm to 0.5 μm.

For the method of producing the metal oxide fine particles, the method described in Japanese Patent Application Laid-Open (JP-A) No. 56-143430, and the like are exemplified, for example.

Specifically, first, a method of which metal oxide fine particles are produced by calcination, and the metal oxide fine particles are heated in the presence of a different type of atom used for enhancing the conductivity; secondary, a method of which a different type of atom used for enhancing the conductivity is made to coexist when producing metal oxide fine particles by calcination; and third, the oxygen concentration in oxygen atmosphere is reduced when producing metal oxide fine particles by calcination to introduce oxygen defect to the metal oxide fine particles. Examples of the case of containing a different type of atom include Al, In, etc. relative to ZnO, Nb, Ta, etc. relative to TiO₂, Sb, Nb, halogen, etc. relative to SnO₂.

Preferred examples of the antistatic agent include anionic surfactants such as alkyl phosphate-based surfactant (for example, ELECTROSTRIPPER A manufactured by Kao Corporation; and ELENON No. 19 manufactured by Dai-ichi Kogyo Seiyaku Co., Ltd., and the like); amphoteric surfactants such as betaine-based surfactants (for example, AMORGEN K manufactured by Dai-ichi Kogyo Seiyaku Co., Ltd., and the like); and nonionic surfactants such as polyoxyethylene fatty acid ester-based surfactants (for example, NISSAN NONION L manufactured by NOF Corporation, and the like), polyoxyethylene alkyl ether-based surfactants (for example, EMALGEN 106, EMALGEN 120, EMALGEN 147, EMALGEN 420, EMALGEN 220, EMALGEN 905, EMALGEN 910 manufactured by Kao Corporation; NISSAN NONION E manufactured by NOF Corporation, and the like). In addition, as nonionic surfactants, polyoxyethylene alkyl phenol ether-based surfactants, polyvalent alcohol fatty acid ester-based surfactants, polyoxyethylene sorbitan fatty acid ester-based surfactants, and polyoxyethylene alkyl amine-based surfactants are exemplified.

In the conductive layer, it is possible to use, as a binder, a homopolymer or a copolymer each containing gelatin; cellulose ester such as cellulose nitrate, cellulose triacetate, cellulose diacetate, cellulose acetate butylate, cellulose acetate propionate; vinylidene chloride, vinyl chloride, styrene, acrylonitrile, vinyl acetate, alkyl (alkyl group having 1 to 4 carbon atoms) acrylate, vinyl pyrrolidone and the like; soluble polyester, polycarbonate, soluble polyamine, and the like.

To disperse a conductive material in the binder, a dispersion liquid such as titanium-based disperser and silane-based disperser may be added, and a binder crosslinking agent may be added.

Examples of the titanium-based disperser include the titanate-based coupling agents described in U.S. Pat. Nos. 4,069,192 and 4,080,353, and PLENACT (trade name, manufactured by Ajinomoto Co., Inc.).

Examples of the silane coupling dispersers include vinyltrichlorosilane, vinyltriethoxysilane, vinyltris (β-methoxyethoxy) silane, γ-methacryloxypropyltrimethoxysilane. As the "silane coupling agent", commercial products available from Shin-Etsu Chemical Co., Ltd., etc. are usable.

Examples of the binder crosslinking agent include epoxybase d crosslinkers, isocyanate-based crosslinking agents, aziridine-based crosslinkers, and epoxy-based crosslinkers.

The conductive layer can be formed by a method of which the conductive material is dispersed in the binder, and the dispersion liquid is applied over a surface of the support, or a method of which the support is subjected to an undercoat treatment, and the conductive material is deposited on the undercoated support surface.

When the conductive layer is formed on the support surface on which the photosensitive layer is not laminated, a hydrophobic polymer layer may be further formed on the conductive layer to enhance scratch resistance.

The hydrophobic polymer layer can be formed by applying a solution or a water-based latex in which a hydrophobic polymer is dissolved in an organic solvent over the conductive layer surface. The coating amount of the dry-based hydrophobic polymer is preferably 0.05 g/m² to 1 g/m².

Examples of the hydrophobic polymer include cellulose esters (nitrocellulose, cellulose acetate, and the like), vinyl polymers containing vinyl chloride, vinylidene chloride, or vinyl acrylate, etc.), and polymers such as organic solvent-soluble polyamides, and polyesters.

For the hydrophobic polymer layer, a slipping agent for imparting slipperiness (for example, the carboxylic amide described in Japanese Patent Application Laid-Open No.

55-79435) may be used, and a matting agent etc. may be added. Such a hydrophobic polymer layer does not substantially affect the effect of the conductive layer.

An undercoat layer for the conductive layer can also be provided. For the undercoat layer, it is possible to use the vinylidene chloride copolymers described in Japanese Patent Application Laid-Open (JP-A) No. 51-135526, U.S. Pat. Nos. 3,143,421, 3,586,508, 2,698,235, and 3567452; diolefine-based copolymers such as the butadienes described in Japanese Patent Application Laid-Open (JP-A) No. 51-114120, U.S. Pat. No. 3,615,556, and the like; the glycidyl acrylate-containing or glycidyl methacrylate-containing copolymers described in Japanese Patent Application Laid-Open (JP-A) No. 51-58469; the polyamide-epichlorhydrin resins described in Japanese Patent Application Laid-Open (JP-A) No. 48-24923; and the maleic acid anhydride-containing copolymers described in Japanese Patent Application Laid-Open (JP-A) No. 50-39536.

In addition, the conductive layers described in Japanese Patent Application Laid-Open (JP-A) Nos. 56-82504, 56-143443, 57-104931, 57-118242, 58-62647, and 60-258541 can also be arbitrarily used.

When the conductive material is contained in a plastic raw material that is the same as or different from the plastic material used for the support to form a conductive layer by co-extrusion with the synthetic resin film of the support, it is preferable because a conductive layer that is excellent in adhesiveness and scratch resistance can be obtained, and there is not need to provide with the hydrophobic polymer layer and the undercoat layer.

When the conductive layer is formed by a coating method, it is possible to employ roller coating method, air-knife coating method, gravure coating method, bar coating method, curtain coating method can be employed.

The support is preferably a synthetic resin film. For the synthetic resin film, a polyester resin film is preferable, and a biaxially drawn polyester film is particularly preferable.

Examples of the polyester resin include polyethylene terephthalate, polyethylene naphthalate, poly(meth)acrylic acid ester copolymers, poly(meth)acrylic acid alkyl esters, polyethylene-2,6-naphthalate, polytetramethylene terephthalate, and polytetramethylene-2,6-naphthalate. Of these, polyethylene terephthalate is particularly preferable.

Each of these polyester resins may be used alone or in combination with two or more.

Examples of resins other than the polyester resins include polypropylenes, polyethylenes, cellulose triacetates, cellulose diacetates, polyvinyl chlorides, polyvinyl alcohols, polycarbonates, polystyrenes, cellophanes, polyvinylidene chloride copolymers, polyamides, polyimides, vinyl chloride-vinyl acetate copolymers, polytetrafluoroethylenes, polytrifluoroethylenes, cellulose resins, and nylon resins. Each of these resins may be used alone or in combination with two or more.

The synthetic resin film may be a single layer or a laminate having two or more layers. When the synthetic resin film is a laminate having two or more layers, it is preferable to contain the inactive fine particles in a layer located farther from the photosensitive layer.

The synthetic resin film is preferably a biaxially drawn polyester film from the perspective of mechanical strength properties and optical properties.

The method of biaxial orientation of the biaxially drawn polyester film is not particularly limited and may be suitably selected in accordance with the intended use. For example, the polyester resin is melt-extruded into a sheet, and the polyester resin sheet is quenched to prepare an undrawn film.

Then, the drawing temperature at the time of biaxially drawing the undrawn film is set to 85° C. to 145° C., the drawing rate of the undrawn film in the longitudinal direction and in the lateral direction is set to 2.6 times to 4.0 times, and where necessary, the biaxially drawn film is thermally fixed at 150° C. to 210° C. to thereby prepare a biaxially drawn polyester film.

For the biaxial drawing, a successive biaxial drawing method may be employed in which an undrawn film is drawn in the longitudinal direction or the lateral direction to form a uniaxially drawn film, and then the uniaxially drawn film is drawn in the lateral direction or the longitudinal direction, or a concurrent biaxial drawing method may be employed in which the undrawn film is drawn concurrently in the longitudinal direction and the lateral direction. In addition, the biaxially drawn film can be further drawn in at least any one of the longitudinal direction and the lateral direction in accordance with the necessity.

The thickness of the support is not particularly limited and may be suitably selected in accordance with the intended use. The thickness is preferably 2 µm to 150 µm, more preferably 5 µm to 100 µm, and particularly preferably 8 µm to 50 µm.

The shape of the support is not particularly limited and may be suitably selected in accordance with the intended use, however, an elongated shape is preferable. The length of the elongated support is not particularly limited. For example, a support having a length of 10 m to 20,000 m is exemplified.

Examples of a combination of the support and the protective film (support/protective film) include polyethylene terephthalate/polypropylene, polyimide/polypropylene, polyethylene terephthalate/polyethylene terephthalate.

The coefficient of static friction between the support and the protective film is preferably 0.3 to 1.4, and more preferably 0.5 to 1.2.

When the coefficient of static friction is less than 0.3, rolling displacement may be caused due to excessive slippage, and when the coefficient of static friction is more than 1.4, it may be difficult to roll the pattern forming material in an excellent roll configuration.

<Photosensitive Layer>

The photosensitive layer may contain binder, polymerizable compound, photopolymerization initiator, and photosensitizer, and may contain polymerization inhibitor and other components suitably selected in accordance with the necessity.

In the present invention, the polymerization initiator is added in order to enhance the resolution of the pattern forming material.

In addition, in the case where the photosensitive layer is exposed and developed, the minimum optical energy of a light beam used for exposing the photosensitive layer so as not to change the thickness of exposed sites after the exposure and developing is not particularly limited as long as the minimum optical energy is 10 mJ/cm$^2$ or less, and may be suitably selected in accordance with the intended use, however, it is preferably 0.5 mJ/cm$^2$ to 8 mJ/cm$^2$, and more preferably 1 mJ/cm$^2$ to 5 mJ/cm$^2$.

When the minimum optical energy is less than 0.1 mJ/cm$^2$, fog may occur in the course of treatment, and when the minimum optical energy is more than 10 mJ/cm$^2$, the time required for exposure is prolonged, resulting in low-speed processing.

Here, "the minimum optical energy of a light beam used for exposing the photosensitive layer so as not to change the thickness of exposed sites after the exposure and developing" above mentioned indicates so-called developing sensitivity.

For example, the developing sensitivity can be determined from a graph (sensitometric curve) indicating a relation between the optical energy (exposure dose) of a light beam used for exposing the photosensitive layer and the thickness of the hardened layer produced in a developing step, following an exposure step.

The thickness of the hardened photosensitive layer increases with increases in the exposure dose, thereafter, the hardened photosensitive layer has the same thickness as that of the unexposed photosensitive layer and be relatively constant in length. The developing sensitivity is a value that can be determined by reading the minimum exposure dose obtained when the hardened photosensitive layer is relatively constant in length.

Here, when the difference between the thickness of the hardened photosensitive layer and the thickness of the unexposed photosensitive layer is in the range of ±1 μm, it is regarded that the thickness of the hardened photosensitive layer is not changed by exposure and developing.

The method of measuring the hardened photosensitive layer and the unexposed photosensitive layer is not particularly limited and may be suitably selected in accordance with the intended use. Examples of the method include a method of measuring the hardened photosensitive layer and the unexposed photosensitive layer using a film thickness measuring device, or a surface roughness measure (for example, SUR-FCOM 1400D (manufactured by Tokyo Seimitsu Co., Ltd.).

—Polymerization Inhibitor—

The polymerization inhibitor carries out hydrogen donation (or hydrogen bestowal), energy donation (or energy bestowal), electron donation (or electron bestowal), and the like to polymerization initiating radical components generated from the photopolymerization initiator as a result of the exposure and serves to deactivate the polymerization initiating radical components and inhibit initiation of polymerization.

Typically, a slight amount of a polymerization inhibitor is contained in commercially available polymerizable compounds, however, in the present invention, the aforesaid polymerization inhibitor is contained in the photosensitive layer separately from polymerization inhibitors that have been contained in commercially available polymerizable compounds from the perspective of enhancing the resolution of the pattern forming material. For the reason, the polymerization inhibitor is preferably a compound except for monophenol-based compounds such as 4-methoxyphenol which have been contained in commercially available polymerizable compounds for imparting stability.

Examples of the polymerization inhibitor include compounds each having a lone pair of electrons such as compound containing oxygen, nitrogen, sulfur, and metal, and compounds each having pie-electron such as aromatic compounds. Specific examples thereof include compounds each having phenolic hydroxyl group, compounds each having an imino group, compounds each having a nitro group, compounds each having a nitroso group, compounds each having an aromatic ring, compounds each having a heterocyclic ring, and compounds each having a metal atom (including complexes with organic compounds). Of these, compounds each having a phenolic hydroxyl group, compounds each having an imino group, compounds each having an aromatic ring, and compounds each having a heterocyclic ring are preferable.

The compounds each having phenolic hydroxyl group are not particularly limited and may be suitably selected in accordance with the intended use, however, a compound having at least two phenolic hydroxyl groups is preferable. In the compound having at least two phenolic hydroxyl groups, the at least two phenolic hydroxyl groups may be substituted by the same aromatic ring or may be substituted by different aromatic rings within the same molecule.

For the compound having at least two phenolic hydroxyl group, a compound represented by the following Structural Formula (1) is more preferably exemplified.

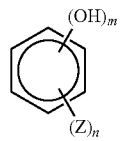

Structural Formula (1)

In the Structural Formula (1), Z represents a substituent group, "in" is an integer of 2 or more; "n" is an integer of zero or more; preferably, the "in" and "n" are respectively an integer selected such that m + n is equal to 6. When "n" is an integer of 2 or more, the Z may be the same to each other or different from each other.

When "m" is less than 2, the resolution may degrade.

Examples of the substituent group include carboxyl group, sulfo group, cyano group, halogen group such as fluorine atom, chlorine group, and bromine group; hydroxy group, alkoxycarbonyl group having 30 or less carbon atoms such as methoxycarbonyl group, ethoxycarbonyl group, and benzyloxycarbonyl group; aryloxycarbonyl group having 30 or less carbon atoms such as phenoxycarbonyl group, alkylsulfonylaminocarbonyl group having 30 or less carbon atoms such as methylsulfonylaminocarbonyl group and octylsulfonylaminocarbony group; arylsulfonylaminocarbonyl group such as toluenesulfonylaminocarbonyl group; acylaminosulfonyl group having 30 or less carbon atoms such as benzoylaminosulfonyl group, acetylaminosulfonyl group, and povaloylaminosulfonyl group; alkoxy group having 30 or less carbon atoms such as methoxy group, ethoxy group, benzyloxy group, phenoxyethoxy group, and phenetyloxy group; arylthio group having 30 or less carbon atoms, alkylthio group such as phenylthio group, methylthio group, ethylthio group, and dodecylthio group; aryloxy group having 30 or less carbon atoms such as phenoxy group, p-tolyloxy group, 1-naphtoxy group, and 2-naphtoxy group; nitro group, alkyl group having 30 or less carbon atoms, alkoxycarbonyloxy group such as methoxycarbonyloxy group, stearyloxycarbonyloxy group, and phenoxyethoxycarbonyloxy group; aryloxycarbonyloxy group such as phenoxycarbonyloxy group, and chlorophenoxycarbonyloxy group; acyloxy group having 30 or less carbon atoms such as acetyloxy group, and propionyloxy group; acyl group having 30 or less carbon atoms such as acetyl group, propionyl group, and benzoyl group; carbamoyl group such as carbamoyl group, N,N-dimethylcarbamoyl group, morphorinocarbamoyl group, and piperidinocarbonyl group; sulfamoyl group such as sulfamoyl group, N,N-dimethylsulfamoyl group, morphorinosulhonyl group, and piperidinofulfonyl group; alkylsulfonyl group having 30 or less carbon atoms such as methylsulfonyl group, trifluoromethylsulfonyl group, ethylsulfonyl group, butylsulfonyl group, and dodecylsulfonyl group, aryl sulfonyl group such as benzenesulfonyl group, toluenesulfonyl group, naphthalenesulfonyl group, pyridinesulfonyl group, and quinolinesulfonyl group; aryl group having 30 or less carbon atoms such as phenyl group, dichlorophenyl group, tolyl group, methoxyphenyl group, diethylaminophenyl group, acetylaminophenyl group, methoxycarbonylphenyl group, hydroxyphenyl group, t-octylphenyl group, and naphthyl group; substituted amino group such as amino group, alkylamino group, dialkylamino group, arylamino group, diarylamino group, and acylamino group; substituted fosfono group such as fosfono group, diethylfosfono group, and diphenylfosfono group; heterocyclic ring group such as pyridil group, quinolyl group, frill group, thienyl group, tetrahydroflfrill group, pyrazoryl group, isooxyazolyl group, isothiazolyl group, imidazolyl group, oxazolyl group, thiazolyl group, pyridazyl group, pyrimizyl group, pyrazyl group, triazoryl group, tetrazolyl group, benzoxazolyl group, benzoimidazolyl group, isoquinolyl group, thiadiazolyl group, morphorino group, piperidino group, pyperadino group, indolyl group, isoindolyl group, and thiomorphorino group; ureide group such as methylureide group, dimethylureide group, and phenylureide group; sulphamoylamino group such as dipropylsulphamoylamino group; alkoxycarbonyl amino group such as ethoxycarbonylamino group; aryloxycarbonylamino group such as phenyloxycarbonylamino group; alkylsulfinyl group such as methylsulfinyl group; arylsulfinyl group such as phenylsulfinyl group; silyl group such as trimethoxysilyl group, and triethoxysilyl group, and silyloxy group such as trimethylsilyloxy group.

Examples of the compounds represented by the Structural Formula (1) include alkylcatechol such as catechol, resorcinol, 1,4-hydroquinone, 2-methylcatechol, 3-methylcatechol, 4-methylcatechol, 2-ethylcatechol, 3-ethylcatechol, 4-ethylcatechol, 2-propylcatechol, 3-propylcatechol, 4-propylcatechol, 2-n-butylcatechol, 3-n-butylcatechol, 4-n-butylcatechol, 2-tert-butylcatechol, 3-tert-butylcatechol, 4-tert-butylcatechol, and 3,5-di-tert-butylcatechol; alkylresorcinol such as 2-methylresorcinol, 4-methylresorcinol, 2-ethylresorcinol, 4-ethylresorcinol, 2-propylresorcinol, 4-propylresorcinol, 4-propylresorcinol, 2-n-butylresorcinol, 4-n-butylresorcinol, 2-tert-butylresorcinol, and 4-tert-butylresorcinol; alkylhydroquinone such as methylhydroquinone, ethylhydroquinone, propylhydroquinone, tert-butylhydroquinone, 2,5-di-tert-butylhydroquinone), pyrogallol, and phloroglucin.

For the compound having phenolic hydroxyl group, a compound in which aromatic rings having at least one phenolic hydroxyl group are linked each other by a divalent linking group is preferably exemplified.

Examples of the divalent linking group include 1 to 30 carbon atoms, oxygen atom, nitrogen atom, sulfur atom, and group having SO, SO$_2$ or the like.

Each of the sulfur atom, oxygen atom, SO and SO$_2$ may be directly linked each other.

The carbon atom and the oxygen atom may have a substituent group, and examples of the substituent group include the above-noted Z in the Structural Formula (1).

The aromatic ring may have a substituent group, and examples of the substituent group include the above-noted Z in the Structural Formula (1).

Specific examples of the compound having phenolic hydroxyl group include bisphenol A, bisphenol S, bisphenol M, bisphenol compounds known in the art that are used as color developer in heat-sensitive paper, the bisphenol compounds described in Japanese Patent Application Laid-Open (JP-A) No. 2003-305945, and hindered phenol compounds used as antioxidant. Besides, monophenol compounds each having substituent group such as 4-methoxyphenol, 4-methoxy-2-hydroxybenzophenone, β-naphthol, 2,6-di-t-butyl-4-cresol, methyl salicylate are also exemplified.

Examples of commercially available product of the compound having phenolic hydroxyl group include bisphenol compounds manufactured by Honshu Chemical Industry Co., Ltd.

The compound having an imino group is not particularly limited and may be suitably selected in accordance with the intended use. For example, those having a molecular mass of 50 or more are preferable, and those having a molecular mass of 70 or more are more preferable.

The compound having an imino group preferably has a cyclic structure substituted by an imino group. For the cyclic structure, a cyclic structure in which at least any one of an aromatic ring and a heterocyclic ring is condensed is preferable, and a cyclic structure in which an aromatic ring is condensed is more preferable. The cyclic structure may contain oxygen atom, nitrogen atom or sulfur atom.

Specific examples of the compound having an imino group include phenothiazine, phenoxazine, dihydrophenazine, hydroquinoline, or compounds that these compounds are respectively substituted by the above noted Z in the Structural Formula (1).

For the compound having a cyclic structure substituted by an imino group, hindered amine derivatives partially having a hindered amine are preferable.

Examples of the hindered amine include the hindered amines described in Japanese Patent Application Laid-Open (JP-A) No. 2003-246138.

The compound having a nitro group or the compound having a nitroso group is not particularly limited and may be suitably selected in accordance with the intended use, however, those having a molecular mass of 50 or more are preferable, and those having a molecular mass of 70 or more are more preferable.

Examples of the compound having a nitro group or the compound having a nitroso group include nitrobenzene, and chelate compounds between a nitroso compound and aluminum.

The compound having an aromatic ring is not particularly limited and may be suitably selected in accordance with the intended use, however, a compound of which the aromatic ring is substituted by a substituent group (such as substituent group having oxygen atom, nitrogen atom or sulfur atom) having a lone pair of electrons is preferable.

Specific examples of the compound having an aromatic ring include the compounds each having phenolic hydroxyl group, the compounds each having an imino group, compounds each partially having an aniline skeleton such as methylene blue, and crystal violet.

Examples of the compound having a heterocyclic ring is not particularly limited and may be suitably selected in accordance with the intended use, however, a compound of which the heterocyclic ring has an atom having a lone pair of electrons such as nitrogen, oxygen, and sulfur is preferable.

The compound having a heterocyclic ring is not particularly limited and may be suitably selected in accordance with the intended use. For example, a compound of which the heterocyclic ring has an atom having a lone pair of electrons such as nitrogen, oxygen, and sulfur is preferable.

Specific examples thereof include pyridine, and quinoline.

The compound having a metal atom is not particularly limited and may be suitably selected in accordance with the intended use.

The metal atom is not particularly limited as long as the metal atom has affinity with radicals generated from the polymerization initiator, and may be suitably selected in accordance with the intended use. Examples thereof include copper, aluminum, and titanium.

Of these polymerization inhibitors, compounds each having at least two phenolic hydroxyl group, compounds each having an aromatic ring substituted by an imino group, and compounds each having a heterocyclic ring substituted by an imino group are preferable, and compounds of which an imino group partially constitutes the cyclic structure, and hindered amine compounds are particularly preferable. Specifically, catechol, phenothiazine, phenoxazine, hindered amine, or derivatives thereof are preferably exemplified.

The polymerization inhibitor may be previously added in a photosensitive resin composition solution in the production process of a pattern forming material.

The content of the polymerization inhibitor is preferably 0.005% by mass to 0.5% by mass relative to the polymerizable compound in the photosensitive layer, more preferably 0.01% by mass to 0.4% by mass, and particularly preferably 0.02% by mass to 0.2% by mass.

When the content of the polymerization inhibitor is less than 0.005% by mass, the resolution may degrade, and when the content of the polymerization inhibitor is more than 0.5% by mass, photosensitivity to active energy ray may be reduced.

The content of the polymerization inhibitor represents a content excluding monophenol-based compounds such as 4-methoxyphenol contained in commercially available compounds for imparting stability.

—Binder—

The binder is preferably swellable to alkaline solutions and is more preferably soluble in alkaline solutions.

For a binder which is swellable to or soluble in alkaline solutions, those having an acidic group are preferably exemplified, for example.

The acidic group is not particularly limited and may be suitably selected in accordance with the intended use. Examples thereof include carboxyl group, sulfonic group, and phosphoric group. Of these, carboxyl group is preferable.

Examples of a binder having a carboxyl group include vinyl copolymers, polyurethane resins, polyamide acid resins, and modified epoxy resins each having a carboxyl group. Of these, vinyl copolymers each having a carboxyl group are preferable from the perspective of solubility in coating solvents, solubility in alkaline developers, synthesis applicability, and easy control of film physical properties. From the perspective of developing ability, copolymers of at least any one of a styrene and a styrene derivative are also preferable.

The vinyl copolymer having a carboxyl group can be obtained by copolymerization between at least (1) a vinyl monomer having a carboxyl group, and (2) a monomer copolymerizable with the vinyl monomer (1).

Examples of the vinyl monomer having a carboxyl group include (meth)acrylic acids, vinyl benzoates, maleic acids, monoalkyl ester maleates, fumaric acids, itaconic acids, crotonic acids, cinnamic acids, acrylic acid dimers, addition reaction products between a monomer having a hydroxyl group (for example 2-hydroxyethyl (meth)acrylate) and a cyclic anhydride (for example, maleic acid anhydride, phthalic acid anhydride, and cyclohexane carboxylic acid); and ω-carboxy-polycaprolactone mono(meth)acrylates. Of these, (meth)acrylic acids are particularly preferable from the perspective of copolymerizability, cost, and solubility.

As a precursor of carboxyl group, a monomer containing an anhydride such as maleic acid anhydride, itaconic acid anhydride, and citraconic acid anhydride may be used.

Other copolymerizable monomers except for those mentioned above are not particularly limited and may be suitably selected in accordance with the intended use. Examples thereof include (meth)acrylic acid esters, crotonic acid esters, vinyl esters, maleic acid diesters, fumaric acid diesters, itaconic acid diesters, (meth)acrylic amides, vinyl ethers, esters of vinyl alcohols, styrenes such as styrene, and styrene derivatives; (meth)acrylonitrile, heterocyclic groups substituted by a vinyl group such as vinyl pyridine, vinyl pyrolidone, and vinyl carbazole; N-vinylformamide, N-vinylacetoamide, N-vinylimidazole, vinylcaprolactone, 2-acrylamide-2-methylpropane sulfonate, phthalic acid mono(2-acryloyl oxy ethyl ester), phthalic acid (1-methyl-2-acryloyl oxy ethyl ester), and vinyl monomers each having a functional group such as urethane group, urea group, sulfonamide group, phenol group, and imide group. Of these, styrenes are preferable.

Examples of the (meth)acrylic acid esters include methyl (meth)acrylates, ethyl (meth)acrylates, n-propyl (meth)acrylates, isopropyl (meth)acrylates, n-butyl (meth)acrylates, isobutyl (meth)acrylates, t-butyl (meth)acrylates, n-hexyl (meth)acrylates, cyclohexyl (meth)acrylates, t-butyl cyclohexyl (meth)acrylates, 2-ethylhexyl (meth)acrylates, t-octyl (meth)acrylates, dodecyl (meth)acrylates, octadecyl (meth)acrylates, acetoxy ethyl (meth)acrylates, phenyl (meth)acrylates, 2-hydroxyethyl (meth)acrylates, 2-methoxyethyl (meth)acrylates, 2-ethoxyethyl (meth)acrylates, 2-(2-methoxyethyl)ethyl (meth)acrylates, 3-phenoxy-2-hydroxypropyl (meth)acrylates, benzyl (meth)acrylates, diethyleneglycol monomethylether (meth)acrylates, diethyleneglycol monoethylether (meth)acrylates, diethylene glycol monophenylether (meth)acrylates, triethyleneglycol monomethylether (meth)acrylates, triethyleneglycol monoethylether (meth)acrylates, polyethyleneglycol monomethylether (meth)acrylates, polyethyleneglycol monoethylether (meth)acrylates, β-phenoxyethoxyethyl acrylates, nonylphenoxypolyethyleneglycol (meth)acrylates, dicyclopentanyl (meth)acrylates, dicyclopentenyl (meth)acrylates, dicyclopentenyloxyethyl (meth)acrylates, trifluoroethyl (meth)acrylates, octafluoropentyl (meth)acrylates, perfluorooctylethyl (meth)acrylates, tribromophenyl (meth)acrylates, and tribromophenyloxyethyl (meth)acrylates.

Examples of the crotonic acid esters include butyl crotonate, and hexyl crotonate.

Examples of the vinyl esters include vinyl acetate, vinyl propionate, vinyl butylate, vinyl methoxy acetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of the (meth)acrylamides include acrylamide, N-methyl (meth)acrylamide, N-ethyl (meth)acrylamide, N-propyl (methacrylamide, N0isopropyl (meth)acrylamide, N-n-butylacryl (meth)amide, N-t-butyl (meth)acrylamide, N-cyclohexyl (meth)acrylamide, N-(2-methoxyethyl) (meth)acrylamide, N,N-dimethyl (meth)acrylamide, N,N-diethyl (meth)acrylamide, N-phenyl (meth)acrylamide, N-benzyl (meth)acrylamide, (meth)acryloylmorpholine, and diacetone acrylamide.

Examples of the styrenes include styrene, methyl styrene, dimethyl styrene, trimethyl styrene, ethyl styrene, isopropyl styrene, butyl styrene, hydroxy styrene, methoxy styrene, buthoxy styrene, acetoxy styrene, chloro styrene, dichloro styrene, bromo-styrene, chloromethyl styrene, hydroxy styrene protected by a group which can be deprotected by an acidic material (t-Boc, for example), vinyl methyl benzoate, and α-methyl styrene.

Examples of the vinyl ethers include vinyl methyl ether, vinyl butyl ether, vinyl hexyl ether, and vinyl methoxymethyl ether.

For a method of synthesizing a vinyl monomer having the above-noted functional group, addition reactions between an isocyanato group and a hydroxyl group or an amino group are exemplified, for example. Specific examples thereof include addition reactions between a monomer having an isocyanato group and a compound having one hydroxyl group or a compound having one primary or secondary amino group, and addition reactions between a monomer having a hydroxyl group or a monomer having a primary or secondary amino group and a monoisocyanate.

As the monomer having an isocyanato group, the compounds represented by the following Structural Formulas (2) to (4) are exemplified.

Structural Formula (2)

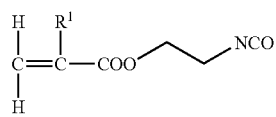

Structural Formula (3)

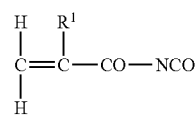

Structural Formula (4)

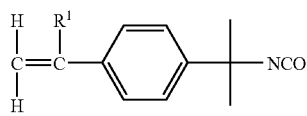

In Structural Formulas (2) to (4), "$R^1$" represents a hydrogen atom or a methyl group.

Examples of the monoisocyanate include cyclohexyl isocyanate, n-butyl isocyanate, toluoyl isocyanate, benzyl isocyanate, and phenyl isocyanate.

As the monomer having a hydroxyl group, the compounds represented by the following Structural Formulas (5) to (13) are exemplified.

Structural Formula (5)

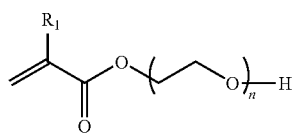

Structural Formula (6)

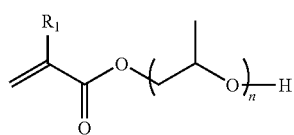

Structural Formula (7)

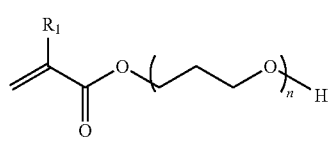

Structural Formula (8)

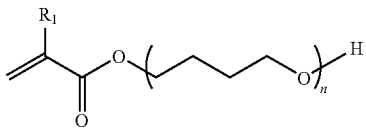

Structural Formula (9)

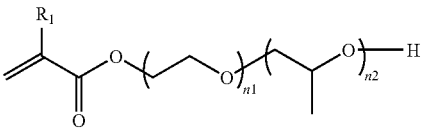

Structural Formula (10)

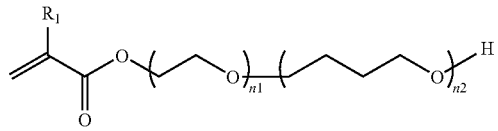

Structural Formula (11)

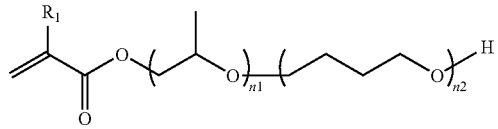

Structural Formula (12)

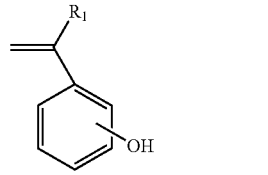

Structural Formula (13)

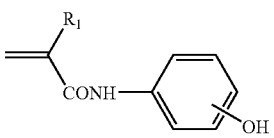

In Structural Formulas (5) to (13), "$R^1$" represents a hydrogen atom or a methyl group, and "n" is an integer of 1 or more.

Examples of the compound having one hydroxyl group include alcohols such as methanol, ethanol, n-propanol, i-propanol, n-butanol, sec-butanol, t-butanol, n-hexanol, 2-ethyl hexanol, n-decanol, n-dodecanol, n-octadecanol, cyclopentanol, benzyl alcohol, and phenyl ethyl alcohol; phenols such as phenol, cresol, and naphthol; further, examples of those containing a substituent group include fluoro-ethanol, trifluoro-ethanol, methoxy ethanol, phenoxy ethanol, chlorophenol, dichlorophenol, methoxyphenol, and acetoxyphenol.

Examples of the monomer having a primary or secondary amino group include vinylbenzylamine.

Examples of the compound having one primary or secondary amino group include alkyl amines such as methylamine, ethylamine, n-propylamine, i-propylamine, n-butylamine, sec-butylamine, t-butylamine, hexylamine, 2-ethyl hexylamine, decylamine, dodecylamine, octadecylamine, dimethylamine, diethylamine, dibutylamine, and dioctylamine; cyclic alkylamines such as cyclopentylamine, and cyclohexylamine; alkylamines such as benzylamine, and phenethylamine; arylamines such as aniline, toluoylamine, xylylamine, and naphthylamine; combinations thereof such as N-methyl-N-benzylamine; and amines containing a substituent group such as trifluoroethylamine, hexafluoroisopropylamine, methoxyaniline, and methoxypropylamine.

As polymerizable monomers other than those stated above, methyl (meth)acrylate, ethyl (meth)acrylate, butyl (meth) acrylate, benzyl (meth)acrylate, 2-ethylhexyl (meth)acrylate, styrene, chlorostyrene, bromostyrene, and hydroxy styrene.

Each of the other copolymerizable monomers may be used alone or in combination with two or more.

The above-noted vinyl copolymers can be prepared by copolymerizing a corresponding monomer in accordance with a common procedure of the conventional methods. For example, a vinyl copolymer can be prepared by utilizing a method (solution polymerization) in which the monomer is dissolved in a proper solvent, and a radical polymerization initiator is added to the solution to thereby polymerize the monomer in the solution. A vinyl copolymer can also be prepared by means of polymerization reaction so-called emulsification reaction, etc. in a condition where the monomer is dispersed in an aqueous medium.

The proper solvent used in the solution polymerization is not particularly limited and may be suitably selected depending on the solubility, etc. of the copolymer to be prepared. Examples thereof include methanol, ethanol, propanol, isopropanol, 1-methoxy-2-propanol, acetone, methylethylketone, methylisobutylketone, methoxypropylacetate, ethyl lactate, ethyl lactate, acetonitrile, tetrahydrofuran, dimethylformamide, chloroform, and toluene. Each of these solvents may be used alone or in combination with two or more.

The radical polymerization initiator is not particularly limited, and examples thereof include azobis compounds such as 2,2'-azobis (isobutylonitrile) (AIBN), and 2,2'-azobis-(2,4'-dimethylvaleronitrile); peroxides such as benzoyl peroxides; and persulphates such as potassium persulphate, and ammonium persulphate.

The content rate of the polymerizable compound having a carboxyl group in the vinyl copolymer is not particularly limited and may be suitably adjusted in accordance with the intended use, however, the content rate is preferably 5 mol % to 50 mol %, more preferably 10 mol % to 40 mol %, and still more preferably 15 mol % to 35 mol %.

When the content rate is less than 5 mol %, the developing ability to alkali liquids may be insufficient, and when the content rate is more than 50 mol %, the resistance of the hardened regions (image regions) to developers may be insufficient.

The molecular mass of the binder having a carboxyl group is not particularly limited and may be suitably adjusted in accordance with the intended use, however, the mass average molecular mass is preferably 2,000 to 300,000, and more preferably 4,000 to 150,000.

When the mass average molecular mass is less than 2,000, the film strength tends to be insufficient, and it may be difficult to stably produce a pattern forming material. When the mass average molecular mass is more than 300,000, the developing ability may degrade.

Each of these binders each having a carboxyl group may be used alone or in combination with two or more. When two or more binders are used in combination, combinations of two or more binders each having a different polymerization component, combinations of two or more binders each having a different mass average molecular mass, and combinations of two or more binders each having a different degree of dispersion are exemplified, for example.

The binder having a carboxyl group may be partially or entirely neutralized with a basic material. For the binder having a carboxyl group, a resin having a different structure such as a polyester resin, a polyamide resin, a polyurethane resin, an epoxy resin, a polyvinyl alcohol, and gelatin may be further used in combination.

For the binder, the resins which are soluble in alkaline solutions described in Japanese Patent (JP-B) No. 2873889 and the like can be used.

The content of the binder in the photosensitive layer is not particularly limited and may be suitably adjusted in accordance with the intended use. For example, it is preferably 10% by mass to 90% by mass, more preferably 20% by mass to 80% by mass, and particularly preferably 40% by mass to 80% by mass.

When the content of the binder is less than 10% by mass, the alkali-developing ability and adhesion property of the pattern forming material with substrates for printed circuit boards (for example, copper clad laminate) may degrade. When the content of the binder is more than 90% by mass, the stability of the photosensitive layer relative to developing time, and the strength of hardened film (tent film) may degrade. The content may be a total content of a polymer binder used in combination with the binder in accordance with the necessity.

The acid value of the binder is not particularly limited and may be suitably selected in accordance with the intended use, however, it is preferably 70 mgKOH/g to 250 mgKOH/g, more preferably 90 mgKOH/g to 200 mgKOH/g, and particularly preferably 100 mgKOH/g to 190 mgKOH/g.

When the acid value is less than 70 mgKOH/g, the developing ability of the pattern forming material may be insufficient, the resolution may degrade, and thus a permanent pattern such as interconnection pattern may not be finely and precisely obtained. When the acid value is more than 250 mgKOH/g, at least any one of resistance to developers and adhesion property of the pattern may degrade, and thus a permanent pattern such as interconnection pattern may not be finely and precisely obtained.

—Polymerizable Compound—

The polymerizable compound is not particularly limited and may be suitably selected in accordance with the intended use. Preferred examples thereof include at least any one of a compound having a propylene oxide group, a compound having an ethylene oxide group, a compound having a urethane group, and a compound having an aryl group. The compound having a propylene oxide group is more preferable from the perspective of suppressing generation of scum at the time of developing.

For the polymerizable compound, it is preferable to use three types of a compound having a propylene oxide group, a compound having a urethane group, and a compound having an aryl group, and other polymerizable compounds may be further used in combination with the three types of compounds.

The polymerizable compound preferably has one or more polymerizable groups, and more preferably has two or more polymerizable groups.

Examples of the polymerizable groups include (meth)acrylate group, vinyl ether group, an alicyclic ether group such as epoxy group and oxetane group. Of these, (meth)acrylate group is preferable.

—Compound Having Propylene Oxide Group—

The compound having a propylene oxide group is not particularly limited as long as the compound has a propylene oxide group (n-propylene oxide group, isopropylene oxide group) which is a polymer group having [—CH(CH$_3$)CH$_2$O—] as a constituent unit, and may be suitably selected in accordance with the intended use.

By using the compound having a propylene oxide group, granulated materials contained in a developer after developing can be prevented from coarsening, and the surface tension can be kept low.

—Compound Having Ethylene Oxide Group—

The compound having an ethylene oxide group is not particularly limited as long as the compound has an ethylene oxide group which is a polymer group having [—$CH_2CH_2O$—] as a constituent unit, and may be suitably selected in accordance with the intended use.

—Compound Having Propylene Oxide Group and Ethylene Oxide Group—

When the propylene oxide group is represented by $X^1$, and the ethylene oxide group is represented by $X^2$, the combination of linking of the polymerizable group, the $X^1$ and $X^2$ is not particularly limited and may be suitably selected in accordance with the intended use. Examples of the combination include a polymerizable group-$(X^1)_m$, a polymerizable group-$(X^1)_m(X^2)_n$, a polymerizable group-$(X^2)_n(X^1)_m$. The compound may further have an organic group at the terminals of the link. When the compound has two or more polymerizable groups, the polymerizable groups may be adjacent to each other or may be linked through a divalent organic group.

Preferred examples of the divalent organic group include alkylene group, allylene group, alkenylene group, alkynylene group, carbonyl group (—CO—), oxygen atom (—O—), sulfur atom (—S—), imino group (—NH—), substituted imino group of which hydrogen atom in the imino group is substituted by a monovalent hydrocarbon group, sulfonyl group (—$SO_2$—) or groups combined therewith (for example, urethane group, ester group, ureide group, amide group, and the like). Of these, alkylene group, allylene group, or the groups combined therewith (for example, urethane group, ester group, ureide group, amide group, and the like) are preferable.

Examples of the polymerizable compound include compounds represented by the following Structural Formula (14), 2,2-bis(4-((meth)acryloxypolyalkoxy)phenyl) propane such as 2,2-bis(4-((meth)acryloxypolypropoxy)phenyl) propane; polyalkylene glycol diacrylate such as polypropylene glycol diacrylate; polyalkylene oxide group modified urethandi(meth)acrylate such as polypropylene oxide group-modified urethanedi(meth)acrylate, and polyethylene-propylene oxide group-modified urethanedi(meth)acrylate.

Structural Formula (14)

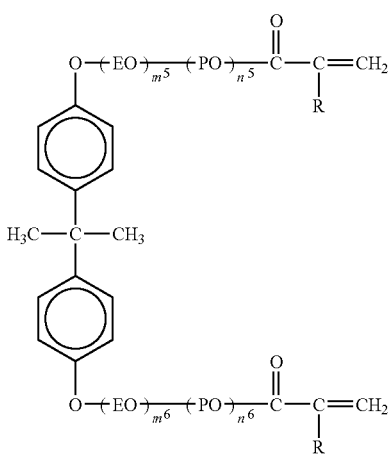

In the Structural Formula (14), "R" may be the same each other or different from each other and respectively represent a hydrogen atom or an alkyl group having 1 to 3 carbon atoms; EO represents an ethylene glycol chain; PO represents a propylene glycol chain; $m^5$ and $m^6$ are respectively an integer of 0 to 30; and $n^5$ and $n^6$ are respectively an integer of 1 to 30.

2,2-bis(4-((meth)acryloxypolyethoxy polypropoxy)phenyl) propane represented by the Structural Formula (14) include 2,2-bis(4-((meth)acryloxydiethoxyoctapropoxy) phenyl) propane, 2,2-bis(4-((meth)acryloxytetraethoxytetrapropoxy)phenyl) propane, and 2,2-bis(4-((meth)acryloxyhexaethoxyhexapropoxy)phenyl) propane. Each of these may be used alone or in combination with two or more.

Examples of the 2,2-bis(4-((meth)acryloxypolypropoxy) phenyl) propane include 2,2-bis(4-((meth)acryloxydipropoxy)phenyl) propane, 2,2-bis(4-((meth)acryloxytripropoxy)phenyl) propane, 2,2-bis(4-((meth)acryloxytetrapropoxy)phenyl) propane, 2,2-bis(4-((meth)acryloxypentapropoxy)phenyl) propane, 2,2-bis(4-((meth)acryloxyhexapropoxy)phenyl) propane, 2,2-bis(4-((meth)acryloxyheptapropoxy)phenyl) propane, 2,2-bis(4-((meth)acryloxyoctapropoxy)phenyl) propane, 2,2-bis (4-((meth)acryloxynonapropoxy)phenyl) propane, 2,2-bis(4-((meth)acryloxydecapropoxy)phenyl) propane, 2,2-bis(4-((meth)acryloxyundecapropoxy)phenyl) propane, 2,2-bis(4-((meth)acryloxydodecapropoxy)phenyl) propane, 2,2-bis(4-((meth)acryloxytridecapropoxy)phenyl) propane, 2,2-bis(4-((meth)acryloxytetradecapropoxy)phenyl) propane, 2,2-bis(4-((meth)acryloxypentadecapropoxy)phenyl) propane, and 2,2-bis(4-((meth)acryloxyhexadecapropoxy)phenyl) propane. Each of these may be used alone or in combination with two or more.

Examples of the polypropylene glycol diacrylate include dipropylene glycol diacrylate, tripropylene glycol diacrylate, tetrapropylene glycol diacrylate, pentapropylene glycol diacrylate, hexaprpopylene glycol diacrylate, heptapropylene glycol diacrylate, octapropylene glycol diacrylate, nonapropylene glycol diacrylate, decapropylene glycol diacrylate, undecapropylene glycol diacrylate, dodecapropylene glycol diacrylate, tridecapropylene glycol diacrylate, tetradecapropylene glycol diacrylate, pentadecapropylene glycol diacrylate, hexadecapropylene glycol diacrylate, heptadecapropylene glycol diacrylate, octadecapropylene glycol diacrylate, nonadecapropylene glycol diacrylate, and eicosapropylene glycol diacrylate. Of these, those having 2 to 14 propylene glycol units in the molecule are preferable.

For the polymerizable compound, compounds represented by the following Structural Formulas (15) to (17) are also preferably exemplified. Each of these compounds may be used alone or in combination with two or more.

Structural Formula (15)

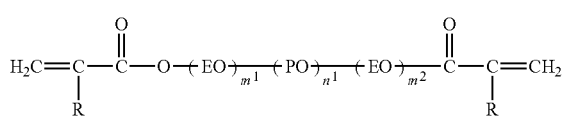

In the Structural Formula (15), "R" may be the same each other or different from each other and respectively represent a hydrogen atom or an alkyl group having 1 to 3 carbon atoms; EO represents an ethylene glycol chain; PO represents a propylene glycol chain; and $m^1$, $m^2$ and $n^1$ are respectively an integer of 1 to 30.

Structural Formula (16)

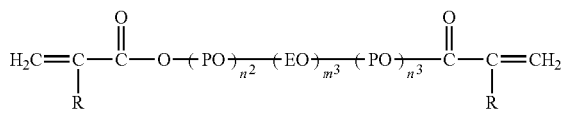

In the Structural Formula (16), "R" may be the same each other or different from each other and respectively represent a hydrogen atom or an alkyl group having 1 to 3 carbon atoms; EO represents an ethylene glycol chain; PO represents a propylene glycol chain; and $m^3$, $n^2$ and $n^3$ are respectively an integer of 1 to 30.

Structural Formula (17)

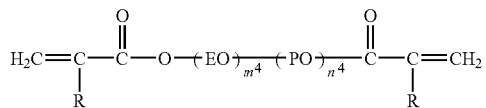

In the Structural Formula (17), "R" may be the same each other or different from each other and respectively represent a hydrogen atom or an alkyl group having 1 to 3 carbon atoms; EO represents an ethylene glycol chain; PO represents a propylene glycol chain; and $m^4$ and $n^4$ are respectively an integer of 1 to 30.

Examples of the alkyl group having 1 to 3 carbon atoms in the Structural Formula (14), Structural Formula (15), Structural Formula (16), and Structural Formula (17) include methyl group, ethyl group, n-propyl group, and isopropyl group.

The total number of ethylene glycol chains ($m^1+m^2$, $m^3$, $m^4$, and $m^5+m^6$) respectively in the Structural Formula (14), Structural Formula (15), Structural Formula (16), and Structural Formula (17) is an integer of 1 to 30, is preferably an integer of 1 to 10, still more preferably an integer of 4 to 9, and particularly preferably an integer of 5 to 8. When the integer of the total number of ethylene glycol chains is more than 30, the tent reliability and resist shape of the pattern forming material tend to degrade.

The total number of propylene glycol chains ($n^1$, $n^2+n^3$, $n^4$, and $n^5+n^6$) respectively in the Structural Formula (14), Structural Formula (15), Structural Formula (16), and Structural Formula (17) is an integer of 1 to 30, is preferably an integer of 5 to 20, still more preferably an integer of 8 to 16, and particularly preferably an integer of 10 to 14. When the integer of the total number of propylene glycol chains is more than 30, the resolution of the pattern forming material tends to degrade, and scum tends to occur in a developer after developing.

Examples of the polymerizable compound include compounds that can be obtained by reacting α,β-unsaturated carboxylic acid with a compound having a glycidyl group; γ-chloro-β-hydroxypropyl-β'-(meth)-acryloyloxyethyl-o-phthalate, and β-hydroxypropyl-β'-(meth)-acryloyloxyethyl-o-phthalate. Besides, compounds represented by the Structural Formulas (6), (9), (11) and urethane monomers containing any one of these compounds as raw material are also exemplified.

—Compound Having Urethane Group—

The compound having a urethane group is not particularly limited as long as the compound has a urethane group, and may be suitably selected in accordance with the intended use. Examples thereof include the compounds described in Japanese Patent Application Publication (JP-B) Nos. 48-41708, 5-50737, and 7-7208, Japanese Patent Application Laid-Open (JP-A) Nos. 51-37193, 2001-154346, and 2001-356476. Specifically, an adduct between a polyisocyanate compound having two or more isocyanate groups in the molecule and a vinyl monomer having a hydroxy group in the molecule is exemplified, for example.

Examples of the polyisocyanate compound having two or more isocyanate groups in the molecule include diisocyanates such as hexamethylenediisocyanate, trimethylhexamethylenediisocyanate, isophoronediisocyante, xylenediisocyanate, toluenediisocyanate, phenylenediisocyanate, norbornenediisocyanate, diphenyldiisocyanate, diphenylmethanediisocyanate, 3,3' dimethyl-4,4'-diphenyldiisocyanate; polyadducts between the diisocyanate with bifunctional alcohol (in this case, isocyanate groups are also added at the terminals thereof); trimers such as burette fluids of the diisocyanate, and isocyanurate; polyfunctional alcohols such as polyfunctional alcohols between the diisocyanate or diisocyanates with trimethylol propane, pentaerythritol, or glycerine; or adducts that are obtainable from the ethyleneoxide adducts with the polyfunctional alcohols.

Examples of the vinyl monomers having a hydroxyl group in the molecule include e-hydroxyethyl (meth)acrylate, 2-hydroxypropyl (meth)acrylate, 4-hydroxybutyl (meth)acrylate, diethylene glycol mono(meth)acrylate, triethylene glycol mono(meth)acrylate, tetraethylenegycohol mono(meth)acrylate, octaethylene glycol mono(meth)acrylate, polyethylene glycol mono(meth)acrylate, dipropylene glycol mono(meth)acrylate, tripropylene glycol mono(meth)acrylate, tetrapropylene glycol mono(meth)acrylate, octapropylene glycol mono(meth)acrylate, polypropylene glycol mono (meth)acrylate, dibutylene glycol mono(meth)acrylate, tributylene glycol mono(meth)acrylate, tetrabutylene glycol mono(meth)acrylate, octabutylene glycol mono(meth)acrylate, polybutylene glycol mono(meth)acrylate, trimethylolpropane di(meth)acrylate, and pentaerythritol tri(meth)acrylate. Besides, one-terminal (meth)acrylates of diol having different alkylene oxide sites such as a (random or block) copolymer between an ethylene oxide and a propylene oxide.

Examples of the compound having a urethane group include tri((meth)acryloyloxyethyl)isocyanurate, di(meth)acrylated isocyanurate, and compounds each having an isocyanurate ring such as (meth)acrylates of ethyleneoxide-modified isocyanuric acid. Of these, compounds represented by the following Structural Formula (18) or Structural Formula (19) are preferable; and it is particularly preferable to contain, from the perspective of tent property, at least a compound represented by the Structural Formula (19). Each of these compounds may be used alone or in combination with two or more.

Structural Formula (18)

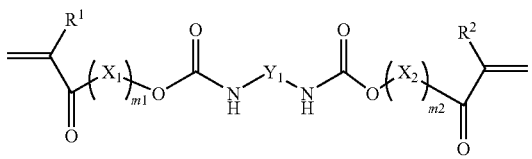

-continued

Structural Formula (19)

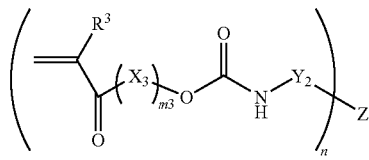

In the Structural Formulas (18) and (19), $R^1$ to $R^3$ respectively represent a hydrogen atom or a methyl group; $X_1$ to $X_3$ respectively represent an allylene oxide, and a single alkylene oxide or two or more alkylene oxides may be used.

Preferred examples of the alkylene oxide group include ethylene oxide group, propylene oxide group, butylene oxide group, pentylene oxide group, hexylene oxide group, and groups combined therewith (these may be either random combination or block combination). Of these, ethylene oxide group, propylene oxide group, butylene oxide group, or groups combined therewith are preferable, and ethylene oxide group and propylene oxide group are more preferable.

In the Structural Formulas (18) and (19), $m^1$ to $m^3$ are respectively an integer of 1 to 60, is preferably an integer of 2 to 30, and still more preferably an integer of 4 to 15.

In the Structural Formulas (18) and (19), $Y^1$ and $Y^2$ respectively represent a divalent organic group having 2 to 30 carbon atoms, and preferred examples thereof include alkylene group, allylene group, alkenylene group, alkynylene group, carbonyl group (—CO—), oxygen atom (—CO—), sulfur atom (—S—), imino group (—NH—), substituted imino group of which hydrogen atom in the imino group is substituted by a monovalent hydrocarbon group, sulfonyl group (—SO$_2$—) or groups combined therewith. Of these, alkylene group, allylene group, or groups combined therewith are preferable.

The alkylene group may have a branched structure or a cyclic structure. Preferred examples of such an alkylene group include methylene group, ethylene group, propylene group, isopropylene group, butylene group, isobutylene group, pentylene group, neopentylene group, hexylene group, trimethylhexylene group, cyclohexylene group, heptylene group, octylene group, 2-ethylhexylene group, nonylene group, decylene group, dodecylene group, octadecylene group, or any of the following groups.

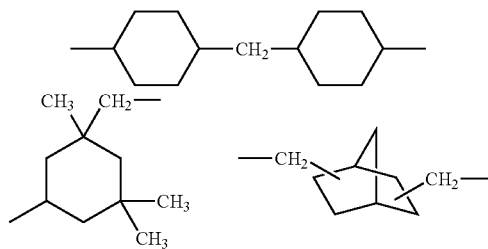

The allylene group may be substituted by a hydrocarbon group, and preferred examples such an allylene group include phenylene group, tolylene group, diphenylene group, naphthylene group, or groups shown below.

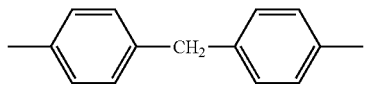

Examples of the groups combined therewith include xylylene group.

The alkylene group, allylene group, or groups combined therewith may further have a substituent group. Examples of the substituent group include halogen atom (for example, fluorine atom, chlorine atom, bromine atom, iodine atom, etc.); aryl group, alkoxy group (for example, methoxy group, ethoxy group, 2-ethoxyethoxy group, etc.); aryloxy group (for example, phenoxy group, etc.); acyl group (for example, acetyl group, and propionyl group); acyloxy group (for example, acetoxy group, butyryloxy group, etc.); alkoxycarbonyl group (for example, methoxycarbonyl group, ethoxycarbonyl group, etc.); and aryloxycarbonyl group (for example, phenoxycarbonyl group).

In the Structural Formulas (18) and (19), "n" is an integer of 3 to 6, and is preferably 3, 4, or 6 from the perspective of material supplying property required to synthesize a polymerizable monomer.

In the Structural Formulas (18) and (19), Z represents an n-valent (trivalent to hexavalent) linking group, and any of the following groups are exemplified.

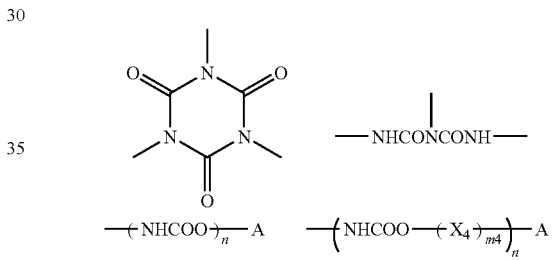

In the Structural Formula, $X^4$ represents an alkylene oxide; $m_4$ is an integer of 1 to 20; "n" is an integer of 3 to 6; and "A" represents an n-valent (trivalent to hexavalent) organic group.

For the "A" in the Structural Formula, n-valent aliphatic group, n-valent aromatic group, or combinations of group of any one of these groups with alkylene group, allylene group, alkenylene group, alkynylene group, carbonyl group, oxygen atom, sulfur atom, imino group, substituted imino group of which hydrogen atom in the imino group is substituted by a monovalent hydrocarbon group, or sulfonyl group are preferable; n-valent aliphatic group, n-valent aromatic group, or combinations of group of alkylene group, allylene group, or oxygen atom with n-valent aliphatic group or n-valent aromatic group are more preferable; and n-valent aliphatic group, and combinations of group of alkylene group or oxygen group with n-valent aliphatic group are particularly preferable.

The number of carbon atoms of the "A" is preferably an integer of 1 to 100, more preferably an integer of 1 to 50, and particularly preferably an integer of 3 to 30, for example.

The n-valent aliphatic group may have a branched structure or a cyclic structure.

The number of carbon atoms of the aliphatic group is preferably an integer of 1 to 30, more preferably an integer of 1 to 20, and particularly preferably an integer of 3 to 10, for example.

The number of carbon atoms of the aromatic group is preferably an integer of 6 to 100, more preferably an integer of 6 to 50, and particularly preferably an integer of 6 to 30, for example.

The n-valent aliphatic group or aromatic group may further have a substituent group. Examples of the substituent group include hydroxyl group, halogen group such as fluorine atom, chlorine atom, bromine atom, and iodine atom; aryl group, alkoxy group such as methoxy group, ethoxy group, and 2-ethoxyethoxy group; aryloxy group such as phenoxy group; acyl group such as acetyl group, and propionyl group; acyloxy group such as acetoxy group, and butyryloxy group; alkoxycarbonyl group such as methoxycarbonyl group, and ethoxy carbonyl group; and aryloxycarbonyl group such as phenoxycarbonyl group.

The alkylene group may have a branched structure or a cyclic structure.

The number of carbon atoms of the alkylene group is preferably an integer of 1 to 18, and still more preferably an integer of 1 to 10, for example.

The allylene group may be further substituted by a hydrocarbon group.

The number of carbon atoms of the allylene group is preferably an integer of 6 to 18, and still more preferably an integer of 6 to 10.

The number of carbon atoms of monovalent hydrocarbon group of the substituted imino group is preferably an integer of 1 to 18, and still more preferably an integer of 1 to 10.

Preferred examples of the "A" are as follows.

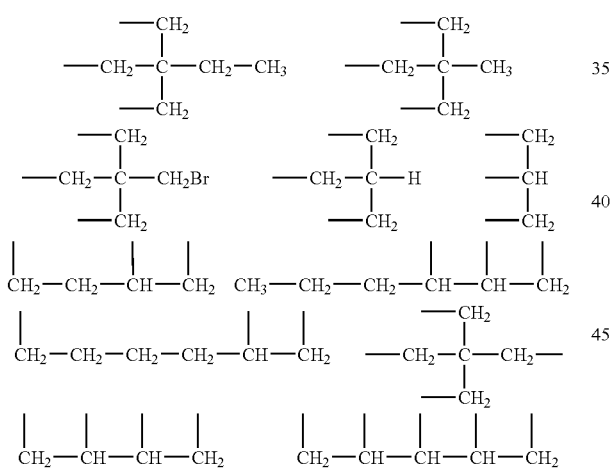

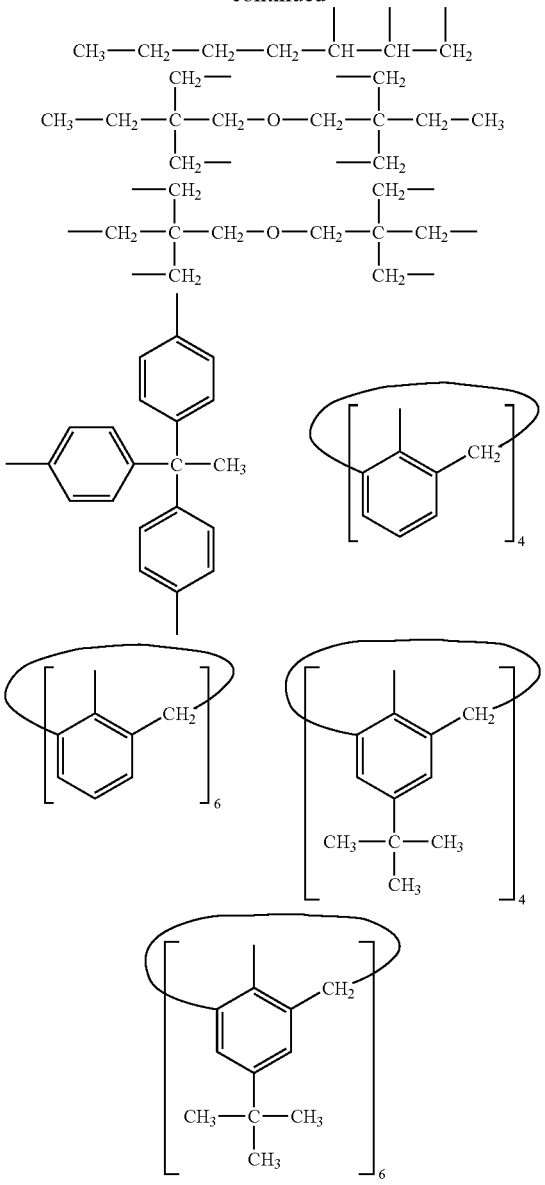

Examples of compounds represented by the Structural Formulas (18) and (19) include compounds represented by the following Structural Formulas (20) to (39).

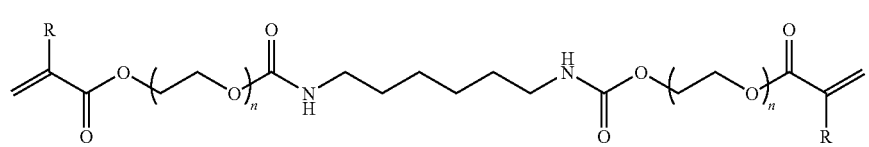

Structural Formula (20)

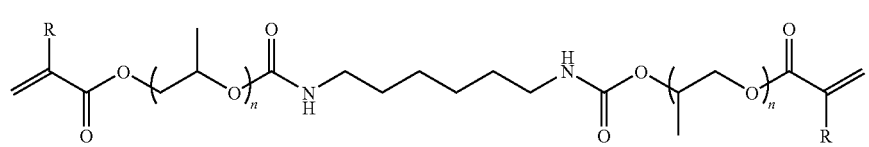

Structural Formula (21)

-continued
Structural Formula (22)
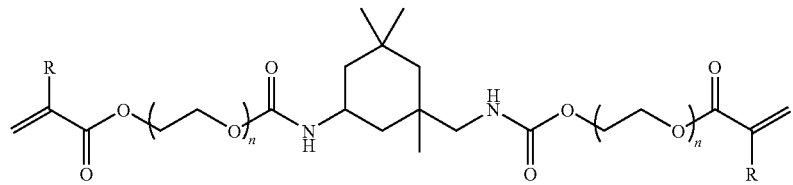
Structural Formula (23)
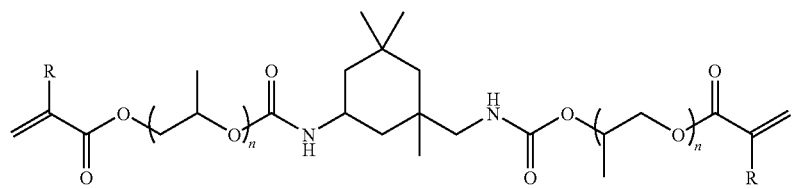
Structural Formula (24)
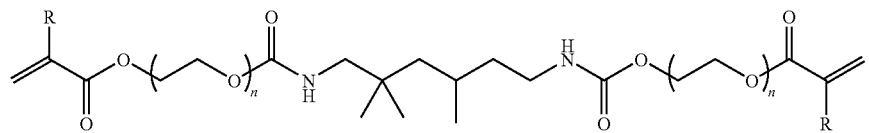
Structural Formula (25)
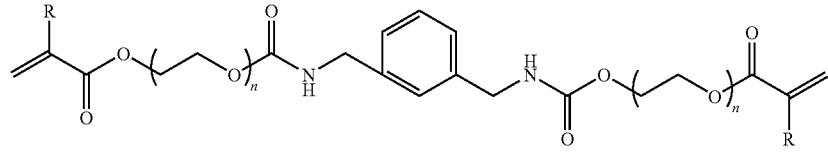
Structural Formula (26)
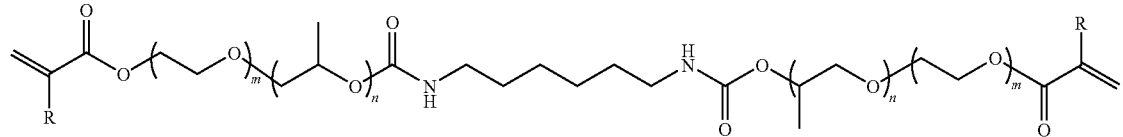
Structural Formula (27)
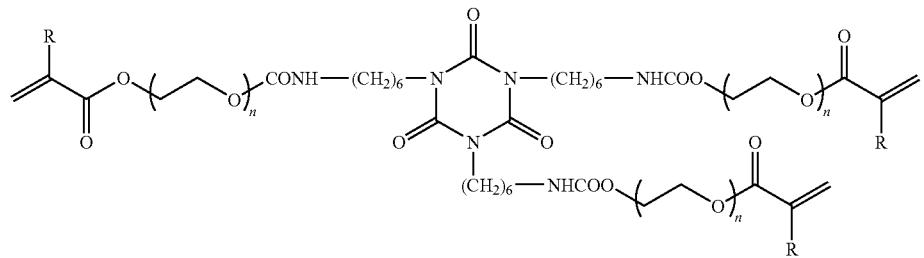
Structural Formula (28)
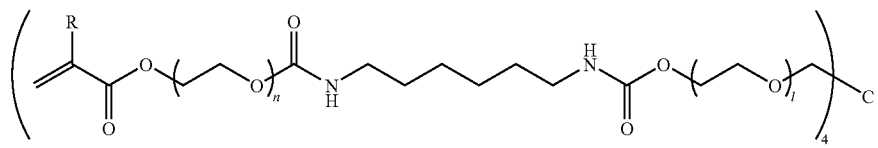
Structural Formula (29)
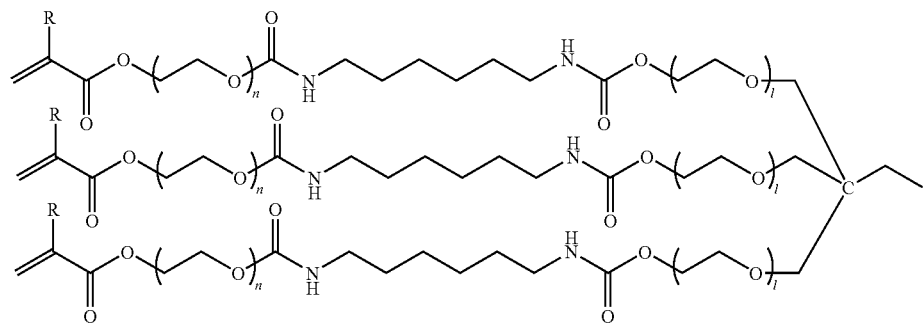

Structural Formula (30)
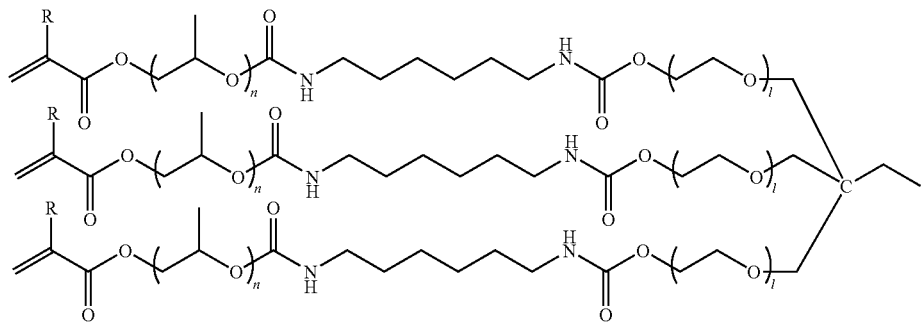
Structural Formula (31)
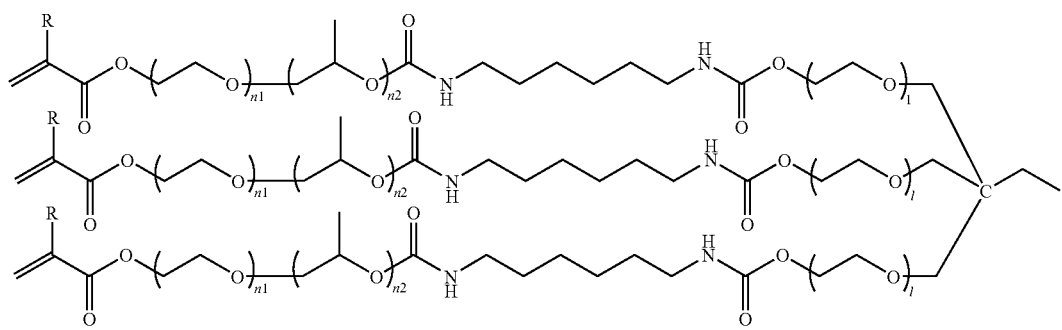
Structural Formula (32)
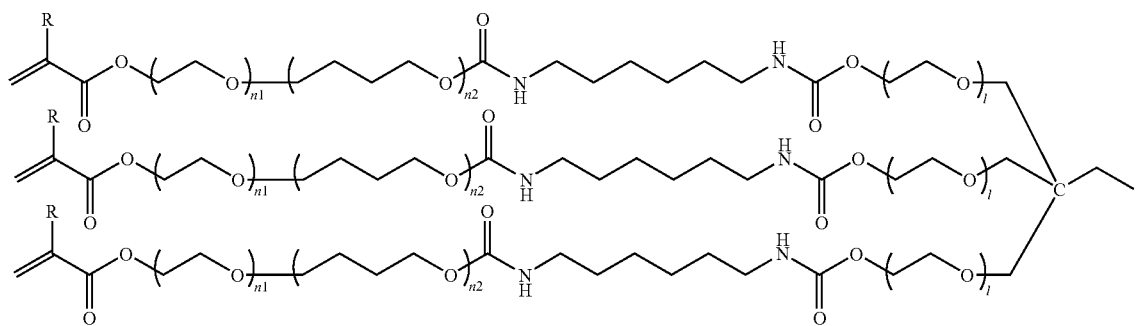
Structural Formula (33)
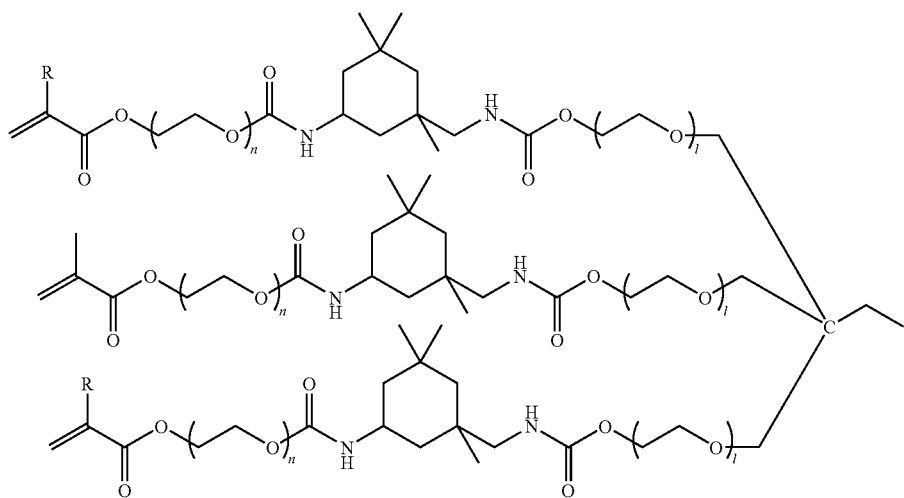

Structural Formula (34)
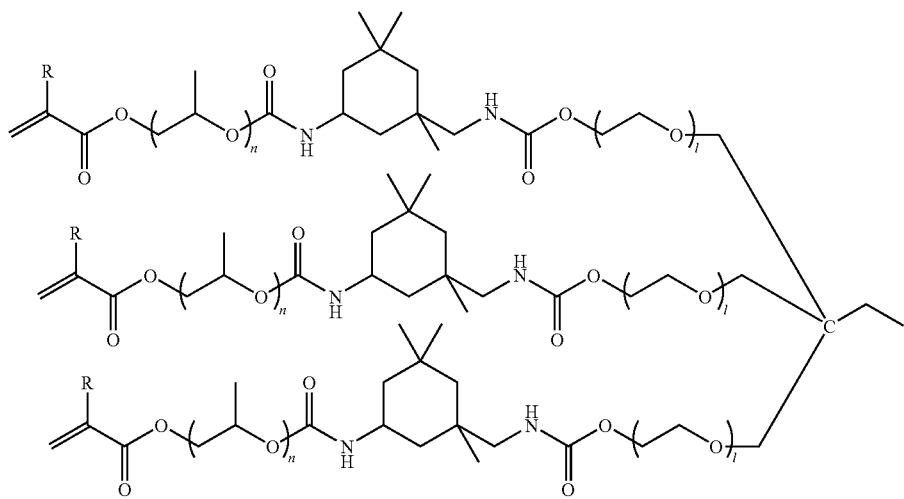
Structural Formula (35)
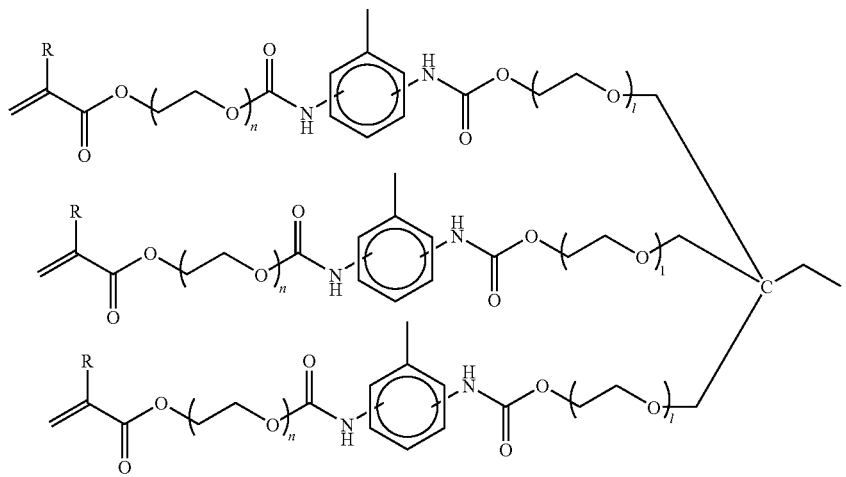
Structural Formula (36)
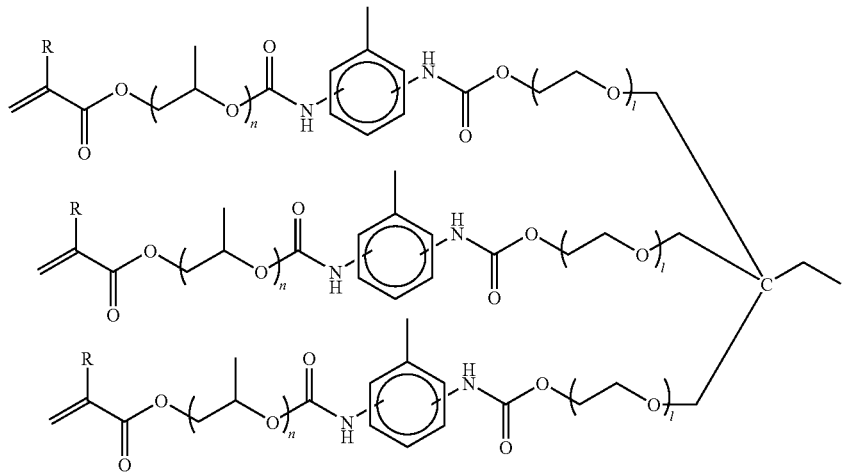

Structural Formula (37)

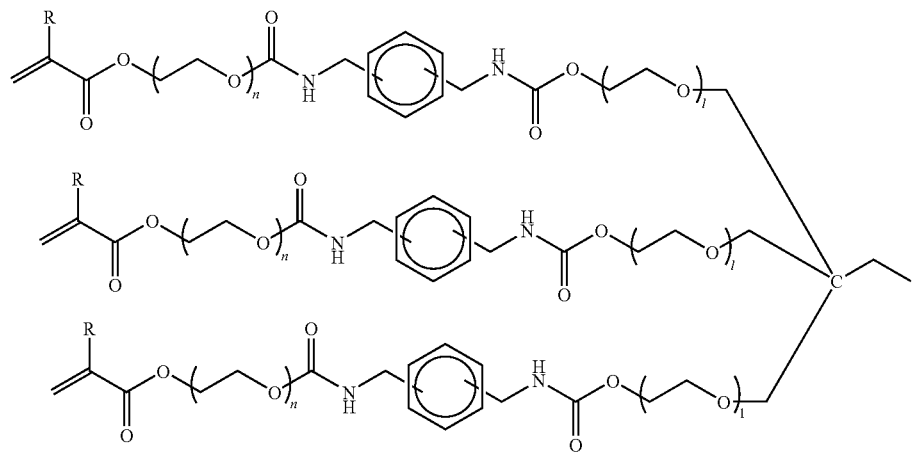

Structural Formula (38)

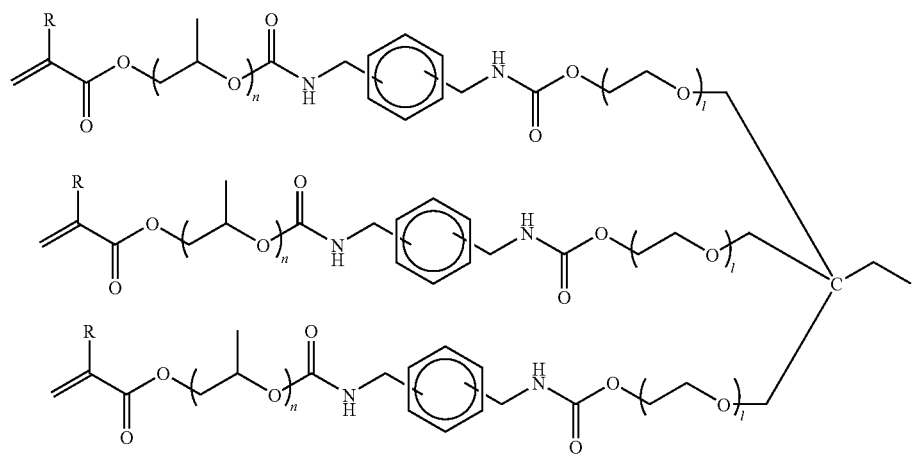

Structural Formula (39)

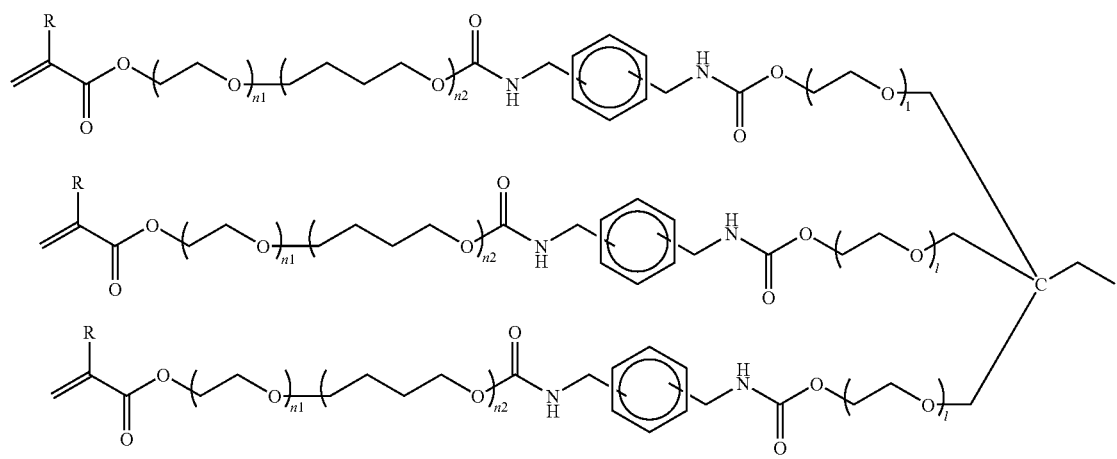

In the Structural Formulas (20) to (39), "n", "$n_1$", "$n_2$", and "m" respectively represent an integer of 1 to 60; "l" represents an integer of 1 to 20; and "R" represents a hydrogen atom or a methyl group.

—Compound Having Aryl Group—

The compound having an aryl group is not particularly limited as long as the compound has an aryl group, and may be suitably selected in accordance with the intended use. Examples thereof are esters or amides between at least any one of a polyvalent alcohol compound having an aryl group, a polyvalent amine compound having an aryl group, and a polyvalent amino alcohol compound having an aryl group with an unsaturated carboxylic acid.

Examples of the polyvalent alcohol compound, polyvalent amine compound, and polyvalent amino alcohol compound having an aryl group include polystyrene oxide, xylylene diol, di-(β-hydroxyethoxy)benzene, 1,5-dihydroxy-1,2,3,4-tetrahydronaphthalene, 2,2-diphenyl-1,3-propanediol, hydroxybenzyl alcohol, hydroxyethyl resorcinol, 1-phenyl-1,2-ethanediol, 2,3,5,6-tetramethyl-p-xylene-α,α'-diol, 1,1,4,4-tetraphenyl-1,4-butanediol, 1,1,4,4-tetraphenyl-1-butyne-1,4-diol, 1,1'-bi-2-naphtol, dihydroxynaphthalene, 1,1'-methylene-di-2-naphtol, 1,2,4-benzenetriol, biphenol, 2,2'-bis(4-hydroxyphenyl)butane, 1,1-bis(4-hydroxyphenyl)cyclohexane, bis(hydroxyphenyl)methane, catechol, 4-chlorresorcinol, hydroquinone, hydroxybenzyl alcohol, methyl hydroquinone, methylene-2,4,6-trihydroxybenzoate, phloroglycinol, pyrogallol, resorcinol, α-(1-aminoethyl)-p-hydroxybenzyl alcohol, α-(1-aminoethyl)-p-hydroxybenzyl alcohol, and 3-amino-4-hydroxyphenylsulfone. Besides, compounds obtained by adding β-unsaturated carboxylic acid to a glycidyl compound such as xylylenebis(meth)acrylamine, novolac epoxy resin, and bisphenol A diglycidyl ether; esterified products obtained from a vinyl monomer containing hydroxyl group in the molecule and a phthalic acid or a trimellitic acid; diaryl phthalate; triaryl trimellitate; diaryl benzene disulfonate, cationic polymerizable divinyl ethers as polymerizable monomers such as bisphenol A divinyl ether; epoxy compounds such as novolac epoxy resin, and bisphenol A diglycidyl ether; vinyl esters such as divinyl phthalate, divinyl terephthalate, and divinylbenzene-1,3-disulfonate; and styrene compounds such as divinyl benzene, and p-allylstyrene, and p-isopropenestyrene. Of these, compounds represented by the following Structural Formula (40) are preferable.

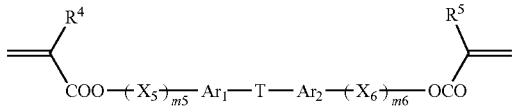

Structural Formula (40)

In the Structural Formula (40), $R^4$ and $R^5$ respectively represent a hydrogen atom or an alkyl group.

In the Structural Formula (40), $X_5$ and $X_6$ respectively represent an alkylene oxide group, and a alkylene oxide group may be singly used, or two or more alkylene oxide groups may be used in combination. Preferred examples of the alkylene oxide group include ethylene oxide group, propylene oxide group, butylene oxide group, pentylene oxide group, hexylene oxide group, and combined groups thereof (may be combined into a random compound or a block compound). Of these, ethylene oxide group, propylene oxide group, butylene oxide group or compound groups thereof are preferable, and ethylene oxide group and propylene oxide group are more preferable.

In the Structural Formula (40), m5 and m6 are respectively preferably an integer of 1 to 60, more preferably an integer of 2 to 30, and particularly preferably an integer of 4 to 15.

In the Structural Formula (40), "T" represents a divalent linking group, and examples thereof include methylene, ethylene, MeCMe, $CF_3CCF_3$, CO, and $SO_2$.

In the Structural Formula (40), $Ar_1$ and $Ar_2$ respectively represent an aryl group that may have a substituent group, and examples thereof are alkyl group, aryl group, aralkyl group, halogen group, alkoxy group, or combinations thereof.

Specific examples of the compound having an aryl group include 2,2-bis[4-(3-(meth)acryloxy-2-hydroxy propoxy)phenyl] propane, 2,2-bis[4-((meth)acryloxyethoxy)phenyl] propane, 2,2-bis(4-((meth)acryloxypolyethoxy)phenyl) propane of which the number of ethoxy groups substituted by one phenolic OH group is 2 to 20 such as 2,2-bis(4-((meth)acryloyloxydiethoxy)phenyl) propane, 2,2,2-bis(4-((meth)acryloyloxytetraethoxy)phenyl) propane, 2,2-bis(4-((meth)acryloyloxypentaethoxy)phenyl) propane, 2,2-bis(4-((meth)acryloyloxydecaethoxy)phenyl) propane, and 2,2-bis(4-((meth)acryloyloxypentadecaethoxy)phenyl) propane; 2,2-bis[4-((meth)acryloxypropoxy)phenyl] propane; 2,2-bis (4-((meth)acryloyloxypolypropoxy)phenyl) propane of which the number of ethoxy groups substituted by one phenolic OH group is 2 to 20 such as 2,2-bis(4-((meth)acryloyloxydipropoxy)phenyl) propane, 2,2-bis(4-((meth)acryloyloxytetrapropoxy)phenyl) propane, 2,2-bis(4-((meth)acryloyloxypentapropoxy)phenyl) propane, 2,2-bis(4-((meth)acryloyloxydecapropoxy)phenyl) propane, and 2,2-bis(4-((meth)acryloyloxypentadecapropoxy)phenyl) propane; or compounds containing both a polyethylene oxide skeleton and a polypropylene oxide skeleton in a same molecule as polyether sites of these compounds such as the compounds described in WO01/98832 and the like or as commercially available products, BPE-200, BPE-500, and BPE-1000 manufactured by Shin-Nakamula Chemical Co., Ltd.; and polymerizable compounds having a bisphenol skeleton and a urethane group. These compounds may be a compound in which a site derived from bisphenol A skeleton is changed to bisphenol F or bisphenol S or the like.

Examples of the polymerizable compound having a bisphenol skeleton and a urethane group include adducts between bisphenol and ethylene oxide or propylene oxide or the like, a compound having an isocyanate group and a polymerizable group in a compound having a hydroxyl group at the terminals that can be obtained as a polyadduct such as 2-isocyanate ethyl (meth)acrylate, and α,α-dimethyl-binylbenzylisocyanate.

—Other Polymerizable Compounds—

For the photosensitive layer, a polymerizable compound having a functional group other than the above-noted propylene oxide group, ethylene oxide group, urethane group, and aryl group may be used in combination with the above-noted compounds within a range where the use of the polymerizable compound does not degrade properties of the pattern forming material.

Examples of the other polymerizable compounds include esters between an unsaturated carboxylic acid (such as acrylic acid, methacrylic acid, itaconic acid, crotonic acid, isocrotonic acid, and maleic acid) and an aliphatic polyvalent alcohol compound; and amides between an unsaturated carboxylic acid and a polyvalent amine compound.

Examples of the esters between an unsaturated carboxylic acid and an aliphatic polyvalent alcohol compound include, as (meth)acrylic acid ester, ethyleneglycol di(meth)acrylate, polyethyleneglycol di(meth)acrylate having 2 to 18 ethylene groups such as diethylene glycol di(meth)acrylate, triethylene glycol di(meth)acrylate, tetraethylene glycol di(meth)acrylate, nonaethylene glycol di(meth)acrylate, dodecaethylene glycol di(meth)acrylate, and tetradecaethylene glycol di(meth)acrylate; propylene glycol di(meth)acrylate, polypropylene glycol di(meth)acrylate having 2 to 18 propylene groups such as dipropylene glycol di(meth)acrylate, tripropylene glycol di(meth)acrylate, tetrapropylene glycol di(meth)acrylate, and dodecapropylene glycol di(meth)acrylate; neopentyl glycol di(meth)acrylate, ethylene oxide-modified neopentyl glycol di(meth)acrylate, propylene oxide-modified neopentyl glycol di(meth)acrylate, trimethylol propane tri(meth)acrylate, trimethylol propane di(meth)acrylate, trimethylol propane tri((meth)acryloyloxypropyl) ether, trimethylolethane tri(meth)acrylate, 1,3-propanedioldi (meth)acrylate, 1,3-butanedioldi(meth)acrylate, 1,4- butanediol di(meth)acrylate, 1,6-hexanediold(meth)acrylate, tetramethylene glycol di(meth)acrylate, 1,4-cyclohexanediol di(meth)acrylate, 1,2,4-butanetrioltri (meth)acrylate, 1,5-pentanediol (meth)acrylate, pentaerythritol di(meth)arylate, pentaerythritol tri(meth)acrylate, pentaerythritol tetra(meth) acrylate, dipentaerythritol penta(meth)acrylate, dipentaerythritol hexa(meth)acrylate, sorbitol tri(meth)acrylate, sorbitol tetra(meth)acrylate, sorbitol penta(meth)acrylate, sorbitol hexa(meth)acrylate, dimethylol dicyclopentane di(meth)acrylate, tricyclodecane di(meth)acrylate, neopentyl glycol di(meth)acrylate, neopentyl glycol-modified trimethylol propane di(meth)acrylate, di(meth)acrylate of alkylene glycol chain having at least each of an ethylene glycol chain/a propylene glycol chain (for example, the compounds described in WO01/98832, and the like); tri(meth)acrylic acid ester of trimethylol propane with at least any one of ethylene oxide and propylene oxide added thereto, polybutylene glycoldi(meth)acrylate, glycerine di(meth)acrylate, glycerine tri(meth)acrylate, and xylenol di(meth)acrylate.

Among the (meth)acrylic acid esters, in terms of easy availability, ethylene glycol di(meth)acrylate, polyethylene glycol di(meth)acrylate, propylene glycol di(meth)acrylate, polypropylene glycol di(meth)acrylate, di(meth)acrylate of alkylene glycol chain having at least each of an ethylene glycol chain/a propylene glycol chain, trimethylol propane tri(meth)acrylate, pentaerythritol tetra(meth)acrylate, pentaerythritol triacrylate, pentaerythritol di(meth)acrylate, dipentaerythritol penta(meth)acrylate, dipentaerythritol hexa (meth)acrylate, glycerine tri(meth)acrylate, diglycerine di(meth)acrylate, 1,3-propanediol di(meth)acrylate, 1,4-cyclohexanediol di(meth)acrylate, 1,5-pentanediol (meth)acrylate, neopentyl glycol di(meth)acrylate, and tri(meth)acrylic acid ester of a trimethylol propane with an ethylene oxide added thereto are preferable.

Examples of the ester between the itaconic acid and the aliphatic polyvalent alcohol compound (itaconic acid ester) include ethylene glycol diitaconate, propylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the ester between the crotonic acid and the aliphatic polyvalent alcohol compound (crotonic acid ester) include ethylene glycol dicrotonate, tetramethylene glycol dicrotonate, tetramethylene glycol dicrotonate, pentaerythritol dicrotonate, and sorbitol tetradicrotonate.

Examples of the ester between the isocrotonic acid and the aliphatic polyvalent alcohol compound (isocrotonic acid ester) include ethylene glycol diisocrotonate, pentaerythritol diisocrotonate, and sorbitol tetraisocrotonate.

Examples of the ester between the maleic acid and the aliphatic polyvalent alcohol compound (maleic acid ester) include ethylene glycol dimaleate, triethylene glycol dimaleate, pentaerythritol dimaleate, and sorbitol tetramaleate.

Examples of the amide derived from the polyvalent amine compound and the unsaturated carboxylic acids include methylene bis(meth)acrylamide, ethylene bis(meth)acrylamide, 1,6-hexamethylene bis(meth)acrylamide, octamethylene bis(meth)acrylamide, diethylene triamine tris(meth)acrylamide, and diethylene triamine bis(meth)acrylamide.

Besides the above, as polymerizable monomers, compounds that can be obtained by adding $\alpha,\beta$-unsaturated carboxylic acid to a glycidyl group-containing compound such as butanediol-1,4-diglycidyl ether, cyclohexane dimethanol glycidyl ether, ethylene glycol diglycidyl ether, diethylene glycol diglycidyl ether, dipropylene glycol diglycidyl ether, hexanediol diglycidyl ether, trimethylol propane triglycidyl ether, pentaerythritol tetraglycidyl ether; polyester acrylates and polyester (meth)acrylate oligomers as described in Japanese Patent Application Laid-Open (JP-A) Nos. 48-64183, Japanese Patent Application Publication (JP-B) Nos. 49-43191 and 52-30490; polyfunctional acrylates and methacrylates such as epoxy acrylates obtained by reacting (meth)acrylic acid with an epoxy compound (for example, butanediol-1,4-diglycidyl ether, cyclohexane dimethanol glycidyl ether, diethylene glycol diglycidyl ether, dipropylene glycol diglycidyl ether, hexanediol diglycidyl ether, trimethylol propane triglycidyl ether, pentaerythritol tetraglycidyl ether, and glycerine triglycidyl ether); light curable monomers and oligomers described on pp. 300 to 308 of No. 7 in Journal of The Adhesion Society of Japan Vol. 1.20 (1984); allyl esters (for example, diallyl phthalate, diallyl adipate, and diallyl malonate); diallylamide (for example, diallylacetoamide); cationic polymerizable divinyl ethers (such as butanediol-1,4-divinylether, cyclohexanedimethanol divinylether, ethylene glycol divinylether, diethylene glycol divinylether, dipropylene glycol divinylether, hexanediol divinylether, trimethylol propane trivinyl ether, pentaerythritol tetravinyl ether, and glycerine trivinyl ether); epoxy compounds (for example, butanediol-1,4-diglycidyl ether, cyclohexane dimethanol glycidyl ether, ethylene glycol diglycidyl ether, diethylene glycol diglycidyl ether, dipropylene glycol diglycidyl ether, hexanediol diglycidyl ether, trimethylol propane triglycidyl ether, pentaerythritol tetraglycidyl ether, and glycerine triglycidyl ether); oxetanes (for example, 1,4-bis[(3-ethyl-3-oxetanylmethocy) methyl] benzene); epoxy compounds, oxetanes (for example, the compounds described in WO01/22165), and compounds each having two or more different ethylene unsaturated double bonds such as N-$\beta$-hydroxyethyl-$\beta$-(methacrylamide) ethyl acrylate, N,N-bis($\beta$-methacryloxyethyl)acrylamide, and allyl methacrylate.

Examples of the vinyl esters include divinyl succinate, and divinyl adipate.

Each of these polyfunctional monomers and oligomers may be used alone or in combination with two or more.

For the other polymerizable monomers, a polymerizable compound having one polymerizable group in the molecule (monofunctional monomer) may be used in combination where necessary.

Examples of the monofunctional monomer include the compounds exemplified above as raw materials of the binder; monofunctional monomers (for example, $\gamma$-chloro-$\beta$-hydroxypropyl-$\beta$'-methacryloyloxyethyl-o-phthalate) such as dibasic acid mono((meth)acryloyloxyalkyl ester) and mono(halohydroxyalkyl ester) described in Japanese Patent Application Laid-Open (JP-A) No. 6-236031; and compounds described in Japanese Patent Nos. 2744643 and 2548016, and WO00/52529.

The content of the polymerizable compound in the photosensitive layer is preferably 5% by mass to 90% by mass, more preferably 15% by mass to 60% by mass, and particularly preferably 20% by mass to 50% by mass.

When the content of the polymerizable compound is less than 5% by mass, the strength of tent film may be reduced, and when the content is more than 90% by mass, edge fusion (failure of exudate from roll ends) of the pattern forming material may be worsened during storage.

The content of the polyfunctional monomer having two or more polymerizable groups in the polymerizable compound is preferably 5% by mass to 100% by mass, more preferably 20% by mass to 100% by mass, and particularly preferably 40% by mass to 100% by mass.

—Photopolymerization Initiator—

The photopolymerization initiator is not particularly limited as long as the photopolymerization initiator has an ability to initiate polymerization of the polymerizable compound, and may be suitably selected from among those known in the art. The photopolymerization initiator may be an activator which exerts some effects with a photoexcited photosensitizer and generates an active radical or may be an initiator capable of initiating cation polymerization depending on the type of monomer.

In addition, it is preferable that the photopolymerization initiator contains at least one component having a molecular extinction coefficient of at least around 50 in the wavelength region of about 300 nm to 800 nm (more preferably in the wavelength region of 330 nm to 500 nm).

Examples of the photopolymerization initiator include halogenated hydrocarbon derivatives such as halogenated hydrocarbon derivative having a triazine skeleton, halogenated hydrocarbon derivative having an oxadiazole skeleton; hexaaryl biimidazole, oxime derivative, organic peroxide, thio compound, ketone compound, aromatic onium salt, and metallocenes. Of these, from the perspective of photosensitivity of photosensitive layer, storage stability, and adhesion property between photosensitive layer and a substrate used for forming a print wiring board, a halogenated hydrocarbon having a triazine skeleton, an oxime derivative, a ketone compound, and a hexaarylbiimidazole compound are preferable.

Examples of the hexaarylbiimidazole include 2,2'-bis(2-chlorophenyl)-4,4',5,5'-tetraphenylbiimidazole, 2,2'-bis(o-fluorophenyl)-4,4',5,5'-tetraphenylbiimidazole, 2,2'-bis(2-bromophenyl)-4,4'5,5'-tetraphenybiimidazole, 2,2'-bis(2,4-dichlorophenyl)-4,4'5,5'-tetraphenylbiimidazole, 2,2'-bis(2-chlorophenyl)-4,4'5,5'-tetra(3-methoxyphenyl)biimidazole, 2,2'-bis(2-chlorophenyl)-4,4'5,5'-tetra(4-methoxyphenyl)biimidazole, 2,2'-bis(4-methoxyphenyl)-4,4'5,5'-tetraphenylbiimidazole, 2,2'-bis(2,4-dichlorophenyl)-4,4',5,5'-tetraphenylbiimidazole, 2,2'-bis(2-nitrophenyl)-4,4',5,5'-tetraphenylbiimidazole, 2,2'-bis(2-methylphenyl)-4,4'5,5'-tetraphenylbiimidazole, 2,2'-bis(2-trifluoromethylphenyl)-4,4',5,5'-tetraphenylbiimidazole, and the compounds described in WO00/52529.

The biimidazoles can be easily synthesized by the methods disclosed in Bulletin of the Chemical Society of Japan 33, 565 (1960), and the Journal of Organic Chemistry 36 (16) 2262 (1971).

Examples of the halogenated hydrocarbon compound having a triazine skeleton include the compounds described in Bulletin of the Chemical Society of Japan, 42, 2924 (1969) reported by Wakabayashi et al.; compounds described in Great Britain Patent No. 1388492; compounds described in Japanese Patent Application Laid-Open (JP-A) No. 53-133428; compounds described in Germany Patent No. 3337024; compounds described in the Journal of Organic Chemistry reported by F. C. Schaefer et al., 29, 1527 (1964); compounds described in Japanese Patent Application Laid-Open (JP-A) No. 62-58241; compounds described in Japanese Patent Application Laid-Open (JP-A) No. 5-281728; compounds described in Japanese Patent Application Laid-Open (JP-A) No. 5-34920; and compounds described in U.S. Pat. No. 4,212,976.

Examples of the compounds described in Bulletin of the Chemical Society of Japan, 42, 2924 (1969) reported by Wakabayashi et al. include 2-phenyl-4,6-bis (trichlormethyl)-1,3,5-triazine, 2-(4-chlorophenyl)-4,6-bis(trichlormethyl)-1,3,5-triazine, 2-(4-tolyl)-4,6-bis(trichlormethyl)-1,3,5-triazine, 2-(4-methoxyphenyl)-4,6-bis(trichloromethyl)-1,3,5-triazine, 2-(2,4-dichlorphenyl)-4,6-bis(trichloromethyl)-1,3,5-triazine, 2,4,6-tris(trichloromethyl)-1,3,5-triazine, 2-methyl-4,6-bis(trichloromethyl)-1,3,5-triazine, 2-n-nonyl-4,6-bis(trichloromethyl)-1,3,5-triazine, and 2-(α,α,β-trichlorethyl)-4,6-bis(trichoromethyl)-1,3,5-triazine.

Examples of the compounds described in Great Britain Patent No. 1388492 include 2-styryl-4,6-bis(trichloromethyl)-1,3,5-triazine, 2-(4-methylstyryl)-4,6-bis(trichloromethyl)-1,3,5-triazine, 2-(4-methoxystyryl)-4,6-bis(trichloromethyl)-1,3,5-triazine, and 2-(4-methoxystyryl)-4-amino-6-trichlormethyl-1,3,5-triazine.

Examples of the compounds described in Japanese Patent Application Laid-Open (JP-A) No. 53-133428 include 2-(4-methoxy-naphtho-1-yl)-4,6-bis (trichloromethyl)-1,3,5-triazine, 2-(4-ethoxy-naphtho-1-yl)-4,6-bis(trichloromethyl)-1,3,5-triazine, 2-[4-(2-ethoxyethyl)-1,3,5-triazine, 2-[4-(2-ethoxyethyl)-naphtho-1-yl]-4,6-bis(trichloromethyl)-1,3,5-triazine, 2-(4,7-dimethoxy-naphtho-1-yl)-4,6-bis(trichloromethyl)-1,3,5-triazine, and 2-(acenaphtho-5-yl)-4,6-bis(trichloromethyl)-1,3,5-triazine.

Examples of the compounds described in Germany Patent No. 3337024 include 2-(4-styrylphenyl)-4,6-bis(trichloromethyl)-1,3,5-triazine, 2-(4-(4-methoxystyryl)phenyl)-4,6-bis (trichoromethyl)-1,3,5-triazine, 2-(1-naphtylvinylenephenyl)-4,6-bis(trichoromethyl)-1,3,5-triazine, 2-chlorostyrylphenyl-4,6-bis(trichloromethyl)-1,3,5-triazine, 2-chlorostyrylphenyl-4,6-bis(trichloromethyl)-1,3,5-triazine, 2-(4-thiophene-2-vinylenephenyl)-4,6-bis(trichloromethyl)-1,3,5-triazine, 2-(4-thiophene-3-vinylenephenyl)-4,6-bis(trichloromethyl)-1,3,5-triazine, 2-(4-furan-2-binylenephenyl)-4,6-bis(trichloromethyl)-1,3,5-triazine, and 2-(4-benzofuran-2-vinylenephenyl)-4,6-bis(trichloromethyl)-1,3,5-triazine.

Examples of the compounds described in the Journal of Organic Chemistry reported by F. C. Schaefer et al., 29, 1527 (1964) include 2-methyl-4,6-bis (tribromomethyl)-1,3,5-triazine, 2,4,6-tris(tribromomethyl)-1,3,5-triazine, 2,4,6-tris (dibromomethyl)-1,3,5-triazine, 2-amino-4-methyl-6-tri (bromomethyl)-1,3,5-triazine, and 2-methoxy-4-methyl-6-trichloromethyl-1,3,5-triazine.

Examples of the compounds described in Japanese Patent Application Laid-Open (JP-A) No. 62-58241 include 2-(4-phenylethynylphenyl)-4,6-bis (trichloromethyl)-1,3,5-triazine, 2-(4-naphthyl-1-ethynylphenyl-4,6-bis (trichloromethyl)-1,3,5-triazine, 2-(4-(4-trylethynyl)phenyl)-4,6-bis (trichoromethyl)-1,3,5-triazine, 2-(4-(4-methoxyphenyl) ethynylphenyl)-4,6-bis (trichloromethyl)-1,3,5-triazine, 2-(4-(4-isopropylphenylethynyl)phenyl)-4,6-bis (trichloromethyl)-1,3,5-triazine, and 2-(4-(4-ethylphenylethynyl) phenyl)-4,6-bis (trichloromethyl)-1,3,5-triazine.

Examples of the compounds described in Japanese Patent Application Laid-Open (JP-A) No. 5-281728 include 2-(4-trifluoromethylphenyl)-4,6-bis (trichloromethyl)-1,3,5-triazine, 2-(2,6-difluorophenyl)-4,6-bis (trichloromethyl)-1,3,5-triazine, 2-(2,6-dichlorophenyl)-4,6-bis (trichloromethyl)-1,3,5-triazine, and 2-(2,6-dibromophenyl)-4,6-bis (trichloromethyl)-1,3,5-triazine.

Examples of the compounds described in Japanese Patent Application Laid-Open (JP-A) No. 5-34920 include 2,4-bis (trichloromethyl)-6-[4-(N,N-diethoxycarbonylmethylamine)-3-bromophenyl]-1,3,5-triazine, trihalomethyl-s-triazine compounds described in U.S. Pat. No. 4,239,850; and 2,4,6-tris(trichloromethyl)-s-triazine, and 2-(4-chlorophenyl)-4,6-bis(tribromomethyl)-s-triazine.

Examples of the compounds described in U.S. Pat. No. 4,212,976 include compounds each having an oxadiazole skeleton such as 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorstyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, and 2-tripromemethyl-5-styryl-1,3,4-oxadiazole.

Examples of oxime derivatives preferably used in the present invention include compounds represented by the following Structural Formulas (41) to (74).

Structural Formula (41)

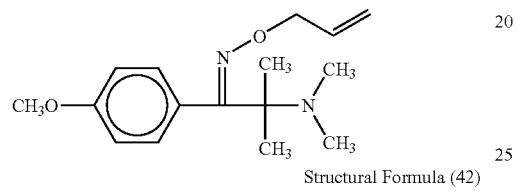

Structural Formula (42)

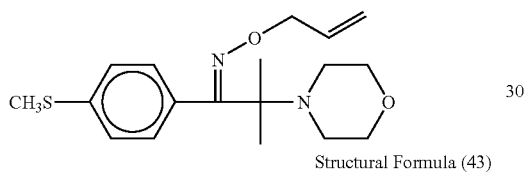

Structural Formula (43)

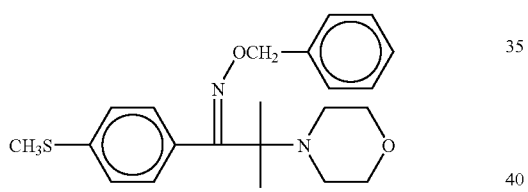

Structural Formula (44)

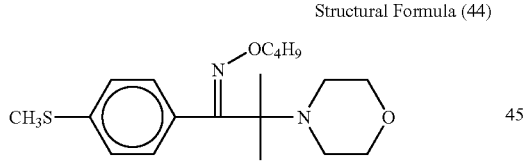

Structural Formula (45)

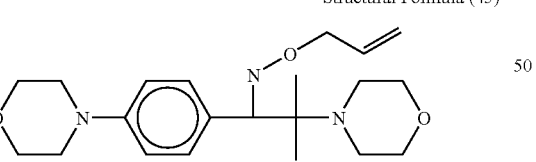

Structural Formula (46)

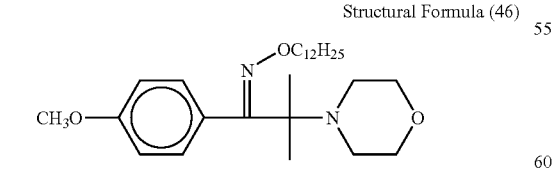

Structural Formula (47)

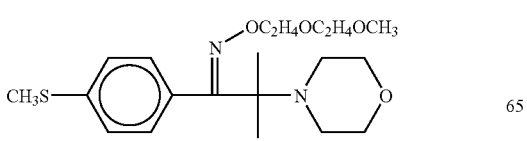

Structural Formula (48)

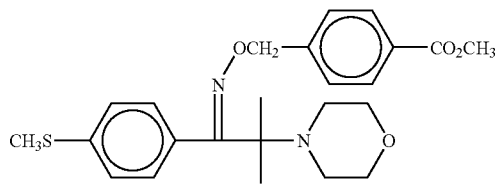

Structural Formula (49)

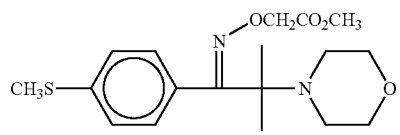

Structural Formula (50)

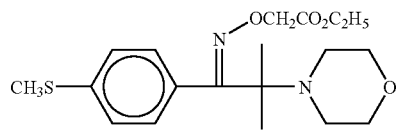

Structural Formula (51)

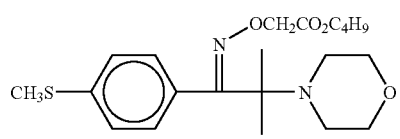

Structural Formula (52)

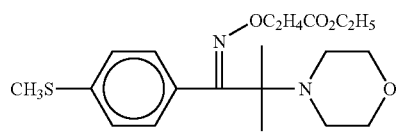

Structural Formula (53)

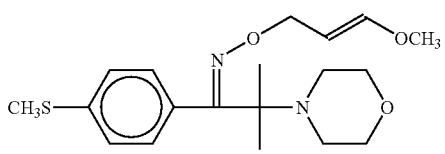

Structural Formula (54)

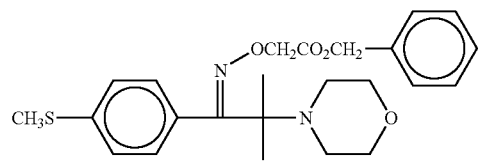

Structural Formula (55)

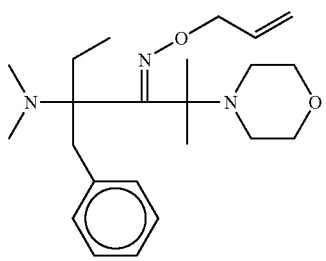

Structural Formula (56)
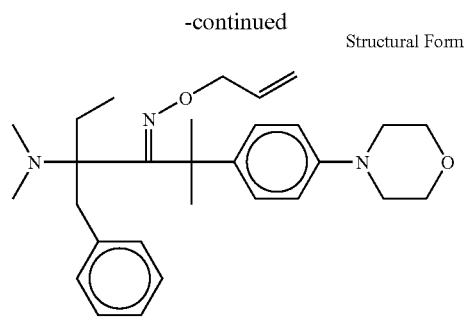

Structural Formula (57)
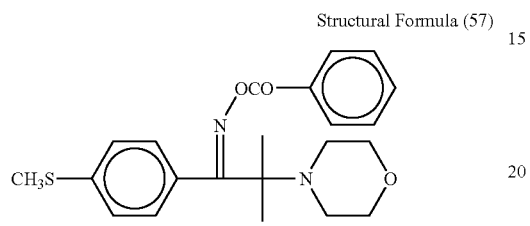

Structural Formula (58)
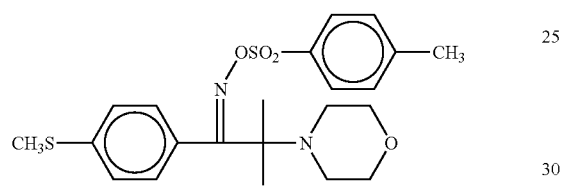

Structural Formula (59)
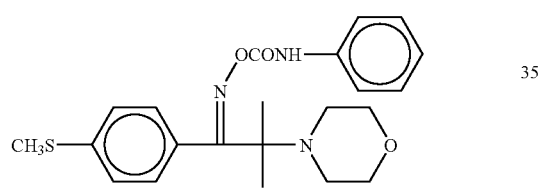

Structural Formula (60)
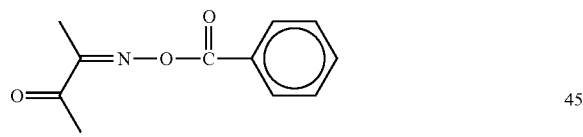

Structural Formula (61)
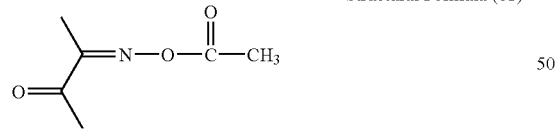

Structural Formula (62)
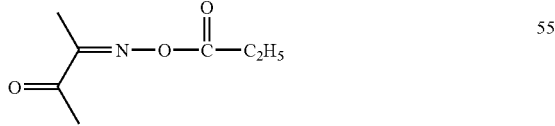

Structural Formula (63)
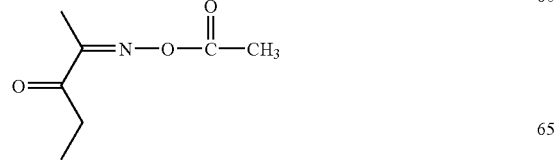

Structural Formula (64)
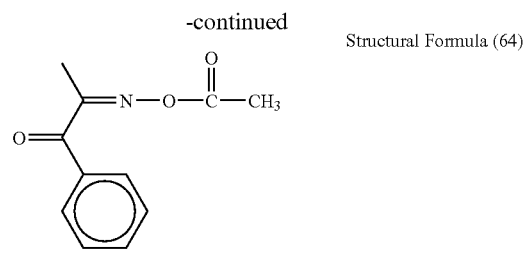

Structural Formula (65)
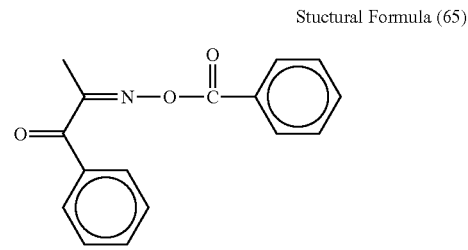

Structural Formula (66)
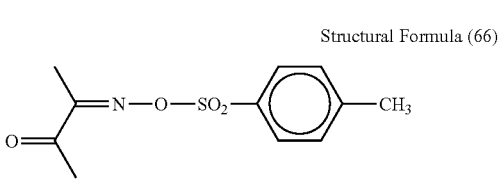

Structural Formula (67)
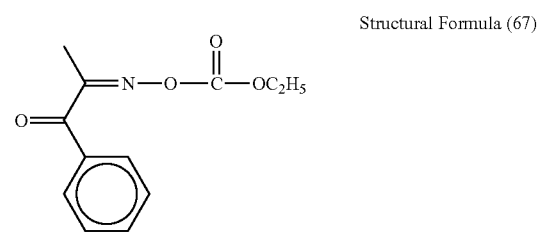

Structural Formula (68)
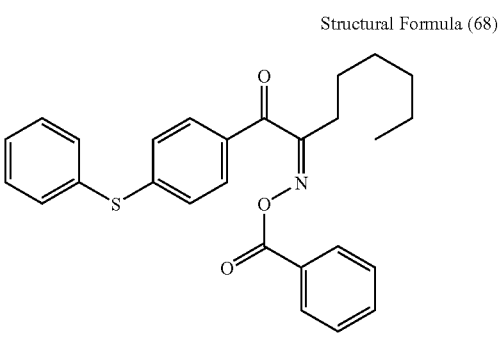

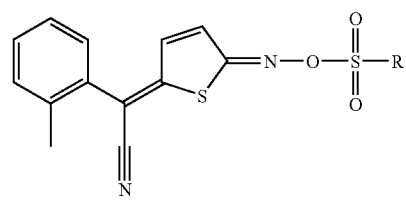

R
Structural Formula (69) n-$C_3H_7$
Structural Formula (70) n-$C_8H_{17}$
Structural Formula (71) Camphor
Structural Formula (72) p-$CH_3C_6H_4$ -continued

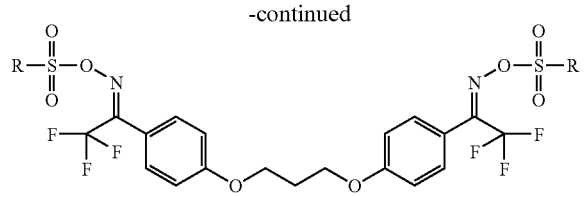

R
Structural Formula (73) n-C$_3$H$_7$
Structural Formula (74) p-CH$_3$C$_6$H$_4$ Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxy carbonylbenzophenone, benzophenone tetracarboxylic acids or tetramethyl esters thereof; 4,4'-bis (dialkylamino)benzophenones such as 4,4'-bis(dimethylamine)benzophenone, 4,4'-bisdicyclohexylamine) benzophenone, 4,4'-bis(diethylamine) benzophenone, 4,4'-bis(dihydroxyethylamine) benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-t-butylanthraquinone, 2-methylanthraquinone, phenanthraquinone, xanthone, thioxanthone, 2-chlor-thioxanthone, 2,4-diethylthioxanthone, fluorenone, 2-benzyl-dimethylamino-1-(4-morphorinophenyl)-1-butanone, 2-methyl-1-[4-(methylthio)phenyl]-2-morphorino-1-propanone, 2-hydroxy-2-methyl-[4-(1-methylvinyl)phenyl] propanol oligomer, benzoin, benzoin ethers such as benzoin methyl ether, benzoin ethyl ether, benzoin propyl ether, benzoin iso-propyl ether, benzoin phenyl ether, and benzyldimethyl ketal; acridone, chloroacridone, N-methylacridone, N-butylacridone, and N-butyl-chloroacridone.

Examples of the metallocenes include bis(η5-2,4-chyclopentadiene-1-yl)-bis(2,6-diphloro-3-(1H-pyrrol-1-yl)-phenyl) titanium, η5-cyclopentadiethyl-η6-chlomenyl-iron (1+)-hexafluorophosphate (1−); and compounds described in Japanese Patent Application Laid-Open (JP-A) No. 53-133428, Japanese Patent Application Publication (JP-B) Nos 57-1819, and 57-6096, and U.S. Pat. No. 3,615,455.

Examples of photopolymerization initiators other than those described above include acridine derivatives such as 9-phenylacridine, 1,7-bis(9,9'-acridinyl) heptane, and N-phenylglycine; polyhalogen compounds such as carbon tetrabromide, phenyltribromomethylsulfone, and phenyltrichloromethylketone; coumarins such as 3-(2-benzofuroyl)-7-diethylaminocoumarin, 3-(2-benzofuroyl)-7-(1-pyrrolydinyl) coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis (5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylamino-cinnamoyl)-7-diethylaminocoumarin, 7-methoxy-3-(3-pyrizylcarbonyl) coumarin, 3-benzoyl-5,7-dipropoxycoumarin, 7-benzotriazole-2-ylcoumarin; coumarins described in Japanese Patent Application Laid-Open (JP-A) Nos. 5-19475, 7-271028, 2002-363206, 2002-363207, 2002-363208, and 2002-363209; amines such as ethyl 4-dimethylaminobenzoate, n-butyl 4-dimethylaminobenzoate, phenethyl 4-dimethylaminobenzoate, 2-phthalimideethyl 4-dimethylaminobenzoate, 2-methacryloyloxyethyl 4-dimethylaminobenzoate, pentamethylenebis (4-dimethylaminobenzoate), phenethyl of 3-dimethylaminobenzoate, pentamethylene esters, 4-dimethylaminobenzaldehyde, 2-chlor-4-dimethylaminobenzmodehyde, 4-dimethylaminobenzylalcohol, ethyl(4-dimethylaminebenzoyl)acetate, 4-pyperidinoacetophenone, 4-dimethylaminobenzoin, N,N-dimethyl-4-toluidine, N,N-diethyl-3-phenetidine, tribenzylamine, dibenzylphenylamine, N-methyl-N-phenylbenzylamine, 4-brom-N,N-dimethylaniline, tridodecylamine, aminofluorans (ODB, ODBII, etc.), crystal violet lactone, and leucocrystal violet; acylphosphine oxides such as bis(2,4,6-trimethylbenzoyl)-phenylphosphine oxide, bis(2,6-dimethoxybenzoyl)-2,4,4-trimethyl-pentylphenylphosphine oxide, and LucirinTPO.

Further, the vicinal polyketaldonyl compounds described in U.S. Pat. No. 2,367,660, the acyloin ether compounds described in U.S. Pat. No. 2,448,828, the aromatic acyloin compounds substituted by α-hydrocarbon described in U.S. Pat. No. 2,722,512, the polynuclear quinone compounds described in U.S. Pat. Nos. 3,046,127 and 2,951,758, the organic boron compounds described in Japanese Patent Application Laid-Open (JP-A) No. 2002-229194, radical generators, triaryl sulfonium salts such as salts produced with hexafluoroantimony and hexafluorophosphate; phosphonium salt compounds such as (phenylthiophenyl)diphenyl sulfonium salts which are usable as cationic polymerization initiator; and onium salt compounds described in WO01/71428.

Each of these photopolymerization initiators may be used alone or in combination with two or more. Examples of combinations of two or more include combinations between hexaarylbiimidazole and 4-aminoketones described in U.S. Pat. No. 3,549,367, combinations between benzothiazole compound and trihalomethyl-s-triazine compound described in Japanese Patent Application Publication (JP-B) No. 5148516, compounds between aromatic ketone compound (such as thioxanthone) and hydrogen donator (such as dialkylamino-containing compound, and phenol compound), compounds between hexaarylbiimidazole and titanocene, and combinations between coumarins, titanocene, and phenylglycines.

The content of the photopolymerization initiator in the photosensitive layer is preferably 0.1% by mass to 30% by mass, more preferably 0.5% by mass to 20% by mass, and particularly preferably 0.5% by mass to 15% by mass.

—Photosensitizer—

In the pattern forming material, it is preferable to use, for example, the photosensitizer in combination from the perspective of increasing the minimum optical energy (photosensitivity) of a light beam used for exposing the photosensitive layer so as not to change the thickness of exposed sites after exposure and developing. By using the photosensitizer in combination, for example, the photosensitivity of the photosensitive layer can be extremely easily controlled within the range of 0.1 mJ/cm$^2$ to 10 mJ/cm$^2$.

The photosensitizer is not particularly limited and may be suitably selected depending on the type of light irradiation unit (for example, visible light, ultraviolet ray, and visible laser). When selected in accordance with a laser having a wavelength of 380 nm to 420 nm as the light irradiation unit, a photosensitizer having a maximum absorption wavelength of 380 nm to 450 nm is preferable.

The photosensitizer can be excited by active energy ray, and can generate a radical, an available acidic group and the like through interaction with other substances such as radical generators and acid generators by transferring energy or electrons.

The photosensitizer is not particularly limited and may be suitably selected from among photosensitizers known in the art. Examples thereof include conventional polynuclear aromatic series such as pyrene, perylene, and triphenylene; xanthenes such as fluorescein, eosine, erythrosine, Rhodamine B, rose bengal; cyanines such as indocarbocyanine, thiacarbocyanine, and oxacarbocyanine; merocyanines (such as merocyanine, and carbomerocyanine; thiazines such as thionine, methylene blue, Toluidine blue; acridines such as acridine orange, chloroflavin, and acryflavin; anthraquinones such as anthraquinon; squaryliums such as squarylium, acridones such as acridone, chloroacridone, N-methylacridone, N-butylacridone, and N-butyl-chloroacridone; coumarins such as 3-(2-benzofuroyl)-7-diethylaminocoumarin, 3-(2-benzofuroyl)-7-(1-pyrrolidinyl) coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl) coumarin, 3-benzoyl-5,7-dipropoxycoumarin, and coumarin compounds described in Japanese Patent Application Laid-Open (JP-A) Nos. 05-19475, 07-271028, 2002-363206, 2002-363207, 2002-363208, and 2002-263209. Of these, a compound of which the aromatic ring or heterocyclic ring is condensed (condensation compounds) are preferable, and condensation ketone compounds (acridones and coumarins), and acridines are more preferable.

As for the combination of the photopolymerization initiator and the photosensitizer, the initiating mechanism that involves electron transfer may be exemplified such as combinations of (1) an electron donating initiator and a photosensitizer dye, (2) an electron accepting initiator and a photosensitizer dye, and (3) an electron donating initiator, a photosensitizer dye, and an electron accepting initiator (ternary initiating mechanism) as described in JP-A No. 2001-305734.

The content of the photosensitizer is preferably 0.01% by mass to 4% by mass relative to the total components of the photosensitive resin composition, more preferably 0.02% by mass to 2% by mass, and particularly preferably 0.05% by mass to 1% by mass.

When the content of the photosensitizer is less than 0.01% by mass, the photosensitivity may decrease, and when the content of the photosensitizer is more than 4% by mass, the pattern may be deformed.

—Other Components—

As for the other components, surfactant, plasticizer, coloring agent, and colorant are exemplified; in addition, adhesion promoter for substrate surface, and the other auxiliaries such as pigment, conductive particles, filler, defoamer, fire retardant, leveling agent, peeling promoter, antioxidant, perfume, thermocrosslinker, adjustor of surface tension, chain transfer agent may be utilized together with the photopolymerization initiators set forth above. By suitably containing these components in the components of a pattern forming material, properties such as stability, photographic property, image-developing property, and film property of an intended pattern forming material can also be controlled.

—Plasticizer—

The plasticizer may be utilized to control the film property i.e. flexibility of the photosensitive layer.

Examples of the plasticizer include phthalic acid esters such as dimethylphthalate, dibutylphthalate, diisobutylphthalate, diheptylphthalate, dioctylphthalate, dicyclohexylphthalate, ditridecylphthalate, butylbenzylphthalate, diisodecylphthalate, diphenylphthalate, diallylphthalate, and octylcaprylphthalate; glycol esters such as triethyleneglycol diacetate, tetraethyleneglycol diacetate, dimethylglycose phthalate, ethylphthalyl ethylglycolate, methylphthalyl ethylglycolate, buthylphthalyl buthylglycolate, triethylene glycol dicaprylate; phosphoric acid esters such as tricresylphosphate and triphenylphosphate; amides such as 4-toluenesulfone amide, benzenesulfone amide, N-n-butylsulfone amide, and N-n-aceto amide; aliphatic dibasic acid esters such as diisobutyl adipate, dioctyl adipate, dimethyl sebacate, dibutyl sebacate, dioctyl sebacate, and dibutyl maleate; triethyl citrate, tributyl citrate, glycerin triacetyl ester, butyl laurate, 4,5-diepoxy-cyclohexane-1,2-dicarboxylic acid dioctyl; and glycols such as polyethylene glycol and polypropylene glycol.

The content of the plasticizer is preferably 0.1% by mass to 50% by mass relative to the total components of the photosensitive layer, more preferably 0.5% by mass to 40% by mass, and particularly preferably 1% by mass to 30% by mass.

—Coloring Agent—

The coloring agent may be utilized to provide visible images or to impart developing property on an exposed photosensitive layer.

Examples of the coloring agent include aminotriarylmethanes such as tris(4-dimethylaminophenyl)methane (leucocrystal violet), tris(4-diethylaminophenyl)methane, tris(4-dimethylamino-2-methylphenyl)methane, tris(4-diethylamino-2-methylphenyl)methane, bis(4-dibutylaminophenyl)-[4-(2-cyanoethyl) methylaminophenyl]methane, bis(4-dimethylaminophenyl)-2-quinolylmethane, and tris(4-dipropylaminophenyl) methane; aminoxanthenes such as 3,6-bis(diethylamino)-9-phenylxanthene and 3-amino-6-dimethylamino-2-methyl-9-(o-chlorophenyl)xanthene; aminothioxanthenes such as 3,6-bis(diethylamino)-9-(2-ethoxycarbonylphenyl)thioxanthene and 3,6-bis(dimethylamino)thioxanthene; amino-9,10-dihydroacridines such as 3,6-bis(diethylamino)-9,10-dihydro-9-phenylacridine and 3,6-bis(benzylamino)-9,10-dihydro-9-methylacridine; aminophenoxazines such as 3,7-bis (diethylamino)phenoxazines; aminophenothiazines such as 3,7-bis(ethylamino)phenothiazine; aminodihydrophenazines such as 3,7-bis(diethylamino)-5-hexyl-5,10-dihydrophenazine; aminophenylmethanes such as bis(4-dimethylaminophenyl)anilinomethane; aminohydrocinnamic acids such as 4-amino-4'-dimethylaminodiphenylamine and 4-amino-α,β-dicyanohydrocinnamate methyl ester; hydrazines such as 1-(2-naphthyl)-2-phenylhydrazine; amino-2,3-dihydroanthraquinones such as 1,4-bis(ethylamino)-2,3-dihydroanthraquinone; phenethylanilines such as N,N-diethyl-p-phenethylaniline; acyl derivatives of leuco dyes containing a basic NH group such as 10-acetyl-3,7-bis(dimethylamino)phenothiazine; leuco-like compounds with no oxidizable hydrogen and capable of being oxidized into colored compounds such as tris(4-diethylamino-2-tolyl)ethoxycarbonylmethane; leucoindigoid dyes; organic amines capable of being oxidized to colored forms as described in U.S. Pat. Nos. 3,042,515 and 3,042,517 such as 4,4'-ethylenediamine, diphenylamine, N,N-dimethylaniline, 4,4'-methylenediaminetriphenylamine, and N-vinylcarbazole. Among these coloring agents, triarylmethane compounds such as leucocrystal violet are preferable in particular.

In addition, it is known that the coloring agents set forth above may be combined with halogenated compounds in order to develop colors from the leuco compounds.

Examples of the halogenated compounds include halogenated hydrocarbons such as tetrabromocarbon, iodoform, ethylene bromide, methylene bromide, amyl bromide, isoamyl bromide, amyl iodide, isobutylene bromide, butyl iodide, diphenylmethyl bromide, hexachoromethane, 1,2-dibromoethane, 1,1,2,2-tetrabromoethane, 1,2-dibromo-1,1,2-trichloroethane, 1,2,3-tribromopropane, 1-bromo-4-chlorobutane, 1,2,3,4-tetrabromobutane, tetrachorocyclopropene, hexachlorocyclopentadiene, dibromocyclohexane, and 1,1,1-trichloro-2,2-bis(4-chlorophenyl)ethane; halogenated alcohol compounds such as 2,2,2-trichloroethanol, tribromoethanol, 1,3-dichoro-2-propanol, 1,1,1-trichloro-2-propanol, di(iodohexamethylene)aminoisopropanol, tribromo-tert-butyl alcohol, and 2,2,3-trichlorobutane-1,4-diol; halogenated carbonyl compounds such as 1,1-dichloroacetone, 1,3-dichloroacetone, hexachloroacetone, hexabromoacetone, 1,1,3,3-tetrachloroacetone, 1,1,1-trichloroacetone, 3,4-dibromo-2-butanone, and 1,4-dichloro-2-butanone-dibromocyclohexanone; halogenated ether compounds such as 2-bromoethyl methylether, 2-bromoethyl ethylether, di(2-bromoethyl)ether, and 1,2-dichloroethyl ethylether; halogenated ester compounds such as bromoethyl acetate, ethyl trichloroacetate, trichloroethyl trichloroacetate, homo- and co-polymers of 2,3-dibromopropyl acrylate, trichloroethyl dibromopropionate, and ethyl α,β-dichloroacrylate; halogenated amide compounds such as chloroacetamide, bromoacetamide, dichloroacetamide, trichloroacetamide, tribromoacetamide, trichloroethyltrichloroacetamide, 2-bromoisopropionamide, 2,2,2-trichloropropionamide, N-chlorosuccinimide, and N-bromosuccinimide; compounds containing a sulfur and/or phosphorus atom such as tribromomethyl phenylsulfone, 4-nitrophenyltribromo methylsulfone, 4-chlorophenyltribromo methylsulfone, tris(2,3-dibromopropyl)phosphate, and 2,4-bis(trichloromethyl)-6-phenyltriazole. The organic halogenated compounds are preferable those containing two or more halogen atoms that are attached to one carbon atom, and more preferably those containing three halogen atoms that are attached to one carbon atom. The organic halogenated compounds may be used alone or in combination with two or more. Among these halogenated compounds, tribromomethylphenylsulfone and 2,4-bis(trichloromethyl)-6-phenyltriazole are preferable.

The content of the coloring agent is preferably 0.01% by mass to 20% by mass relative to the total components of the photosensitive layer, more preferably 0.05% by mass to 10% by mass, and particularly preferably 0.1% by mass to 5% by mass. The content of the halogenated compound is preferably 0.001% by mass to 5% by mass relative to the total components of the photosensitive layer, and more preferably 0.005% by mass to 1% by mass.

—Colorant—

The colorant is not particularly limited and may be suitably selected in accordance with the intended use, and examples thereof include pigments or dyes known in the art such as red colors, green colors, blue colors, yellow colors, violet colors, magenta colors, cyan colors and black colors. Specific examples of the colorants include Victoria Pure Blue BO (C.I. 42595), auramine (C.I. 41000), Fat Black HB (C.I. 26150), Monolight Yellow GT (C.I. Pigment Yellow 12), Permanent Yellow GR (C.I. Pigment Yellow 17), Permanent Yellow HR(C.I. Pigment Yellow 83), Permanent Carmine FBB (C.I. Pigment Red 146), Hoster Balm Red ESB (C.I. Pigment Violet 19), Permanent Ruby FBH (C.I. Pigment Red 11), Fastel Pink B Spura (C.I. Pigment Red 81), Monastral Fast Blue (C.I. Pigment Blue 15), Monolight Fast Black B (C.I. Pigment Black 1), and carbon black.

Examples of the colorants suitably used for preparing color filters include C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, C.I. Pigment Blue 64, C.I. Pigment Yellow 139, C.I. Pigment Yellow 83, C.I. Pigment Violet 23, and the colorants described in [0138] to [0141] in Japanese Patent Application Laid-Open (JP-A) No. 2002-16275. The average particle diameter of the colorant particles is not particularly limited and may be suitably selected in accordance with the intended use. For example, the average particle diameter is preferably 5 μm or less, and more preferably 1 μm or less. When a color filter is prepared, the average particle diameter of the colorant particles is preferably 0.5 μm or less.

—Dye—

Into the photosensitive layer set forth above, a dye may be incorporated in order to add a color to the photosensitive layer to be hereinafter described so as to enhance handleability or to impart the storage stability of the pattern forming material.

Examples of the dye include Brilliant Green, eosin, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Metanil-Yellow, Thymolsulfophthalein, Xylenol Blue, Methyl Orange, Orange IV, diphenyl thiocarbazone, 2,7-dichlorofluorescein, Para Methyl Red, Congo Red, Benzopurpurine 4B, α-Naphthyl Red, Nile Blue 2B, Nile Blue A, phenacetarin, Methyl Violet, Malachite Green, Para Fuchsine, Oil Blue #603 (produced by Orient Chemical Industry Co., Ltd.), Rhodamine B, Rhodamine 6G, and Victoria Pure Blue BOH. Among these dyes, preferably are cation dyes such as oxalate of Malachite Green and sulfate of Malachite Green. The pair anion of the cation dyes may be residues of organic acid or inorganic acid such as bromic acid, iodic acid, sulfuric acid, phosphoric acid, oxalic acid, methane sulfonic acid, and toluene sulfonic acid.

The content of the dye is preferably 0.001% by mass to 10% by mass relative to the total components of the photosensitive layer, more preferably 0.01% by mass to 5% by mass, and particularly preferably 0.1% by mass to 2% by mass.

—Adhesion Promoter—

In order to enhance the adhesion between layers or between the pattern forming material and the substrate, a so-called adhesion promoter known in the art may be employed therebetween.

Examples of the adhesion promoters set forth above include those described in JP-A Nos. 5-11439, 5-341532, and 6-43638; specific examples of adhesion promoters include benzimidazole, benzoxazole, benzthiazole, 2-mercaptobenzimidazole, 2-mercaptobenzoxazole, 2-mercaptobenzthiazole, 3-morpholinomethyl-1-phenyl-triazole-2-thion, 3-morpholinomethyl-5-phenyl-oxadiazole-2-thion, 5-amino-3-morpholinomethyl-thiadiazole-2-thion, 2-mercapto-5-methylthio-thiadiazole, triazole, tetrazole, benzotriazole, carboxybenzotriazole, benzotriazole containing an amino group, and silane coupling agents.

The content of the adhesion promoter is preferably 0.001% by mass to 20% by mass relative to the total components of the photosensitive layer, more preferably 0.01% by mass to 10% by mass, and particularly preferably 0.1% by mass to 5% by mass.

The photosensitive layer may contain, as described in "Light Sensitive Systems, chapter 5th, by J. Curser", organic sulfur compounds, peroxides, redox compounds, azo or diazo compounds, photoreductive dyes, or organic halogen compounds.

Examples of the organic sulfur compounds include di-n-butyldisulfide, dibenzyldisulfide, 2-mercaptobenzthiazole, 2-mercaptobenzoxazole, thiophenol, ethyl trichloromethane sulfonate, and 2-mercaptobenzimidazole.

Examples of the peroxides include di-t-butyl peroxide, benzoyl peroxide, and methylethylketone peroxide.

The redox compounds set forth above are a combination of a peroxide and a reducer such as a combination of persulfate ion and ferrous ion, and a combination of ferric ion and peroxide.

Examples of azo or diazo compounds set forth above include diazoniums such as $\alpha,\alpha'$-azobis-isobutylonitrile, 2-azobis-2-methylbutylonitrile, and 4-aminodiphenylamine.

Examples of the photoreductive dye set forth above include Rose Bengale, Erythrosine, Eosine, acriflavine, riboflavin, and thionine.

—Surfactant—

In order to further prevent surface nonuniformity generated in producing the pattern forming material of the present invention, conventional surfactants may be employed.

The surfactant may be properly selected from anionic surfactants, cationic surfactants, nonionic surfactants, amphoteric surfactants, and fluorine-containing surfactant.

The content of the surfactant is preferably 0.001% by mass to 10% by mass relative to the solid content of the photosensitive resin composition.

When the content is less than 0.001% by mass, the effect to prevent the surface nonuniformity may be insufficient, and when the content is more than 10% by mass, the adhesion ability may be degraded.

In addition, besides the surfactants set forth above, as the fluorine-containing surfactant, a polymer surfactant having carbon chains of 3 to 20, containing fluorine atoms in an amount of 40% by mass or more and having a copolymerized component of acrylate or methacrylate containing a fluoroaliphatic group of which the hydrogen atoms bonded on the terminal carbon atom to the third of the carbon atom are substituted with fluorine atoms.

The thickness of the photosensitive layer is not particularly limited and may be suitably selected in accordance with the intended use. For example, the thickness is preferably 1 µm to 100 µm, more preferably 2 µm to 50 µm, and particularly preferably 4 µm to 30 µm. The photosensitive layer may be formed with two or more layers.

<Other Layers>

The other layers are not particularly limited and may be suitably selected in accordance with the intended use. Examples thereof include cushion layer, barrier layer, peel-off layer, adhesive layer, light absorption layer, and surface protective layer. The pattern forming material may have a single layer or two or more layers selected from these layers.

Preferably, after a light beam from a light irradiation unit is modulated by a light modulating unit having "n" imaging portions that can receive the light beam from the light irradiating unit and can output the light beam, the photosensitive layer in the pattern forming material of the present invention is exposed with the light beam passed through a microlens array having an array of microlenses each having a non-spherical surface capable of compensating the aberration due to distortion at irradiating surface of an imaging portion in the light modulating unit. Details of the light irradiation unit, the imaging portion, the light modulating unit, the non-spherical surface, the microlenses, and the microlens array will be described below.

It is preferable that the pattern forming material is formed in an elongated sheet and wound to a cylindrical core tube in a roll shape for storage. The length of the elongated pattern forming material is not particularly limited and may be suitably selected from 10 m to 20,000 m, for example. The pattern forming material may be subjected to slit processing in a user-friendly manner such that the elongated pattern forming material of 100 m to 1,000 m is rolled in a roll shape. In this case, it is preferable that the pattern forming material is wound to a cylindrical core tube such that the support constitutes the outermost of the roll. Further, the rolled pattern forming material may be slit in a sheet-like shape. During storage, preferably a separator which is moisture proof and contains a drying agent is arranged at the end faces from the perspective of protection of the end faces and preventing edge fusion; and a material of lower moisture vapor permeability is preferably used for packaging.

[Method for Producing Pattern Forming Material]

The pattern forming material can be produced, for example, as follows.

First, materials to be contained in the photosensitive layer are dissolved, emulsified or dispersed in water or a solvent to prepare a photosensitive resin composition solution.

The photosensitive resin composition solution is not particularly limited and may be suitably selected in accordance with the intended use. Examples thereof include alcohols such as methanol, ethanol, n-propanol, isopropanol, n-butanol, sec-butanol, and n-hexanol; ketones such as acetone, methylethylketone, methyl isobutyl ketone, cyclohexanon, and diisobutyl ketone; esters such as ethyl acetate, butyl acetate, n-amyl-acetate, methyl sulfate, ethyl propionate, dimethyl phthalate, ethyl benzoate, and methoxypropyl acetate; aromatic hydrocarbons such as toluene, xylene, benzene, and ethyl benzene; halogenated hydrocarbons such as carbon tetrachloride, trichloroethylene, chloroform, 1,1,1-trichloroethane, methylene chloride, and monochlorobenzene; ethers such as tetrahydrofuran, diethyl ether, ethylene glycol monomethyl ether, ethylene glycol monoethyl ether, and 1-methoxy-2-propanol; dimethylformamide, dimethylacetoamide, dimethylsulfoxide, and sulfolane. Each of these may be used alone or in combination with two or more. Further, conventional surfactants may be added thereto.

Next, the photosensitive resin composition solution is applied over a surface of the support, the support surface is dried to form a photosensitive layer on the support, and the protective film is laminated on the photosensitive layer, thereby a pattern forming material can be produced.

The coating method of the photosensitive resin composition solution is not particularly limited and may be suitably selected in accordance with the intended use. Examples of the method include various coating methods such as spraying method, roll coating method, rotation coating method, slit-coating method, extrusion coating method, curtain-coating method, dye-coating method, gravure coating method, wire-bar coating method, and knife-coating method.

The drying conditions vary depending on the used components, type of solvent, usage ratio thereof and the like, however, these surfaces are typically dried at 60° C. to 110° C. for about 30 seconds to 15 minutes.

The pattern forming material of the present invention is advantageous in that the pattern forming material can be exposed with a light beam of a small optical energy amount because the pattern forming material enables to prevent photosensitivity of the photosensitive layer from decreasing in photosensitivity of the photosensitive layer, and the processing speed is increased because of increased exposure speed.

Since the pattern forming material of the present invention is capable of suppressing generation of wrinkles and static electric charge on a substrate in a lamination step of laminating the pattern forming material on the substrate as well as capable of forming a fine and precise pattern, the pattern forming material can be preferably used in forming various patterns, in forming permanent patterns such as interconnection pattern, in producing members having a liquid crystal structure such as color filters, column members, rib members, spacers, and partition members, and in forming patterns such as hologram, micromachine, and proof. The pattern forming material is particularly preferably used in the pattern forming process and the pattern forming apparatus of the present invention.

(Pattern Forming Apparatus and Pattern Forming Process)

The pattern forming apparatus is provided with the pattern forming material of the present invention and is equipped with at least a light irradiation unit and a light modulating unit.

The pattern forming process of the present invention includes at least an exposure step and other suitably selected steps.

The pattern forming apparatus of the present invention will be clearly explained hereinafter through the descriptions of the pattern forming process of the present invention.

[Exposure Step]

The exposure step is a step in which the photosensitive layer in the pattern forming material of the present invention is exposed. The pattern forming material of the present invention is as described above.

The target of the exposure is not particularly limited and may be suitably selected in accordance with the intended use as long as the target is a photosensitive layer in the pattern forming material. For example, it is preferred to expose a surface of a laminate of which the pattern forming material is formed on a substrate surface.

Material of the substrate is not particularly limited and may be suitably selected in accordance with the intended use. For example, the substrate may be suitably selected from among those having a high surface planality to those having a concavoconvex surface. A sheet-like substrate is preferably used. Specific examples thereof include conventional substrates for producing printed wiring board (such as copper clad laminate), glass plates (soda glass plates, etc.), synthetic resin films, paper, and metal plates.

The layer configuration of the laminate is not particularly limited and may be suitably selected in accordance with the intended use. For examples, the photosensitive laminate preferably has a layer configuration in which the substrate, the photosensitive layer, the barrier layer, and the cushion layer, and the support are formed in this order.

The process for forming a laminate is not particularly limited and may be suitably selected in accordance with the intended use. It is preferred that the pattern forming material is formed on a surface of the substrate while performing at least any one of heating and pressurizing the pattern forming material to thereby form a laminate on the substrate surface.

The heating temperature is not particularly limited and may be suitably selected in accordance with the intended use.

For example, the heating temperature is preferably 15° C. to 180° C., and more preferably 60° C. to 140° C.

The pressure at the pressurization is not particularly limited and may be suitably selected in accordance with the intended use. For example, the pressure is preferably 0.1 MPa to 1.0 MPa, and more preferably 0.2 MPa to 0.8 MPa.

The apparatus used to perform any one of heating and pressurizing is not particularly limited and may be suitably selected in accordance with the intended use. Preferred examples thereof include laminators and vacuum laminators.

The apparatus used to perform any one of heating and pressurizing is not particularly limited and may be suitably selected in accordance with the intended use. Preferred examples thereof include laminators (for example, VP-II manufactured by Taisei Laminator Co., Ltd.).

The exposure is not particularly limited and may be suitably selected in accordance with the intended use, and digital exposure and analog exposure are exemplified. Among them, digital exposure is preferable.

The digital exposure is not particularly limited and may be suitably selected in accordance with the intended use. For example, it is preferred that control signals are generated based on the information for forming a pattern to be formed and the laminate is digitally exposed using a light beam which is modulated according to the control signals.

The digital exposure unit is not particularly limited and may be suitably selected in accordance with the intended use. Examples of the digital exposure unit include a light irradiation unit configured to irradiate a target with a light, and a light modulating unit configured to modulate a light applied from the light irradiation unit based on the information of a pattern to be formed.

<Light Modulating Unit>

The light modulating unit is not particularly limited and may be suitably selected in accordance with the intended use. For example, the light modulating unit preferably has "n" imaging portions.

The light modulating unit having "n" imaging portions is not particularly limited and may be suitably selected in accordance with the intended use. Preferable examples of such a light modulating unit include a spatial light modulator.

Specific examples of the spatial light modulator include digital micromirror devices (DMDs), spatial light modulators (SLM) of micro electro mechanical system type (MEMS), PLZT elements or optical elements which modulate transmitted light by the effect of electrooptics, and liquid crystal shatters (FLC); among these, the DMDs are preferable.

The light modulating unit preferably has a pattern signal generating unit configured to generate control signals based on the information of a pattern to be formed. In this case, the light modulating unit modulates light beam according to the control signals generated by the pattern signal generating unit.

The control signals are not particularly limited and may be suitably selected in accordance with the intended use. Preferred examples of the control signals are digital signals.

The light modulating unit will be specifically explained with reference to figures in the following.

DMD 50 is a mirror device that has lattice arrays of many micromirrors 62, e.g. 1024×768, on SRAM cell or memory cell 60 as shown in FIG. 1, wherein each of the micromirrors serves as an imaging portion. At the upper most portion of the each imaging portion, micromirror 62 is supported by a pillar. A material having a higher reflectivity such as aluminum is vapor deposited on the surface of the micromirror. The reflectivity of the micromirrors 62 is 90% or more; the array pitches in longitudinal and width directions are respectively 13.7 µm, for example. Further, SRAM cell 60 of a silicon gate CMOS produced by conventional semiconductor memory production processes is disposed just below each micromirror 62 through a pillar containing a hinge and yoke. The mirror device is entirely constructed as a monolithic body.

Figure 2A:
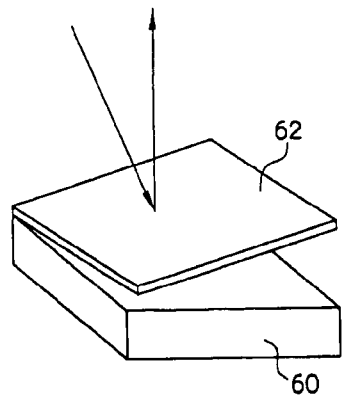
FIG. 2A is a view that explains exemplarily the motion of the DMD.
Figure 2B:
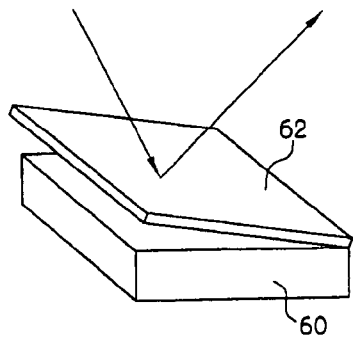
FIG. 2B is a view that explains exemplarily the motion of the DMD, similarly as shown in FIG. 2A.

When a digital signal is written into SRAM cell 60 of DMD 50, micromirror 62 supported by a pillar is inclined toward the substrate, on which DMD 50 is disposed, within ±alpha degrees e.g. 12 degrees around the diagonal as the rotating axis. FIG. 2A indicates the condition that micromirror 62 is inclined +alpha degrees at on state, FIG. 2B indicates the condition that micromirror 62 is inclined −alpha degrees at off state. Therefore, each incident laser beam B on DMD 50 is reflected depending on each inclined direction of micromirrors 62 by controlling each inclined angle of micromirrors 62 in imaging portions of DMD 50 depending on pattern information as shown in FIG. 1.

FIG. 1 exemplarily shows a magnified condition of DMD50 partly in which micromirrors 62 are controlled at an angel of −alpha degrees or +alpha degrees. Controller 302 (see FIG. 12) connected to DMD 50 carries out on-off controls of the respective micromirrors 62. An optical absorber (not shown) is disposed on the way of laser beam B reflected by micromirrors 62 at off state.

Preferably, DMD 50 is slightly inclined in the condition that the shorter side presents a pre-determined angle, e.g. 0.1 degrees to 5 degrees against the sub-scanning direction. FIG. 3A shows scanning traces of reflected laser image or exposing beam 53 by the respective micromirrors when DMD 50 is not inclined; FIG. 3B shows scanning traces of reflected laser image or exposing beam 53 by the respective micromirrors when DMD 50 is inclined.

In DMD 50, many micromirrors, e.g. 1024, are disposed in the longer direction to form one array, and many arrays, e.g. 756, are disposed in the shorter direction. Thus, by means of inclining DMD 50 as shown in FIG. 3B, the pitch $P_1$ of scanning traces or lines of exposing beam 53 from each micromirror may be reduced than the pitch $P_2$ of scanning traces or lines of exposing beam 53 without inclining DMD 50, thereby the resolution may be improved remarkably. On the other hand, the inclined angle of DMD 50 is small, therefore, the scanning direction $W_2$ when DMD 50 is inclined and the scanning direction $W_1$ when DMD 50 is not inclined are approximately the same.

The method to accelerate the modulation rate of the light modulating unit (hereinafter referring to as "high rate modulation") will be explained in the following.

Preferably, the light modulating unit is able to control any imaging portions of less than "n" disposed successively among the imaging portions depending on the pattern information ("n": an integer of 2 or more). Since there exist a limit in the data processing rate of the light modulating unit and the modulation rate per one line is defined in proportion to the utilized imaging portion number, the modulation rate per one line may be increased by utilizing only the imaging portions of less than "n" disposed successively.

The high rate modulation will be explained with reference to figures in the following.

When laser beam B is applied from fiber array laser source 66 to DMD 50, the reflected laser beam, at the micromirrors of DMD 50 being on state, is imaged on pattern forming material 150 by lens systems 54 and 58. In this way, the laser beam applied from the fiber array laser source is turned into on or off for each imaging portion, and the pattern forming material 150 is exposed in approximately the same number of imaging portion units or exposing areas 168 as the imaging portions utilized in DMD 50. In addition, when the pattern forming material 150 is conveyed with stage 152 at a constant rate, the pattern forming material 150 is sub-scanned to the direction opposite to the stage moving direction by scanner 162, thus exposed regions 170 of band shape are formed correspondingly to the respective exposing heads 166.

In this example, micromirrors are disposed on DMD 50 as 1,024 arrays in the main-scanning direction and 768 arrays in the sub-scanning direction as shown in FIGS. 4A and 4B. Among these micromirrors, a part of micromirrors, e.g. 1,024×256, may be controlled and driven by the controller 302 (see FIG. 12).

In such control, the micromirror arrays disposed at the central area of DMD 50 may be employed as shown in FIG. 4A; alternatively, the micromirror arrays disposed at the edge portion of DMD 50 may be employed as shown in FIG. 4B. In addition, when micromirrors are partly damaged, the utilized micromirrors may be properly altered depending on the situations such that micromirrors with no damage are utilized.

Since there exist a limit in the data processing rate of DMD 50 and the modulation rate per one line is defined in proportion to the utilized imaging portion number, partial utilization of micromirror arrays leads to higher modulation rate per one line. Further, when exposing is carried out by moving continuously the exposing head relative to the exposing surface, the entire imaging portions are not necessarily required in the sub-scanning direction.

When the sub-scanning of pattern forming material 150 is completed by scanner 162, and the rear end of the pattern forming material 150 is detected by sensor 164, the stage 152 returns to the original site at the most upstream of gate 160 along guide 158, and the stage 152 is moved again from upstream to downstream of the gate 160 along guide 158 at a constant rate.

For example, when 384 arrays are utilized among the 768 arrays of micromirrors, the modulation rate may be enhanced two times per one line as compared to the modulation rate when utilizing all of 768 arrays; further, when 256 arrays are utilized among the 768 arrays of micromirrors, the modulation rate may be enhanced three times as compared to the modulation rate when utilizing all of 768 arrays.

As explained above, when DMD 50 is provided with 1,024 micromirror arrays in the main-scanning direction and 768 micromirror arrays in the sub-scanning direction, controlling and driving of partial micromirror arrays may lead to higher modulation rate per one line compared to the modulation rate in the case of controlling and driving of entire micromirror arrays.

In addition to the controlling and driving of partial micromirror arrays, elongated DMD on which many micromirrors are disposed on a substrate in planar arrays may similarly increase the modulation rate when the each angle of reflected surface is changeable depending on the various controlling signals, and the substrate is longer in a specific direction than its perpendicular direction.

Preferably, the exposing is performed while moving relatively the exposing laser and the thermosensitive layer; more preferably, the exposing is combined with the high rate modulation described above, thereby exposing may be carried out with higher rate in a shorter period.

Figure 5:
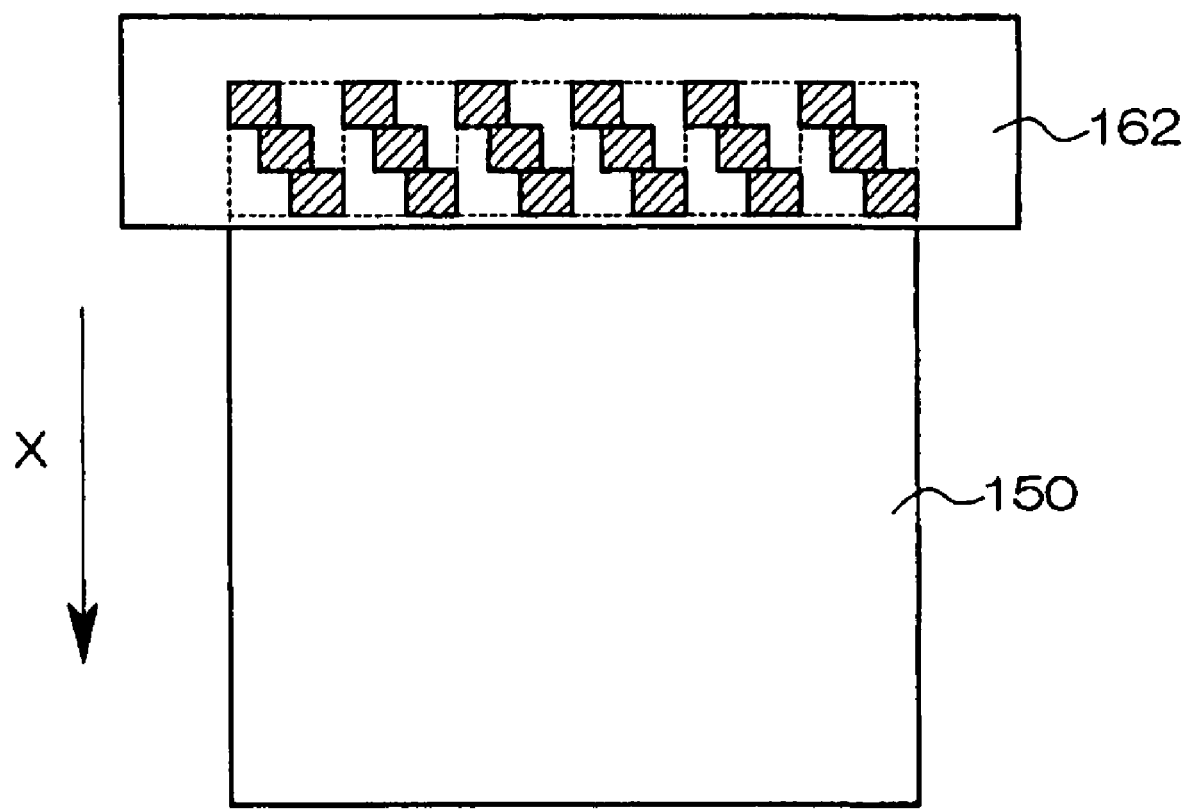
FIG. 5 is an exemplary plan view that explains a way to expose a pattern forming material in one scanning by means of a scanner.
Figure 6A:
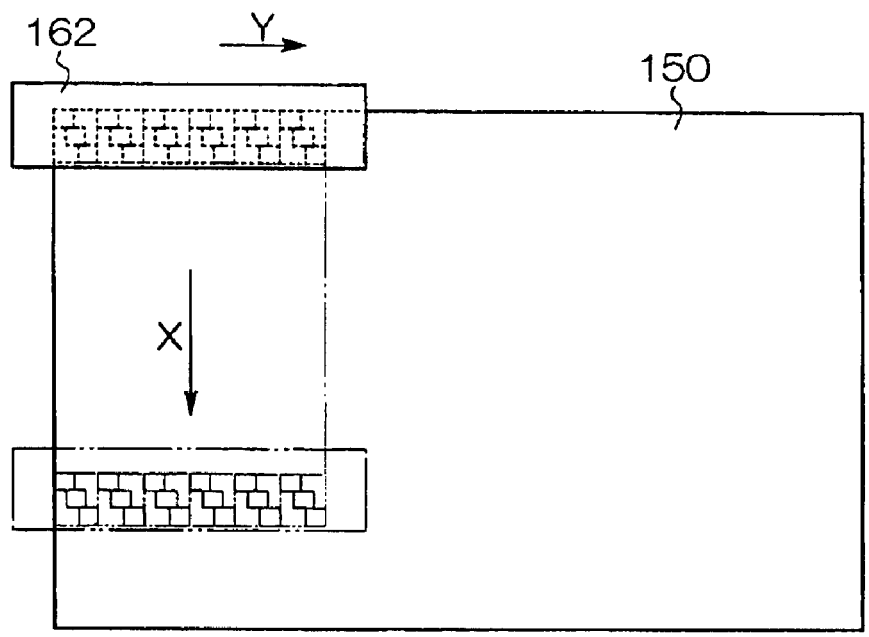
FIG. 6A is an exemplary plan view that explains a way to expose a pattern forming material in plural scannings by means of a scanner.
Figure 6B:
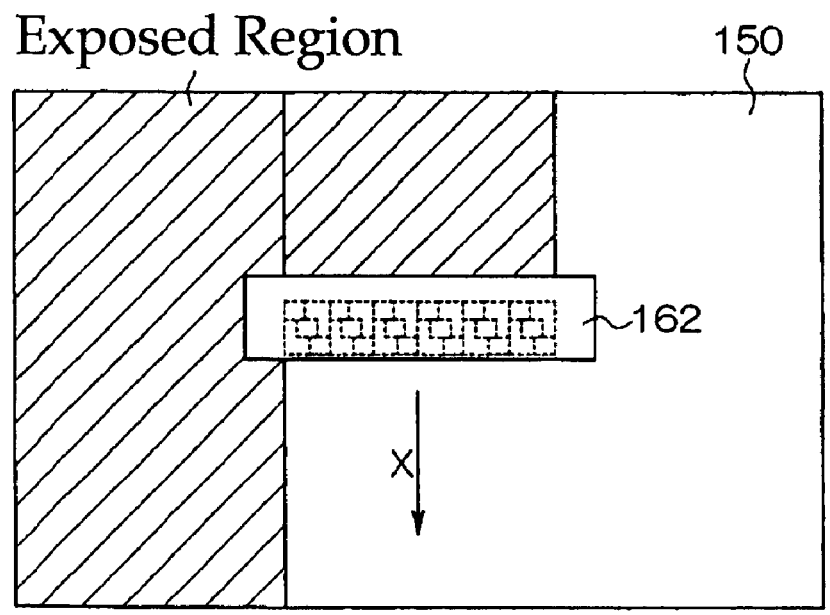
FIG. 6B is another exemplary plan view that explains a way to expose a pattern forming material in plural scannings by means of a scanner, similarly as shown in FIG. 6A.
Figure 7:
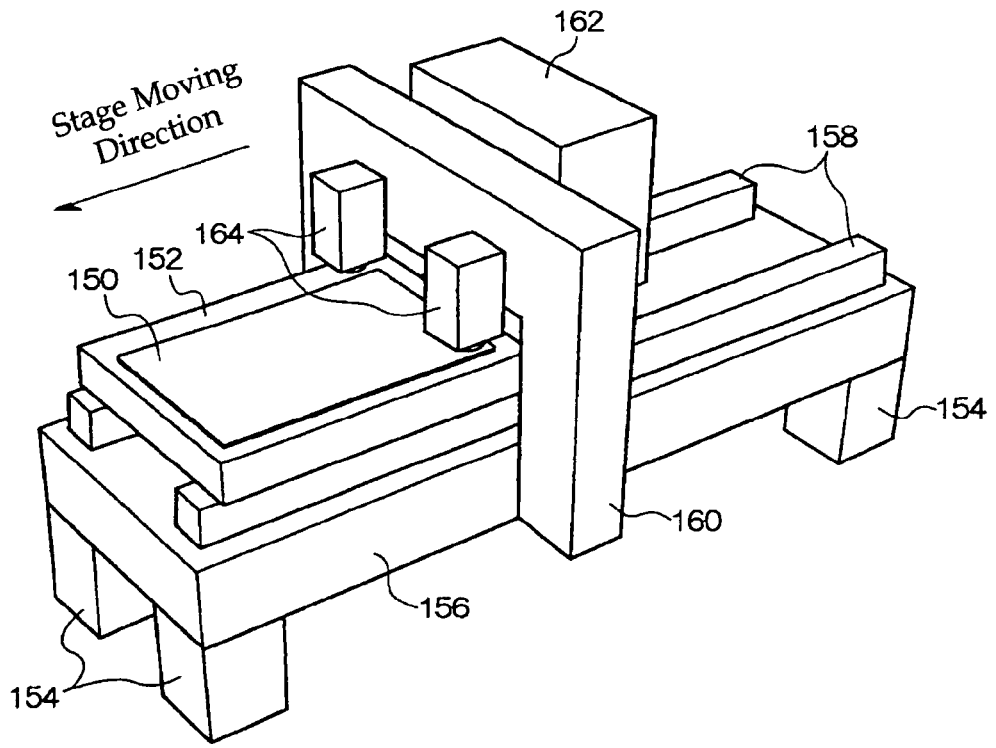
FIG. 7 is a schematic perspective view that shows exemplarily appearance of a pattern forming apparatus.

As shown in FIG. 5, pattern forming material 150 may be exposed on the entire surface by one scanning of scanner 162 in X direction; alternatively, as shown in FIGS. 6A and 6B, pattern forming material 150 may be exposed on the entire surface by repeated plural exposing such that pattern forming material 150 is scanned in X direction by scanner 162, then the scanner 162 is moved one step in Y direction, followed by scanning in X direction. In this example, scanner 162 is provided with eighteen exposing heads 166; each exposing head contains a laser source and the light modulating unit.

The exposure is performed on a partial region of the photosensitive layer, thereby the partial region is hardened, followed by unhardened regions other than the partial hardened region are removed in developing step as set forth later, thus a pattern is formed.

A pattern forming apparatus including the light modulating unit will be exemplarily explained with reference to figures in the following.

The pattern forming apparatus containing the light modulating unit is equipped with flat stage 152 that absorbs and sustains sheet-like pattern forming material 150 on the surface.

On the upper surface of thick plate table 156 supported by four legs 154, two guides 158 are disposed that extend along the stage moving direction. Stage 152 is disposed such that the elongated direction faces the stage moving direction, and supported by guide 158 in reciprocally movable manner. A driving device is equipped with the pattern forming apparatus (not shown) so as to drive stage 152 along guide 158.

At the middle of the table 156, gate 160 is provided such that gate 160 strides the path of stage 152. The respective ends of the gate 160 are fixed to both sides of the table 156. Scanner 162 is provided at one side of gate 160, plural (e.g. two) detecting sensors 164 are provided at the opposite side of gate 160 in order to detect the front and rear ends of pattern forming material 150. Scanner 162 and detecting sensor 164 are mounted on gate 160 respectively and disposed stationarily above the path of stage 152. Scanner 162 and detecting sensor 164 are connected to a controller (not shown) that controls them.

Figure 8:
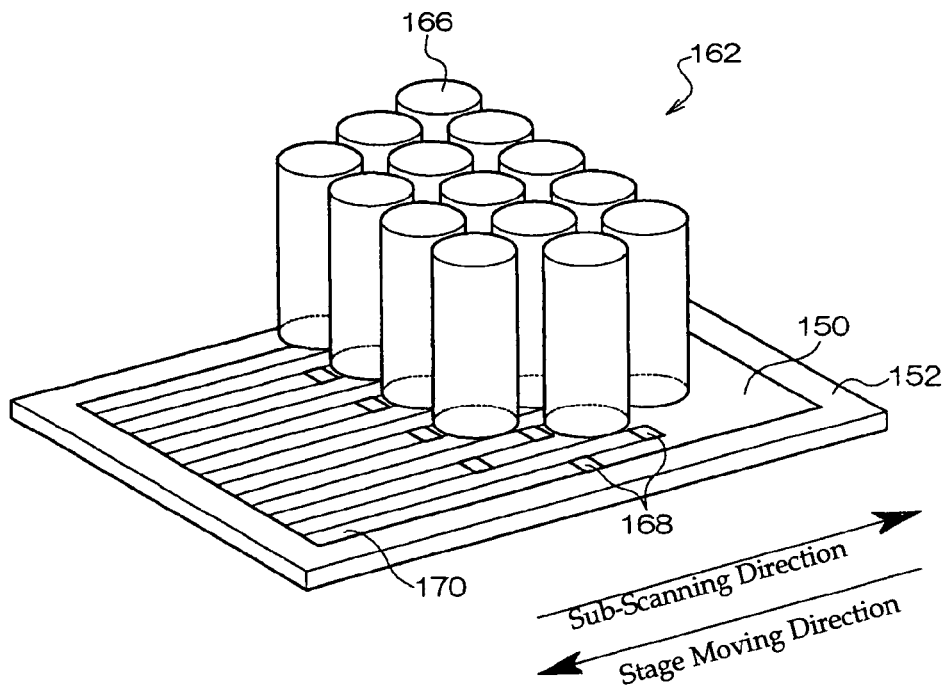
FIG. 8 is a schematic perspective view that shows exemplarily a scanner construction of a pattern forming apparatus.
Figure 9A:
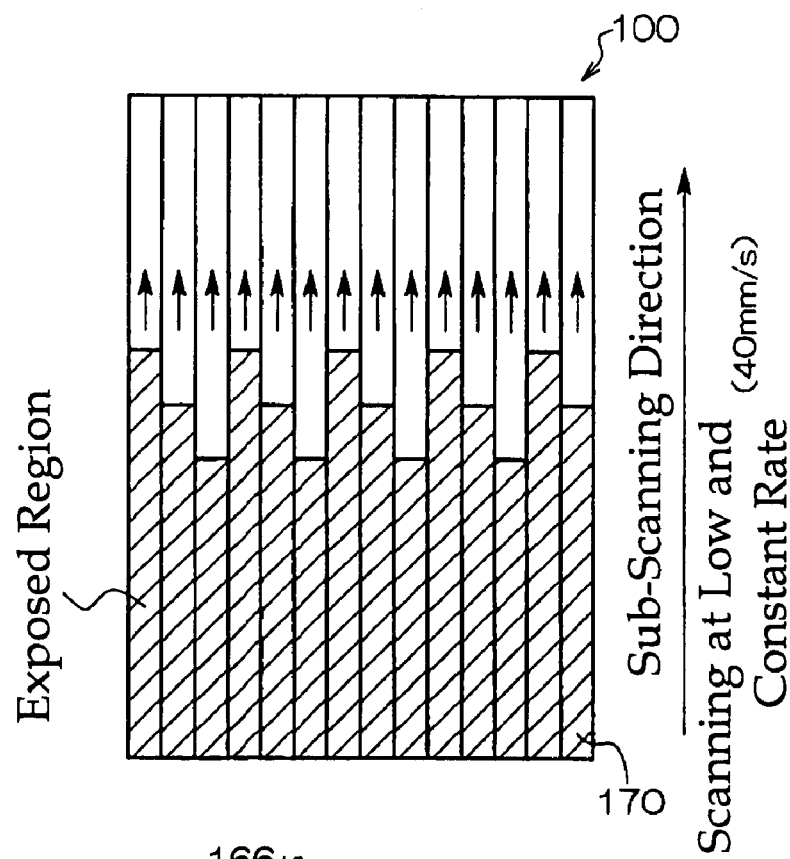
FIG. 9A is an exemplary plan view that shows exposed regions formed on a pattern forming material.
Figure 9B:
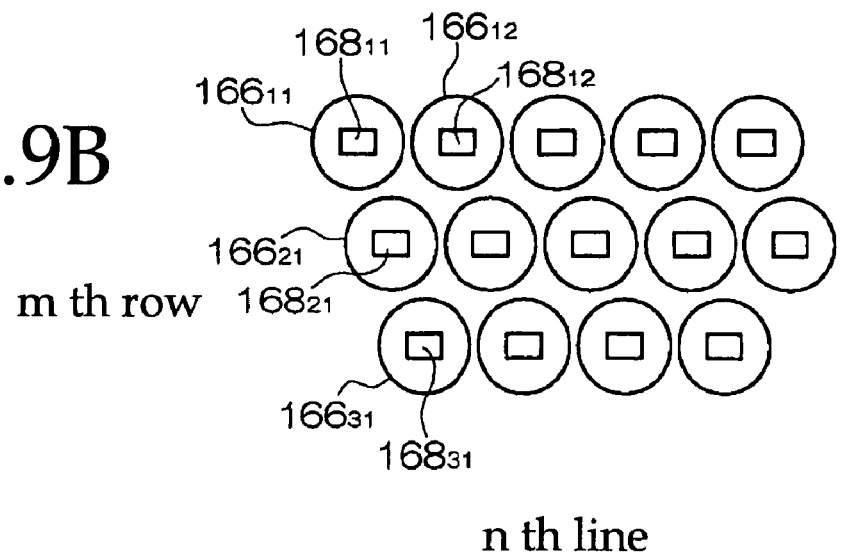
FIG. 9B is an exemplary plan view that shows an alignment of regions exposed by respective exposing heads.

As shown in FIGS. 8 and 9B, scanner 162 contains plural (e.g. fourteen) exposing heads 166 that are arrayed in substantially matrix of "m rows×n lines" (e.g. three×five). In this example, four exposing heads 166 are disposed at the third line considering the width of pattern forming material 150. The specific exposing head at "m" th row and "n" th line is expressed as exposing head $166_{mn}$ hereinafter.

The exposing area 168 formed by exposing head 166 is rectangular having the shorter side in the sub-scanning direction. Therefore, exposed areas 170 are formed on pattern forming material 150 of a band shape that corresponds to the respective exposing heads 166 along with the movement of stage 152. The specific exposing area corresponding to the exposing head at "m" th row and "n" th line is expressed as exposing area $168_{mn}$ hereinafter.

As shown in FIGS. 9A and 9B, each of the exposing heads at each line is disposed with a space in the line direction so that exposed regions 170 of band shape are arranged without space in the perpendicular direction to the sub-scanning direction (space: (longer side of exposing area)×natural number; two times in this example). Therefore, the non-exposing area between exposing areas $168_{11}$ and $168_{12}$ at the first raw can be exposed by exposing area $168_{21}$ of the second raw and exposing area $168_{31}$ of the third raw.

Figure 10:
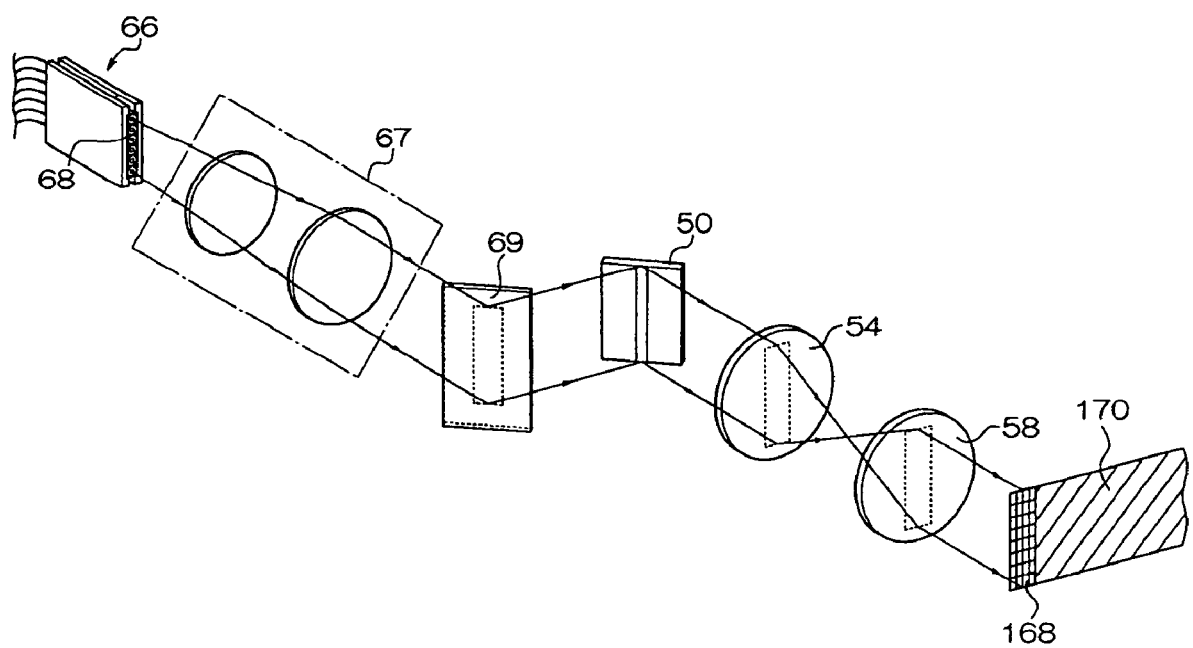
FIG. 10 is a schematic perspective view that shows exemplarily an exposing head including a light modulating unit.
Figure 11:
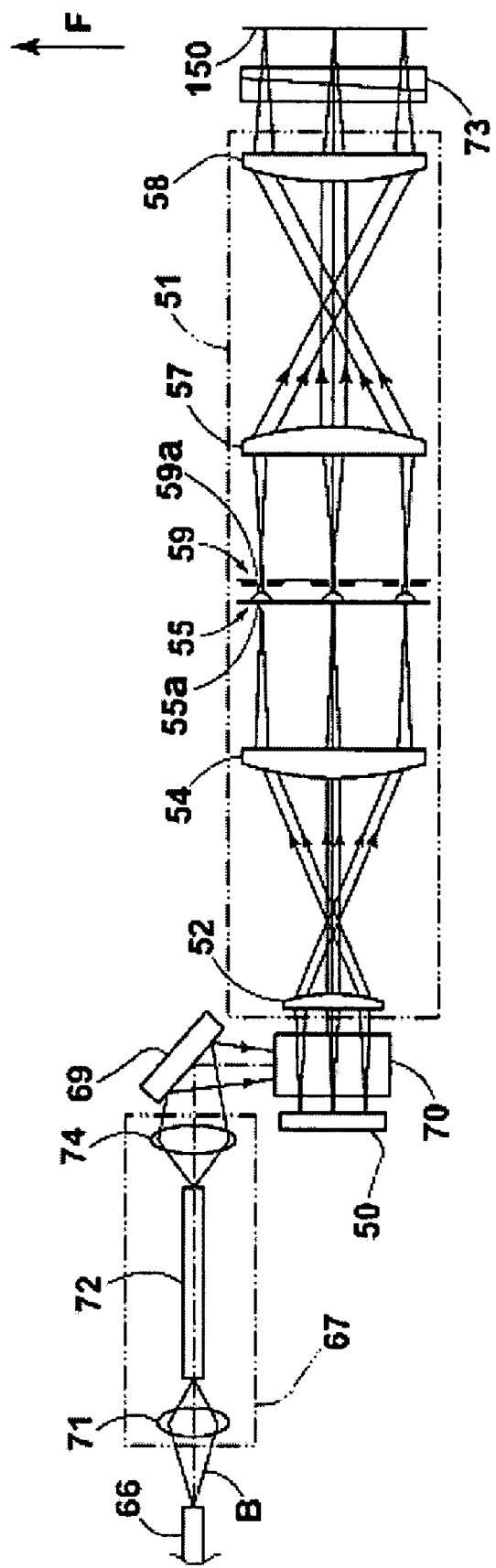
FIG. 11 is an exemplary cross sectional view that shows the construction of the exposing head shown in FIG. 10 in the sub-scanning direction along the optical axis.

Each of exposing heads $166_{11}$ to $166_{mn}$ is provided with a digital micromirror device (DMD) 50 (manufactured by US Texas Instruments Inc.) as a light modulating unit or spatial light modulator that modulates the incident laser beam depending on the pattern information as shown in FIGS. 10 and 11. Each DMD 50 is connected to controller 302 that contains a data processing part and a mirror controlling part as shown in FIG. 12. The data processing part of controller 302 generates controlling signals to control and drive the respective micromirrors in the areas to be controlled for the respective exposing heads 166 based on the input pattern information. The area to be controlled will be explained later. The mirror driving-controlling part controls the reflective surface angle of each micromirror of DMD 50 per each exposing head 166 based on the control signals generated at the pattern information processing part. The control of the reflective surface angle will be explained later.

At the incident laser side of DMD 50, fiber array laser source 66 that is equipped with a laser irradiating part where irradiating ends or emitting sites of optical fibers are arranged in an array along the direction corresponding with the longer side of exposing area 168, lens system 67 that compensates the laser beam emitted from fiber array laser source 66 and collects it on the DMD, and mirrors 69 that reflect laser beam through lens system 67 toward DMD 50 are disposed in this order. FIG. 10 schematically shows lens system 67.

Lens system 67 is provided with collective lens 71 that collects laser beam B for illumination from fiber array laser source 66, rod-like optical integrator 72 (hereinafter, referring to as "rod integrator") inserted on the optical path of the laser passed through collective lens 71, and image lens 74 disposed in front of rod integrator 72 or the side of mirror 69, as shown FIG. 11. Collective lens 71, rod integrator 72, and image lens 74 make the laser beam applied from fiber array laser source 66 enter into DMD 50 as a luminous flux of approximately parallel beam with uniform intensity in the cross section. The shape and effect of the rod integrator will be explained in detail later.

Laser beam B irradiated from lens system 67 is reflected by mirror 69, and is irradiated to DMD 50 through a total internal reflection prism 70 (not shown in FIG. 10).

At the reflecting side of DMD 50, imaging optical system 51 is disposed which images laser beam B reflected by DMD 50 onto pattern forming material 150. The imaging optical system 51 is equipped with the first imaging optical system of lens systems 52, 54, the second imaging optical system of lens systems 57, 58, and microlens array 55 and aperture array 59 interposed between these imaging systems as shown in FIG. 11.

Arranging two-dimensionally many microlenses 55a each corresponding to the respective imaging portions of DMD 50 forms microlens array 55. In this example, micromirrors of 1,024 rows×256 lines among 1,024 rows×768 lines of DMD 50 are driven, therefore, 1,024 rows×256 lines of microlenses are disposed correspondingly. The pitch of disposed microlenses 55a is 41 μm in both of raw and line directions. Microlenses 55a have a focal length of 0.19 mm and a numerical aperture (NA) of 0.11 for example, and are formed of optical glass BK7. The shape of microlenses will be explained later. The beam diameter of laser beam B is 41 μm at the site of microlens 55a.

Aperture array 59 is formed of many apertures 59a each corresponding to the respective microlenses 55a of microlens array 55. The diameter of aperture 59a is 10 μm, for example.

The first imaging system forms the image of DMD 50 on microlens array 55 as a three times magnified image. The second imaging system forms and projects the image through microlens array 55 on pattern forming material 150 as a 1.6 times magnified image. Therefore, the image by DMD 50 is formed and projected on pattern forming material 150 as a 4.8 times magnified image.

Prism pair 73 is installed between the second imaging system and pattern forming material 150; through the operation to move up and down the prism pair 73, the image pint may be adjusted on the image forming material 150. In FIG. 11, pattern forming material 150 is fed to the direction of arrow F as sub-scanning.

The imaging portions are not particularly limited and may be properly selected in accordance with the intended use, provided that the imaging portions can receive the laser beam from the laser source or irradiating unit and can output the laser beam; for example, the imaging portions are pixels when the pattern formed by the pattern forming process according to the present invention is an image pattern, alternatively the imaging portions are micromirrors when the light modulating unit contains a DMD.

The number of imaging portions ("n") contained in the light modulating unit may be properly selected in accordance with the intended use.

The alignment of imaging portions in the light modulating unit may be properly selected in accordance with the intended use; preferably, the imaging portions are arranged two dimensionally, more preferably are arranged into a lattice pattern.

<Light Irradiating Unit>

The light irradiation unit may be properly selected in accordance with the intended use; examples thereof include an extremely high pressure mercury lamp, xenon lamp, carbon arc lamp, halogen lamp, fluorescent tube, LED, semiconductor laser, and the other conventional laser source, and also combination of these units. Among these units, a unit capable of irradiating two or more types of light or laser beam is preferable.

Examples of the light or laser beam emitted from the optical irradiating unit include electromagnetic rays, UV-rays, visible light, electron beam, X-ray, laser beam, each of which penetrates the substrate and activates photopolymerization initiators and sensitizers to be used. Among these, laser beam is preferable, and those containing two or more types of light (hereinafter, sometimes referring to as "combined laser") are more preferable. When the support is first exfoliated from the photosensitive layer and then is irradiated with light or laser beam similarly to the above can be also used.

The wavelength of the UV-rays and the visual light is preferably 300 nm to 1,500 nm, more preferably 320 nm to 800 nm, and most preferably 330 nm to 650 nm.

The wavelength of the laser beam is preferably 200 nm to 1,500 nm, more preferably 300 nm to 800 nm, still more preferably 330 nm to 500 nm, and most preferably 400 nm to 410 nm. Specifically, a laser beam having a wavelength of 405 nm output from a GaN semiconductor laser is the most preferable.

As for the unit to irradiate the combined laser, such a unit is preferably exemplified which contains plural laser irradiating devices, a multimode optical fiber, and a collecting optical system that collects respective laser beams and connect them to the multimode optical fiber.

The unit to irradiate combined laser or the fiber array laser source will be explained with reference to figures in the following.

Figure 27A:
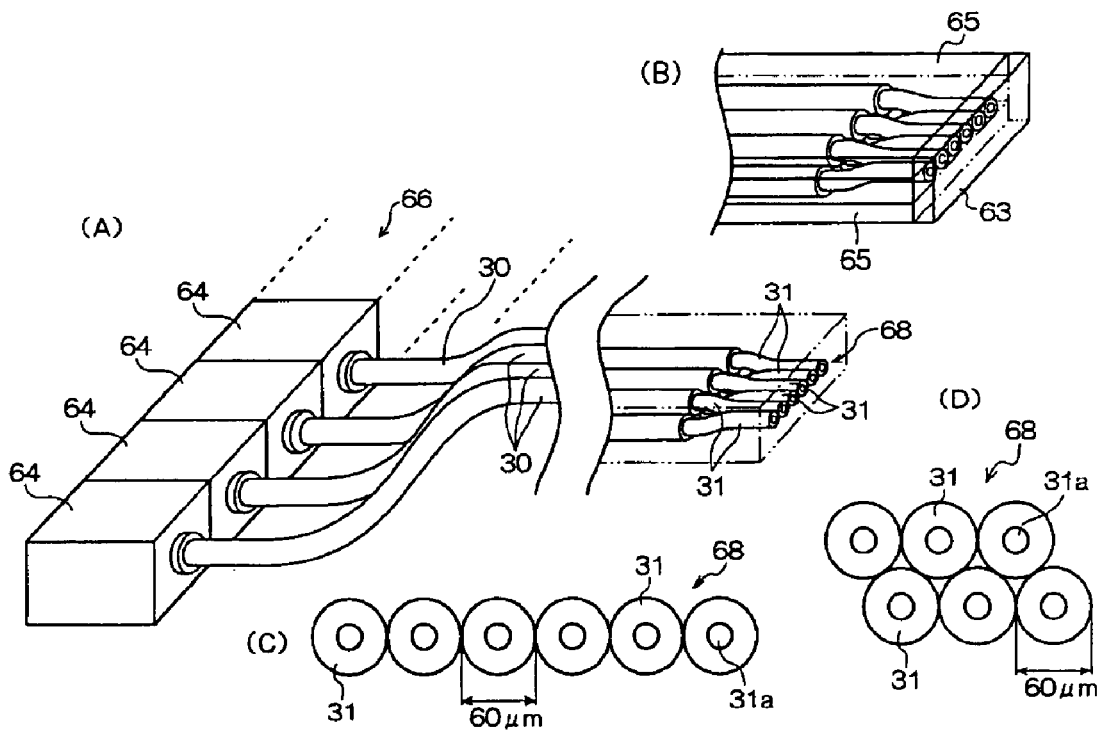
FIG. 27A (A) is an exemplary perspective view that shows a constitution of a fiber array laser source.
Figure 27B:
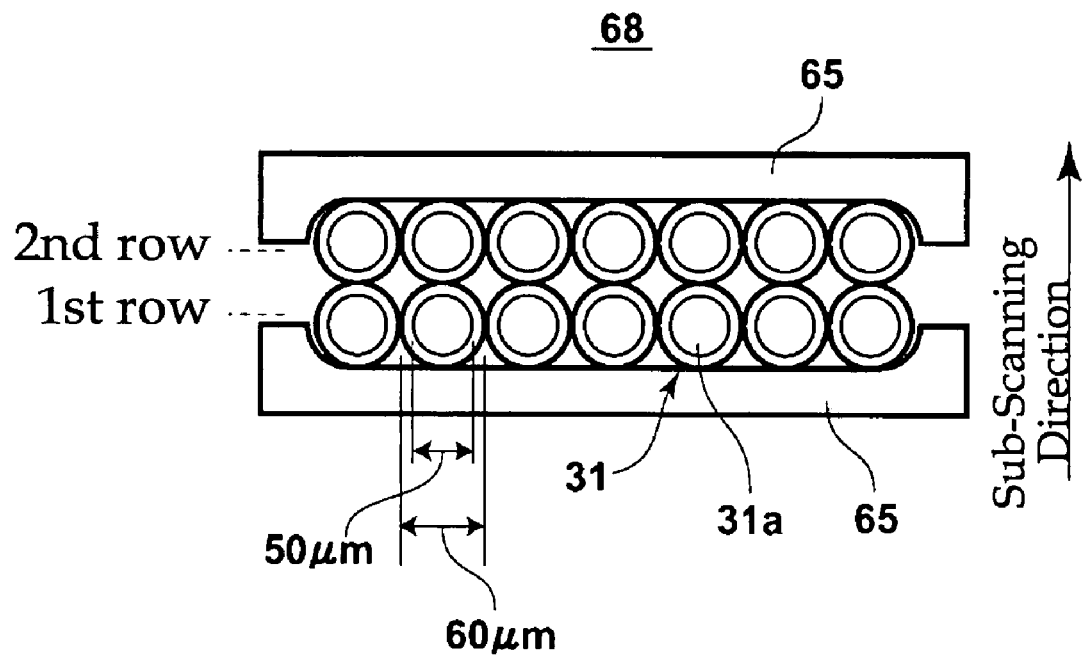
FIG. 27B is an exemplary front view that shows an arrangement of laser emitting sites in the laser emitting part in a fiber array laser source.

Fiber array laser source 66 is equipped with plural (e.g. fourteen) laser modules 64 as shown in FIG. 27A. One end of each multimode optical fiber 30 is connected to each laser module 64. The other end of each multimode optical fiber 30 is connected to optical fiber 31 of which the core diameter is the same as that of multimode optical fiber 30 and of which the clad diameter is smaller than that of multimode optical fiber 30. As shown in FIG. 27B specifically, the ends of multimode optical fibers 31 at the opposite end of multimode optical fiber 30 are aligned as seven ends along the main scanning direction perpendicular to the sub-scanning direction, and the seven ends are aligned as two rows, thereby laser output portion 68 is constructed.

The laser output portion 68, formed of the ends of multimode optical fibers 31, is fixed by being interposed between two flat support plates 65 as shown in FIG. 27B. Preferably, a transparent protective plate such as a glass plate is disposed on the output end surface of multimode optical fibers 31 in order to protect the output end surface. The output end surface of multimode optical fibers 31 tends to bear dust and to degrade due to its higher optical density; the protective plate set forth above may prevent the dust deposition on the end surface and may retard the degradation.

In this example, in order to align optical fibers 31 having a lower clad diameter into an array without a space, multimode optical fiber 30 is stacked between two multimode optical fibers 30 that contact at the larger clad diameter, and the output end of optical fiber 31 connected to the stacked multimode optical fiber 30 is interposed between two output ends of optical fibers 31 connected to two multimode optical fibers 30 that contact at the larger clad diameter.

Figure 28:
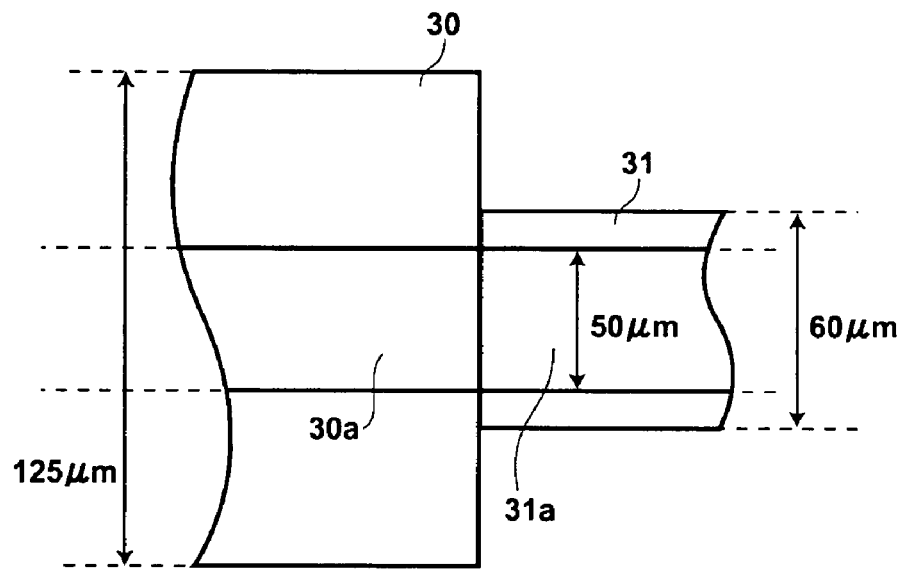
FIG. 28 is an exemplary view that shows a construction of a multimode optical fiber.

Such optical fibers may be produced by connecting concentrically optical fibers 31 having a length of 1 cm to 30 cm and a smaller clad diameter to the tip portions of laser beam output side of multimode optical fiber 30 having a larger clad diameter, for example, as shown in FIG. 28. Two optical fibers are connected such that the input end surface of optical fiber 31 is fused to the output end surface of multimode optical fiber 30 so as to coincide the center axes of the two optical fibers. The diameter of core 31a of optical fiber 31 is the same as the diameter of core 30a of multimode optical fiber 30 as set forth above.

Further, a shorter optical fiber produced by fusing an optical fiber having a smaller clad diameter to an optical fiber having a shorter length and a larger clad diameter may be connected to the output end of multimode optical fiber through a ferrule, optical connector or the like. The connection through a connector and the like in an attachable and detachable manner may bring about easy exchange of the output end portion when the optical fibers having a smaller clad diameter are partially damaged for example, resulting advantageously in lower maintenance cost for the exposing head. Optical fiber 31 is sometimes referred to as "output end portion" of multimode optical fiber 30.

Multimode optical fiber 30 and optical fiber 31 may be any one of step index type optical fibers, grated index type optical fibers, and combined type optical fibers. For example, step index type optical fibers produced by Mitsubishi Cable Industries, Ltd. are available. In one of the best mode according to the present invention, multimode optical fiber 30 and optical fiber 31 are step index type optical fibers; in the multimode optical fiber 30, clad diameter=125 μm, core diameter=50 μm, NA=0.2, transmittance=99.5% or more (at coating on input end surface); and in the optical fiber 31, clad diameter=60 μm, core diameter=50 μm, NA=0.2.

Laser beams at infrared region typically increase the propagation loss while the clad diameter of optical fibers decreases. Accordingly, a proper clad diameter is defined usually depending on the wavelength region of the laser beam. However, the shorter is the wavelength, the less is the propagation loss; for example, in the laser beam of wavelength 405 nm applied from GaN semiconductor laser, even when the clad thickness (clad diameter−core diameter)/2 is made into about ½ of the clad thickness at which infrared beam of wavelength 800 nm is typically propagated, or made into about ¼ of the clad thickness at which infrared beam of wavelength 1.5 μm for communication is typically propagated, the propagation loss does not increase significantly. Therefore, the clad diameter is possible to be as small as 60 μm.

Needless to say, the clad diameter of optical fiber 31 should not be limited to 60 µm. The clad diameter of optical fiber utilized for conventional fiber array laser sources is 125 µm; the smaller is the clad diameter, the deeper is the focal depth; therefore, the clad diameter of the multimode optical fiber is preferably 80 µm or less, more preferably 60 µm or less, still more preferably 40 µm or less. In the meanwhile, since the core diameter is appropriately at least 3 to 4 µm, the clad diameter of optical fiber 31 is preferably 10 µm or more.

Figure 29:
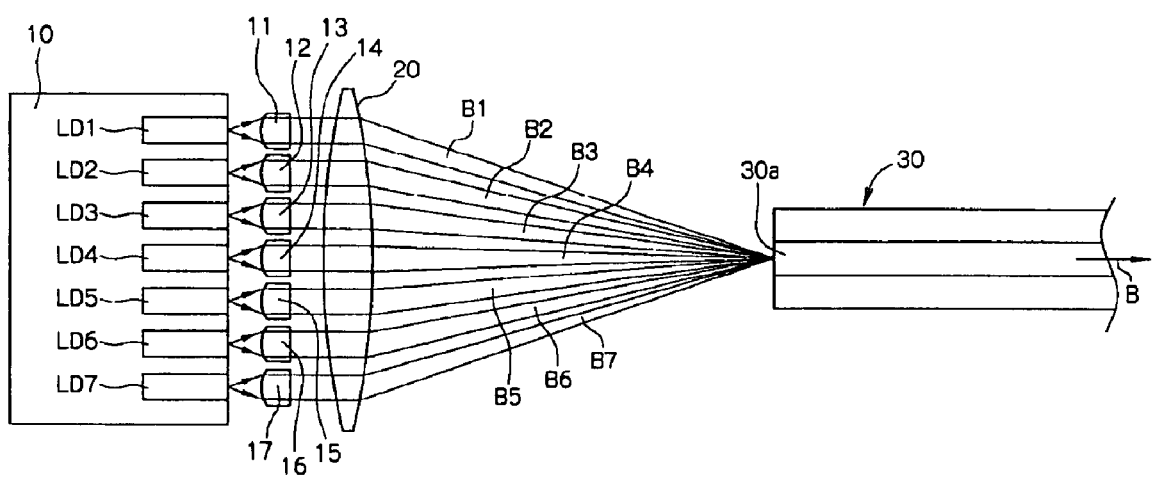
FIG. 29 is an exemplary plan view that shows a construction of a combined laser source.

Laser module 64 is constructed from the combined laser source or the fiber array laser source as shown in FIG. 29. The combined laser source is constructed from plural (e.g. seven) multimode or single mode GaN semiconductor lasers LD1, LD2, LD3, LD4, LD5, LD6 and LD7 disposed and fixed on heat block 10, collimator lenses 11, 12, 13, 14, 15, 16, and 17, one collecting lens 20, and one multimode optical fiber 30. Needless to say, the number of semiconductor lasers is not limited to seven. For example, with respect to the multimode optical fiber having clad diameter=60 µm, core diameter=50 µm, NA=0.2, as much as twenty semiconductor lasers may be input, thus the number of optical fibers may be reduced while attaining the necessary optical quantity of the exposing head.

GaN semiconductor lasers LD1 to LD7 have a common oscillating wavelength e.g. 405 nm, and a common maximum output e.g. 100 mW as for multimode lasers and 30 mW as for single mode lasers. The GaN semiconductor lasers LD1 to LD7 may be those having an oscillating wavelength of other than 405 nm as long as within the wavelength of 350 to 450 nm.

Figure 30:
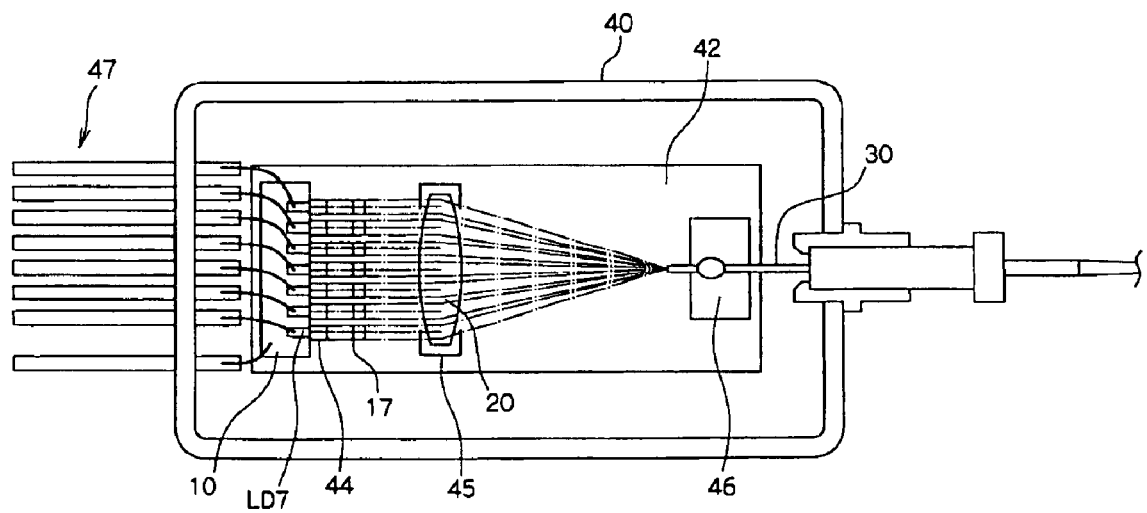
FIG. 30 is an exemplary plan view that shows a construction of a laser module.
Figure 31:
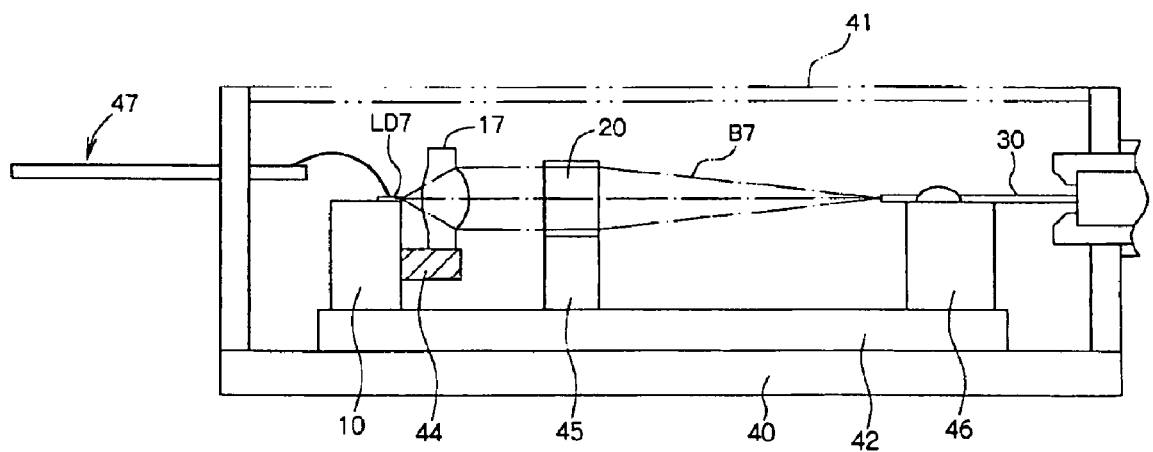
FIG. 31 is an exemplary side view that shows a construction of the laser module shown in FIG. 30.

The combined laser source is housed into a box package 40 having an upper opening with other optical elements as shown in FIGS. 30 and 31. The package 40 is equipped with package lid 41 for shutting the opening. Introduction of sealing gas after evacuating procedure and shutting the opening of package 40 by means of package lid 41 presents a closed space or sealed volume constructed by package 40 and package lid 41, and the combined laser source is disposed in a sealed condition.

Base plate 42 is fixed on the bottom of package 40; the heat block 10, collective lens holder 45 to support collective lens 20, and fiber holder 46 to support the input end of multimode optical fiber 30 are mounted to the upper surface of the base plate 42. The output end of multimode optical fiber 30 is drawn out of the package from the aperture provided at the wall of package 40.

Collimator lens holder 44 is attached to the side wall of heat block 10, and collimator lenses 11 to 17 are supported thereby. An aperture is provided at the side wall of package 40, and interconnection 47 that supplies driving power to GaN semiconductor lasers LD1 to LD7 is directed through the aperture out of the package.

In FIG. 31, only the GaN semiconductor laser LD7 is indicated with a reference mark among plural GaN semiconductor laser, and only the collimator lens 17 is indicated with a reference number among plural collimators, in order not to make the figure excessively complicated.

Figure 32:
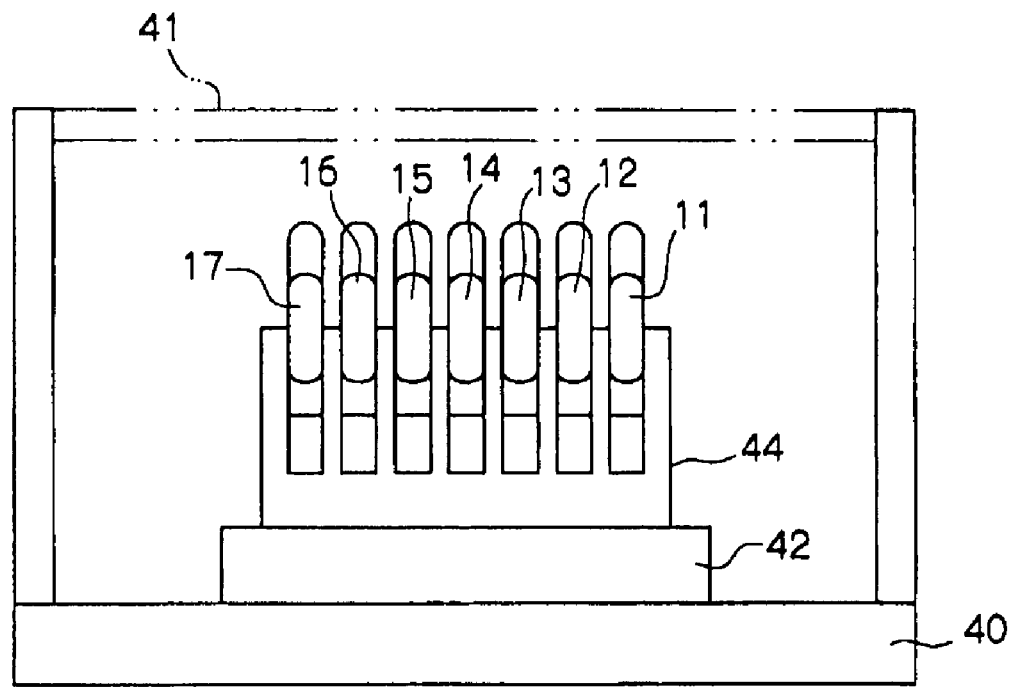
FIG. 32 is a partial side view that shows a construction of the laser module shown in FIG. 30.

FIG. 32 shows a front shape of attaching part for collimator lenses 11 to 17. Each of collimator lenses 11 to 17 is formed into a shape that a circle lens containing a non-spherical surface is cut into an elongated piece with parallel planes at the region containing the optical axis. The collimator lens with the elongated shape may be produced by a molding process. The collimator lenses 11 to 17 are closely disposed in the aligning direction of emitting points (in the horizontal direction in FIG. 32) such that the elongated direction is perpendicular to the alignment of the emitting points of GaN semiconductor lasers LD1 to LD7.

In the meanwhile, as for GaN semiconductor lasers LD1 to LD7, the following laser may be employed which contains an active layer having an emitting width of 2 µm and emits the respective laser beams B1 to B7 under the condition that the divergence angle is 10 degrees and 30 degrees for the parallel and perpendicular directions against the active layer. The GaN semiconductor lasers LD1 to LD7 are disposed such that the emitting sites align as one line in parallel to the active layer.

Accordingly, laser beams B1 to B7 emitted from the respective emitting sites enter into the elongated collimator lenses 11 to 17 in a condition that the direction having a larger divergence angle coincides with the length direction of each collimator lens and the direction having a less divergence angle coincides with the width direction of each collimator lens. Namely, the width is 1.1 mm and the length is 4.6 mm with respect to respective collimator lenses 11 to 17, and the beam diameter is 0.9 mm in the horizontal direction and is 2.6 mm in the vertical direction with respect to laser beams B1 to B7 that enter into the collimator lenses. As for the respective collimator lenses 11 to 17, focal length f1=3 mm, NA=0.6, pitch of disposed lenses=1.25 mm.

Collective lens 20 formed into a shape that a part of circle lens containing the optical axis and non-spherical surface is cut into an elongated piece with parallel planes and is arranged such that the elongated piece is longer in the direction of disposing collimator lens 11 to 17 i.e. horizontal direction, and is shorter in the perpendicular direction. As for the collective lens, focal length f2=23 mm, NA=0.2. The collective lens 20 may be produced by molding a resin or optical glass, for example.

Further, since a high luminous fiber array laser source is employed that is arrayed at the output ends of optical fibers in the combined laser source for the light irradiation unit to illuminate the DMD, a pattern forming apparatus that exhibits a higher output and a deeper focal depth may be attained. In addition, the higher output of the respective fiber array laser sources may lead to less number of fiber array laser sources required to take a necessary output as well as a lower cost of the pattern forming apparatus.

In addition, the clad diameter at the output ends of the optical fibers is smaller than the clad diameter at the input ends, therefore, the diameter at emitting sites is reduced still, resulting in higher luminance of the fiber array laser source. Consequently, pattern forming apparatuses provided with a deeper focal depth may be achieved. For example, a sufficient focal depth may be obtained even for the extremely high resolution exposure such that the beam diameter is 1 µm or less and the resolution is 0.1 µm or less, thereby enabling rapid and precise exposure. Accordingly, the pattern forming apparatus is appropriate for the exposure of thin film transistor (TFT) that requires high resolution.

The light irradiation unit is not limited to the fiber array laser source that is equipped with plural combined laser sources; for example, such a fiber array laser source may be employed that is equipped with one fiber laser source, and the fiber laser source is constructed by one arrayed optical fiber that outputs a laser beam from one semiconductor laser having an emitting site.

Figure 33:
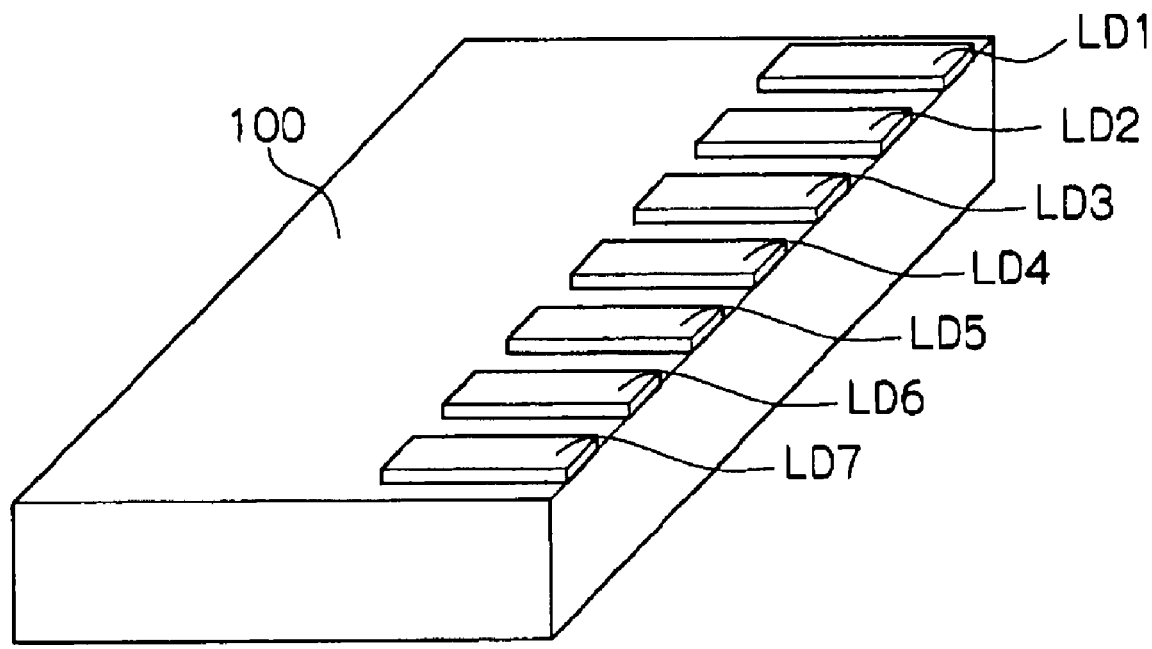
FIG. 33 is an exemplary perspective view that shows a construction of a laser array.
Figure 34A:
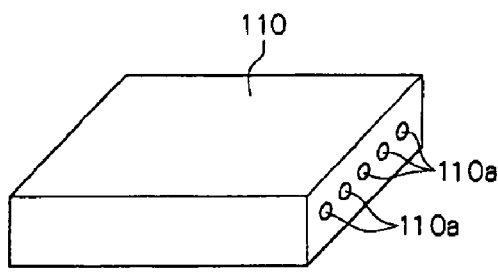
FIG. 34A is an exemplary perspective view that shows a construction of a multi cavity laser.

Further, as for the light irradiation unit having plural emitting sites, such a laser array may be employed that contains plural (e.g. seven) tip-like semiconductor lasers LD1 to LD7 disposed on heat block 100 as shown in FIG. 33. In addition, multi cavity laser 110 is known which contains plural (e.g. five) emitting sites 110a disposed in a certain direction as shown in FIG. 34A. In the multi cavity laser 110, the emitting sites can be arrayed with higher dimensional accuracy as compared to arraying tip-like semiconductor lasers, thus laser beams emitted from the respective emitting sites can be easily combined. Preferably, the number of emitting sites 110a is five or less because deflection tends to arise on multi cavity laser 110 at the laser production process when the number increases.

Figure 34B:
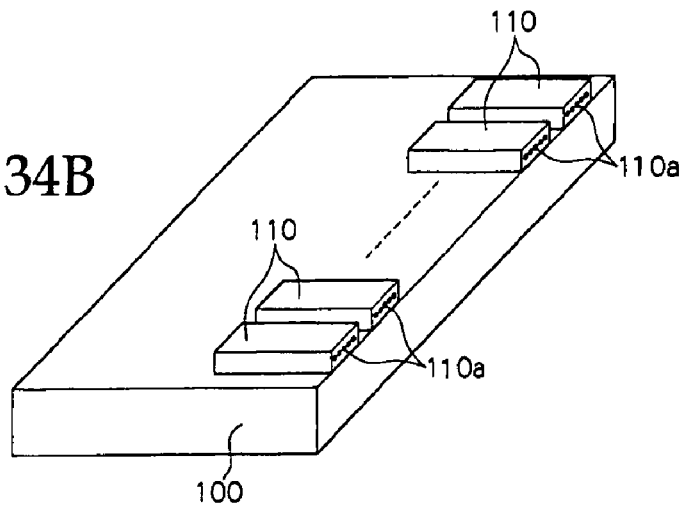
FIG. 34B is an exemplary perspective view that shows a multi cavity laser array in which the multi cavity lasers shown in FIG. 34A are arranged in an array.

Concerning the light irradiation unit, the multi cavity laser 110 set forth above, or the multi cavity array disposed such that plural multi cavity lasers 110 are arrayed in the same direction as emitting sites 110a of each tip as shown in FIG. 34B may be employed for the laser source.

Figure 21:
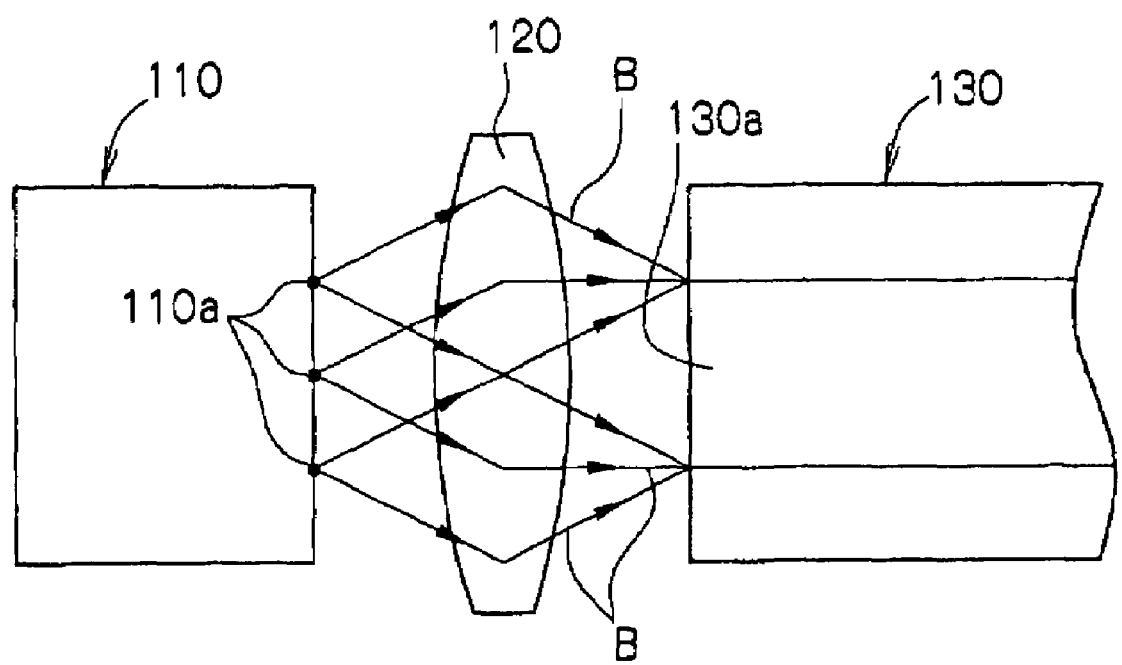
FIG. 21 is an exemplary plan view that shows another construction of a combined laser source.

The combined laser source is not limited to the types that combine plural laser beams emitted from plural tip-like semiconductor lasers. For example, such a combined laser source is available that contains tip-like multi cavity laser 110 having plural (e.g. three) emitting sites 110a as shown in FIG. 21. The combined laser source is equipped with multi cavity laser 110, one multimode optical fiber 130, and collecting lens 120. The multi cavity laser 110 may be constructed from GaN laser diodes having an oscillating wavelength of 405 nm, for example.

In the above noted construction, each laser beam B emitted from each of plural emitting sites 110a of multi cavity laser 110 is collected by collective lens 120 and enters into core 130a of multimode optical fiber 130. The laser beams entered into core 130a propagate inside the optical fiber and combine as one laser beam then output from the optical fiber.

The connection efficiency of laser beam B to multimode optical fiber 130 may be enhanced by way of arraying plural emitting sites 110a of multi cavity laser 110 into a width that is approximately the same as the core diameter of multimode optical fiber 130, and employing a convex lens having a focal length of approximately the same as the core diameter of multimode optical fiber 130, and also employing a rod lens that collimates the output beam from multi cavity laser 110 at only within the surface perpendicular to the active layer.

Figure 35:
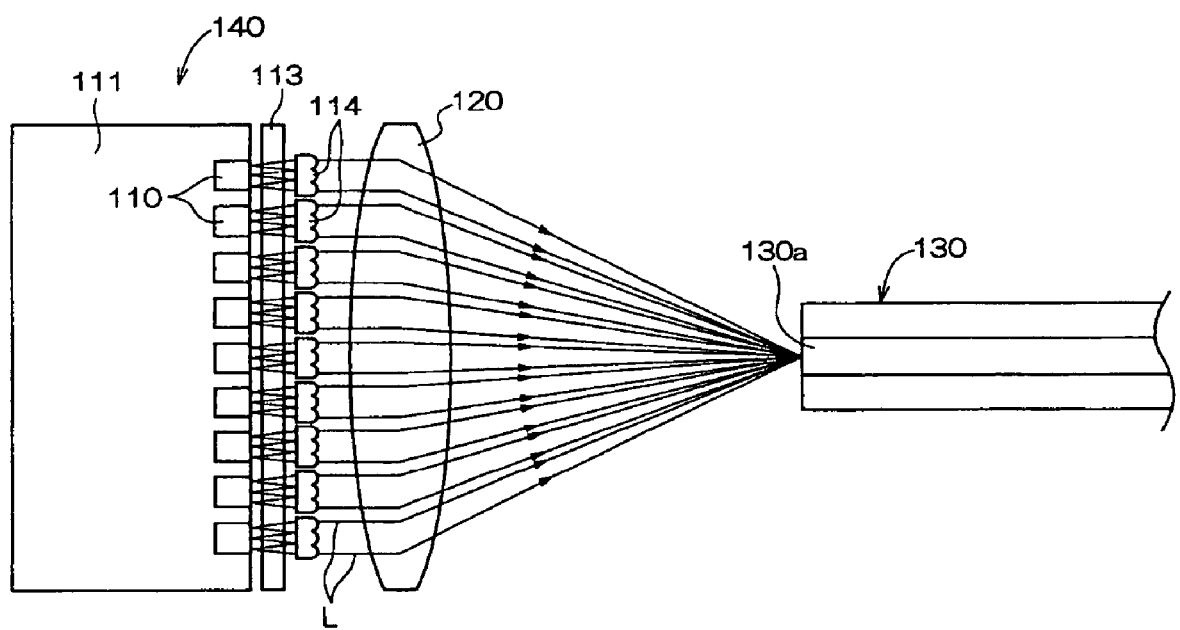
FIG. 35 is an exemplary plan view that shows another construction of a combined laser source.

In addition, as shown in FIG. 35, a combined laser source may be employed which is equipped with laser array 140 formed by arraying on heat block 111 plural (e.g. nine) multi cavity lasers 110 with an identical space between them by employing multi cavity lasers 110 equipped with plural (e.g. three) emitting sites. The plural multi cavity lasers 110 are arrayed and fixed in the same direction as emitting sites 110a of the respective tips.

The combined laser source is equipped with laser array 140, plural lens arrays 114 that are disposed correspondingly to the respective multi cavity lasers 110, one rod lens 113 that is disposed between laser array 140 and plural lens arrays 114, one multimode optical fiber 130, and collective lens 120. Lens arrays 114 are equipped with plural microlenses each corresponding to emitting sites of multi cavity lasers 110.

In the above noted construction, laser beams B that are emitted from plural emitting sites 110a of plural multi cavity lasers 110 are collected in a certain direction by rod lens 113, then are paralleled by the respective microlenses of microlens arrays 114. The paralleled laser beams L are collected by collective lens 120 and are input into core 130a of multimode optical fiber 130. The laser beams entered into core 130a propagate inside the optical fiber and combine as one beam then output from the optical fiber.

Figure 36A:
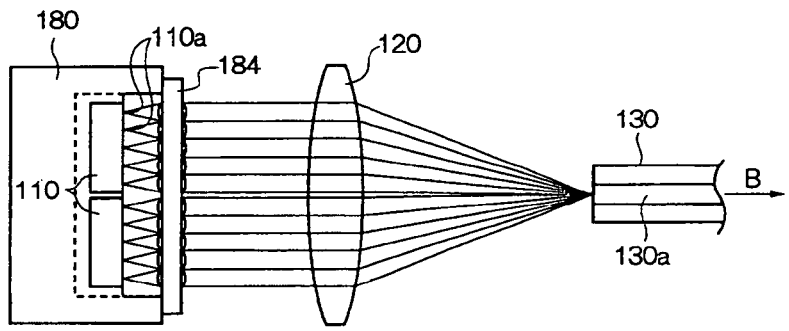
FIG. 36A is an exemplary plan view that shows still another construction of a combined laser source.
Figure 36B:
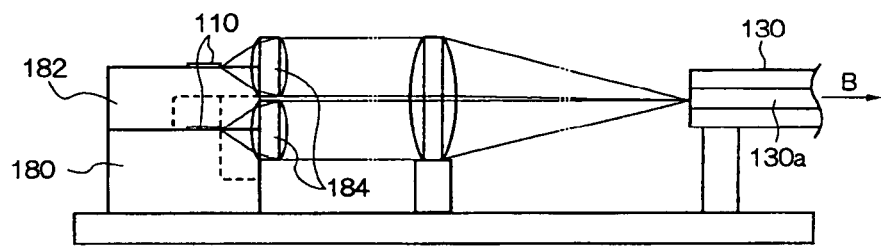
FIG. 36B is an exemplary cross sectional view of FIG. 36A along the optical axis.

Another combined laser source will be exemplified in the following. In the combined laser source, heat block 182 having a cross section of L-shape in the optical axis direction is installed on rectangular heat block 180 as shown in FIGS. 36A and 36B, and a housing space is formed between the two heat blocks. On the upper surface of L-shape heat block 182, plural (e.g. two) multi cavity lasers 110, in which plural (e.g. five) emitting sites are arrayed, are disposed and fixed with an identical space between them in the same direction as the aligning direction of respective tip-like emitting sites.

A concave portion is provided on the substantially rectangular heat block 180; plural (e.g. two) multi cavity lasers 110 are disposed on the upper surface of heat block 180, plural emitting sites (e.g. five) are arrayed in each multi cavity lasers 110, and the emitting sites are situated at the same vertical surface as the surface where the emitting sites of the laser tip disposed on the heat block 182 are situated.

At the laser beam output side of multi cavity laser 110, collimate lens arrays 184 are disposed such that collimate lenses are arrayed correspondingly with the emitting sites 110a of the respective tips. In the collimate lens arrays 184, the length direction of each collimate lens coincides with the direction at which the laser beam represents wider divergence angle or the fast axis direction, and the width direction of each collimate lens coincides with the direction at which the laser beam represents less divergence angle or the slow axis direction. The integration by arraying the collimate lenses may increase the space efficiency of laser beam, thus the output power of the combined laser source may be enhanced, and also the number of parts may be reduced, resulting advantageously in lower production cost.

At the laser beam output side of collimate lens arrays 184, disposed are one multimode optical fiber 130 and collective lens 120 that collects laser beams at the input end of multimode optical fiber 130 and combines them.

In the above noted construction, the respective laser beams B emitted from the respective emitting sites 110a of plural multi cavity lasers 110 disposed on laser blocks 180, 182 are paralleled by collimate lens array, are collected by collective lens 120, then entered into core 130a of multimode optical fiber 130. The laser beams entered into core 130a propagate inside the optical fiber and combine as one beam then output from the optical fiber.

The combined laser source may be made into a higher output power source by multiple arrangement of the multi cavity lasers and the array of collimate lenses in particular. The combined laser source allows to construct a fiber array laser source and a bundle fiber laser source, thus is appropriate for the fiber laser source to construct the laser source of the pattern forming apparatus in the present invention.

A laser module may be constructed by housing the respective combined laser sources into a casing, and drawing out the output end of multimode optical fiber 130.

In the explanations set forth above, the higher luminance of fiber array laser source is exemplified which the output end of the multimode optical fiber of the combined laser source is connected to another optical fiber that has the same core diameter as that of the multimode optical fiber and a clad diameter smaller than that of the multimode optical fiber; alternatively a multimode optical fiber having a clad diameter of 125 µm, 80 µm, 60 µm or the like may be utilized without connecting another optical fiber at the output end, for example.

The pattern forming process of the present invention will be explained further.

As shown in FIG. 29, in each exposing head 166 of scanner 162, the respective laser beams B1, B2, B3, B4, B5, B6, and B7, emitted from GaN semiconductor lasers LD1 to LD7 that constitute the combined laser source of fiber array laser source 66, are paralleled by the corresponding collimator lenses 11 to 17. The paralleled laser beams B1 to B7 are collected by collective lens 20 and converge at the input end surface of core 30a of multimode optical fiber 30.

In this example, the collective optical system is constructed from collimator lenses 11 to 17 and collective lens 20, and the combined optical system is constructed from the collective optical system and multimode optical fiber 30. Namely, laser beams B1 to B7 that are collected by collective lens 20 enter into core 30a of multimode optical fiber 30 and propagate inside the optical fiber, combine into one laser beam B, then output from optical fiber 31 that is connected at the output end of multimode optical fiber 30.

In each laser module, when the coupling efficiency of laser beams B1 to B7 with multimode optical fiber 30 is 0.85 and each output of GaN semiconductor lasers LD1 to LD7 is 30 mW, each optical fiber disposed in an array can take combined laser beam B of output 180 mW (=30 mW×0.85×7). Accordingly, the output is about 1 W (=180 mW×6) at laser emitting portion 68 of the array of six optical fibers 31.

Laser emitting portions 68 of fiber array source 66 are arrayed such that the higher luminous emitting sites are aligned along the main scanning direction. The conventional fiber laser source that connects laser beam from one semiconductor laser to one optical fiber is of lower output, therefore, a desirable output cannot be attained unless many lasers are arrayed; whereas the combined laser source of lower number (e.g. one) array can produce the desirable output because the combined laser source may generate a higher output.

For example, in the conventional fiber where one semiconductor laser and one optical fiber are connected, a semiconductor laser of about 30 mW output is usually employed, and a multimode optical fiber that has a core diameter of 50 μm, a clad diameter of 125 μm, and a numerical aperture of 0.2 is employed as the optical fiber. Therefore, in order to take an output of about 1 W (Watt), 48 (8×6) multimode optical fibers are necessary; since the area of emitting region is 0.62 mm$^2$ (0.675 mm×0.925 mm), the luminance at laser emitting portion 68 is $1.6×10^6$ (W/m$^2$), and the luminance per one optical fiber is $3.2×10^6$ (W/m$^2$).

In contrast, when the laser emitting unit is one capable of emitting the combined laser, six multimode optical fibers can produce the output of about 1 W. Since the area of the emitting region in laser emitting portion 68 is 0.0081 mm$^2$ (0.325 mm×0.025 mm), the luminance at laser emitting portion 68 is $123×10^6$ (W/m$^2$), which corresponds to about 80 times the luminance of conventional units. The luminance per one optical fiber is $90×10^6$ (W/m$^2$), which corresponds to about 28 times the luminance of conventional unit.

Figure 37A:
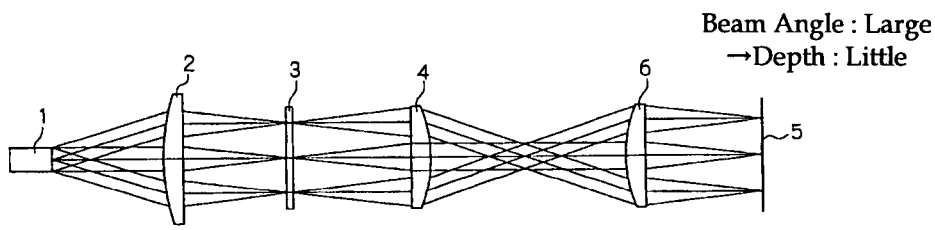
FIG. 37A is an exemplary cross sectional view of an exposing device that shows focal depth along the optical axis in the pattern forming process of the prior art.

The difference of focal depth between the conventional exposing head and the exposing head in the present invention will be explained with reference to FIGS. 37A and 37B. For example, the diameter of exposing head is 0.675 mm in the sub-scanning direction of the emitting region of the bundle-like fiber laser source, and the diameter of exposing head is 0.025 mm in the sub-scanning direction of the emitting region of the fiber array laser source. As shown in FIG. 37A, in the conventional exposing head, the emitting region of illuminating unit or bundle-like fiber laser source 1 is larger, therefore, the angle of laser bundle that enters into DMD3 is larger, resulting in larger angle of laser bundle that enters into scanning surface 5. Therefore, the beam diameter tends to increase in the collecting direction, resulting in a deviation in focus direction.

Figure 37B:
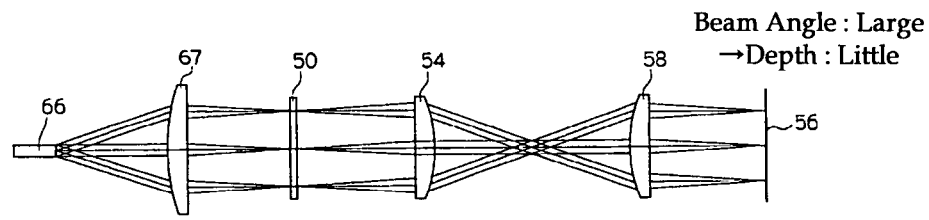
FIG. 37B is an exemplary cross sectional view of an exposing device that shows focal depth along the optical axis in the pattern forming process according to the present invention.

In the meanwhile, as shown in FIG. 37B, the exposing head of the pattern forming apparatus in the present invention has a smaller diameter of the emitting region of fiber array laser source 66 in the sub-scanning direction, therefore, the angle of laser bundle that enters into DMD50 through lens system 67 is smaller, resulting in lower angle of laser bundle that enters into scanning surface 56, i.e. larger focal depth. In this example, the diameter of the emitting region is about 30 times the diameter of prior art in the sub-scanning direction, thus the focal depth approximately corresponding to the limited diffraction may be obtained, which is appropriate for the exposing at extremely small spots. The effect on the focal depth is more significant as the optical quantity required at the exposing head comes to larger. In this example, the size of one imaging portion projected on the exposing surface is 10 μm×10 μm. The DMD is a spatial light modulator of reflected type; in FIGS. 37A and 37B, it is shown as developed views to explain the optical relation.

The pattern information corresponding to the exposing pattern is input into a controller (not shown) connected to DMD50, and is memorized once to a flame memory within the controller. The pattern information is the data that expresses the concentration of each imaging portion that constitutes the pixels by means of binary i.e. presence or absence of the dot recording.

Stage 152 that absorbs pattern forming material 150 on the surface is conveyed from upstream to downstream of gate 160 along guide 158 at a constant velocity by a driving device (not shown). When the tip of pattern forming material 150 is detected by detecting sensor 164 installed at gate 160 while stage 152 passes under gate 160, the pattern information memorized at the flame memory is read plural lines by plural lines sequentially, and controlling signals are generated for each exposing head 166 based on the pattern information read by the data processing portion. Then, each micromirror of DMD50 is subjected to on-off control for each exposing head 166 based on the generated controlling signals.

When a laser beam is applied from fiber array laser source 66 onto DMD50, the laser beam reflected by the micromirror of DMD50 at on-condition is imaged on exposed surface 56 of pattern forming material 150 by means of lens systems 54, 58. As such, the laser beams emitted from fiber array laser source 66 are subjected to on-off control for each imaging portion, and pattern forming material 150 is exposed by imaging portions or exposing area 168 of which the number is approximately the same as that of imaging portions employed in DMD50. Further, through moving the pattern forming material 150 at a constant velocity along with stage 152, pattern forming material 150 is subjected to sub-scanning in the direction opposite to the stage moving direction by means of scanner 162, and band-like exposed region 170 is formed for each exposing head 166.

<Microlens Array>

Preferably, the photosensitive layer is exposed by applying the modulated laser beam through a microlens array, and further through an aperture array, image optics, and the like.

The microlens array is not particularly limited and may be suitably selected in accordance with the intended use. Preferred examples thereof include those having a non-spherical surface capable of compensating the aberration due to distortion at irradiating surface of the imaging portion.

The non-spherical surface is not particularly limited and may be properly selected in accordance with the intended use; preferably, the non-spherical surface is a toric surface, for example.

The microlens array, aperture array, imaging system set forth above will be explained with reference to figures.

FIG. 13A shows an exposing head that is equipped with DMD 50, laser source 144 to irradiate laser beam onto DMD 50, lens systems or imaging optical systems 454 and 458 that magnify and image the laser beam reflected by DMD 50, microlens array 472 in which many microlenses 474 corresponding to the respective imaging portions of DMD 50 are arranged, aperture array 476 that aligns many apertures 478 corresponding to the respective microlenses of microlens array 472, and lens systems or imaging systems 480 and 482 that image laser beam through the apertures onto exposed surface 56.

Figure 14:
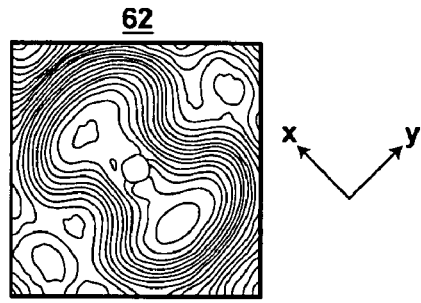
FIG. 14 is an exemplary view that shows distortion of a reflective surface of a micromirror that constitutes a DMD by means of contour lines.
Figure 15A:
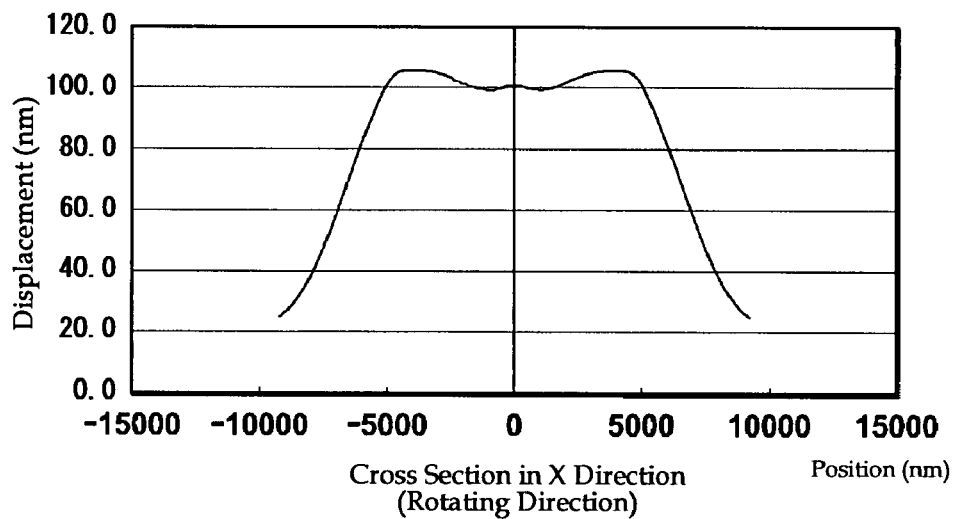
FIG. 15A is an exemplary graph that shows the distortion of the reflective surface of the micromirror along two diagonal lines of the micromirror.
Figure 15B:
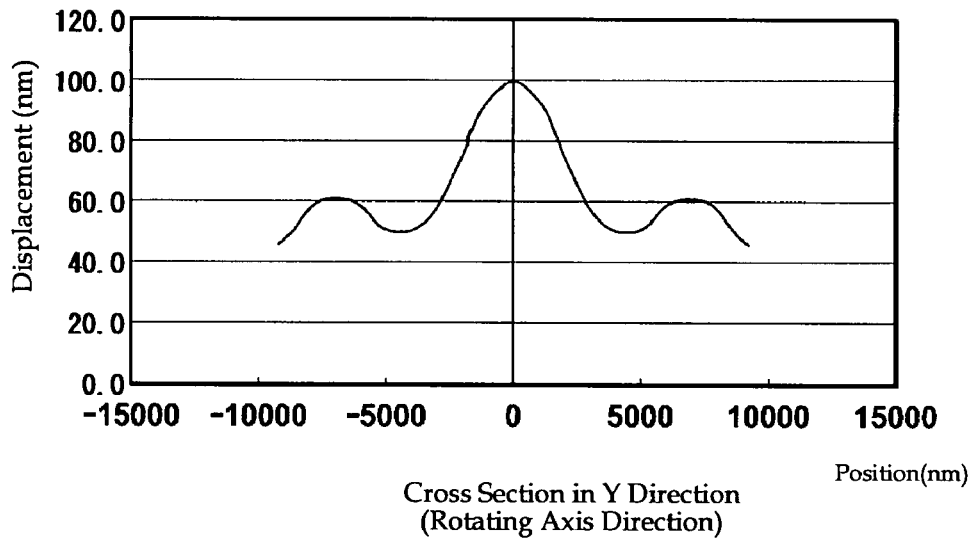
FIG. 15B is an exemplary graph that shows the distortion of the reflective surface of the micromirror as shown in FIG. 15A along two diagonal lines of the micromirror.
Figure 19B:
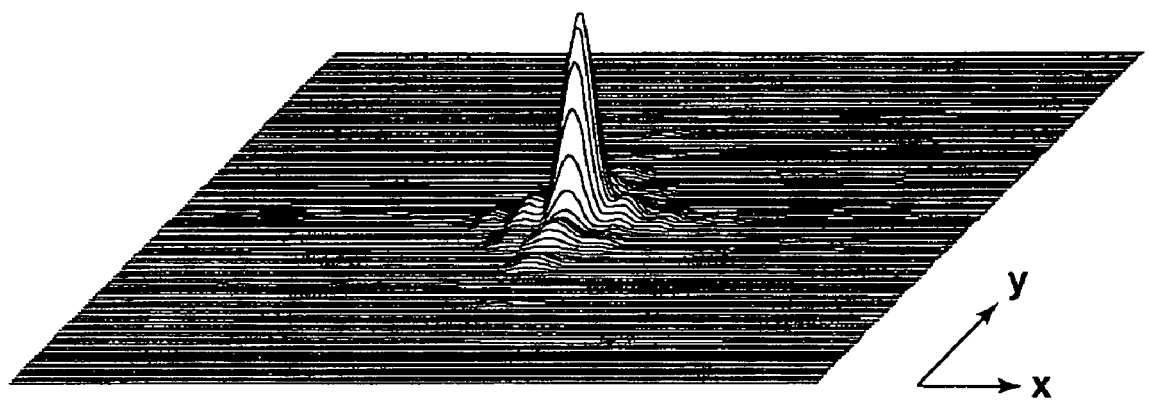
FIG. 19B is an exemplary view that shows another simulation similar to FIG. 19A in terms of other sites in accordance with the present invention.
Figure 19C:
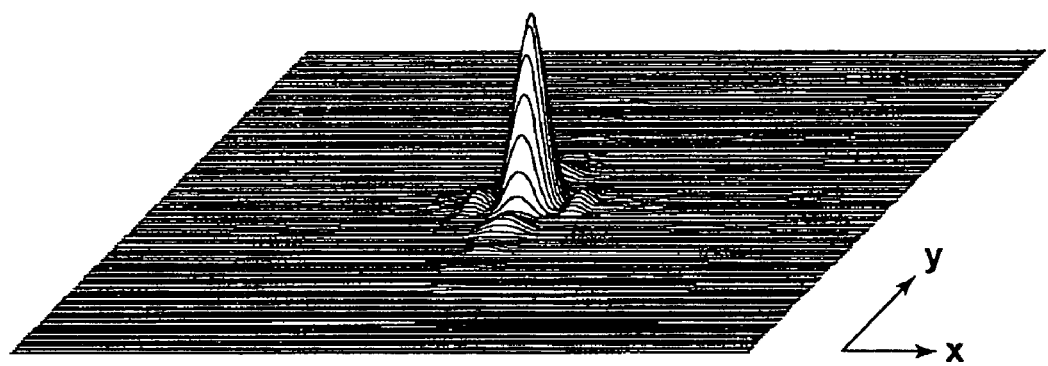
FIG. 19C is an exemplary view that shows still another simulation similar to FIG. 19A in terms of other sites in accordance with the present invention.
Figure 19D:
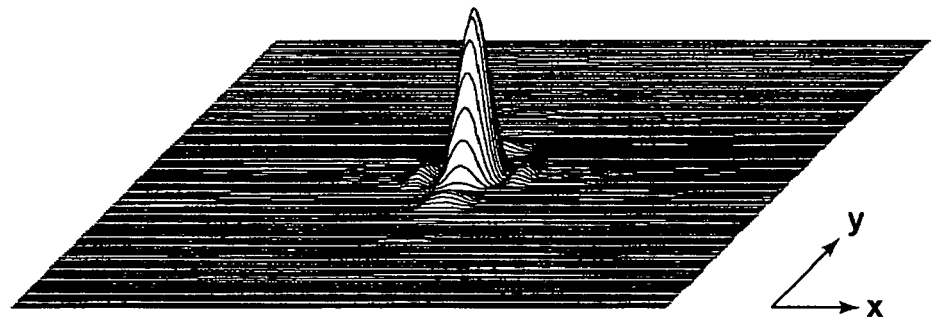
FIG. 19D is an exemplary view that shows still another simulation similar to FIG. 19A in terms of other sites in accordance with the present invention.
Figure 20A:
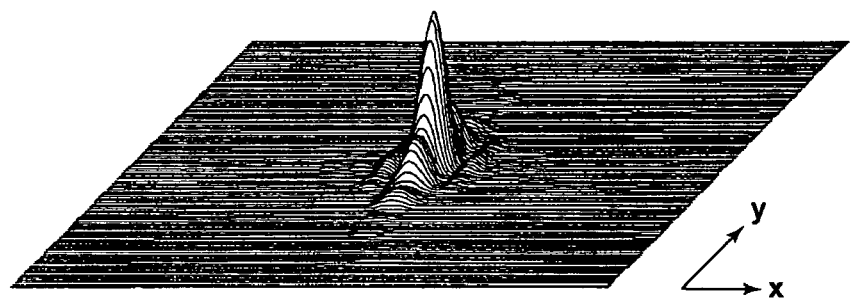
FIG. 20A is an exemplary view that shows a simulation of beam diameters near the focal point of a microlens in a conventional pattern forming process.
Figure 20B:
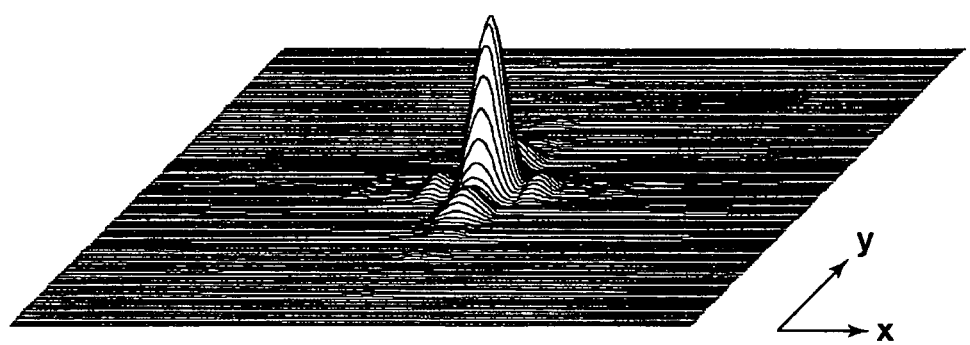
FIG. 20B is an exemplary view that shows another simulation similar to FIG. 20A in terms of other sites.
Figure 20C:
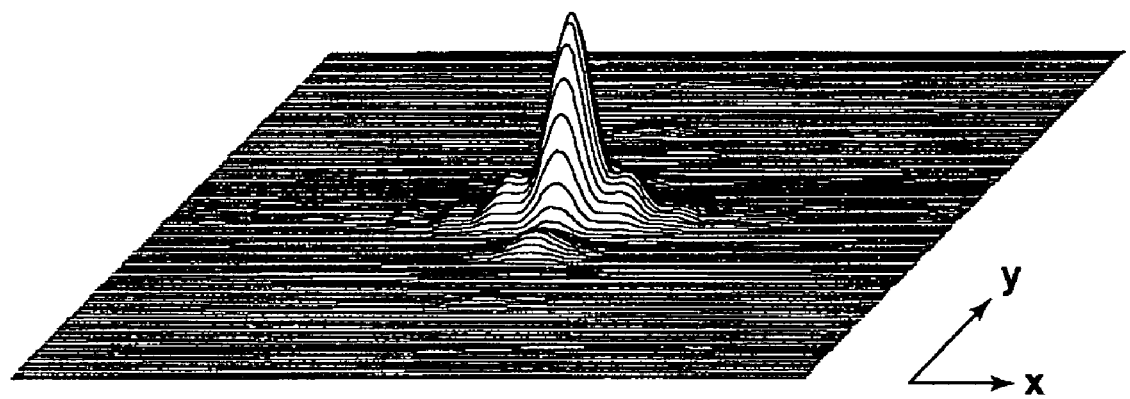
FIG. 20C is an exemplary view that shows still another simulation similar to FIG. 20A in terms of other sites.
Figure 20D:
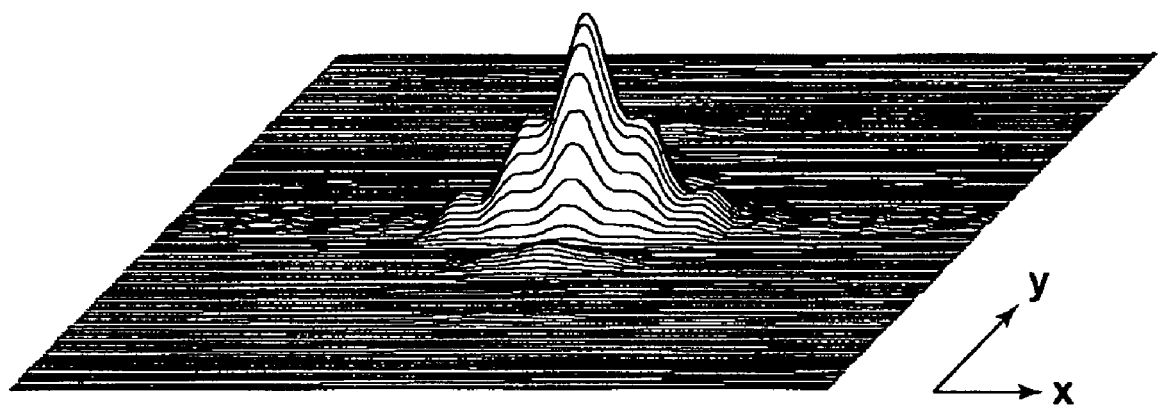
FIG. 20D is an exemplary view that shows still another simulation similar to FIG. 20A in terms of other sites.

FIG. 14 shows the flatness data as to the reflective surface of micromirrors 62 of DMD 50. In FIG. 14, contour lines express the respective same heights of the reflective surface; the pitch of the contour lines is five nano meters. In FIG. 14, X direction and Y direction are two diagonal directions of micromirror 62, and the micromirror 62 rotates around the rotation axis extending in Y direction. FIGS. 15A and 15B show the height displacements of micromirrors 62 along the X and Y directions respectively.

As shown in FIGS. 14, 15A and 15B, there exist distortions on the reflective surface of micromirror 62, the distortions of one diagonal direction (Y direction) is larger than another diagonal direction (X direction) at the central region of the mirror in particular. Accordingly, a problem may arise in which the shape is distorted at the site that collects laser beam B by microlenses 55a of microlens array 55.

In order to prevent such a problem, microlenses 55a of microlens array 55 are of special shape that is different from the prior art as explained later.

FIGS. 16A and 16B show the front shape and side shape of the entire microlens array 55 in detail. In FIGS. 16A and 16B, various parts of the microlens array are indicated as the unit of mm (millimeter). In the pattern forming process according to the present invention, micromirrors of 1,024 rows×256 lines of DMD 50 are driven as explained above; microlens arrays 55 are correspondingly constructed as 1,024 arrays in length direction and 256 arrays in width direction. In FIG. 16A, the site of each microlens is expressed as "j" th line and "k" th row.

FIGS. 17A and 17B respectively show the front shape and side shape of one microlens 55a of microlens array 55. FIG. 17A also shows the contour lines of microlens 55a. The end surface of each microlens 55a of irradiating side is of a non-spherical shape to compensate the distortion aberration of reflective surface of micromirrors 62. Specifically, microlens 55a is a toric lens; the curvature radius of optical X direction Rx is –0.125 mm, and the curvature radius of optical Y direction Ry is –0.1 mm.

Accordingly, the collecting condition of laser beam B within the cross section parallel to the X and Y directions are approximately as shown in FIGS. 18A and 18B respectively. Namely, when comparing the laser beam B within the cross section parallel to the X direction and the laser beam B within the cross section parallel to the Y direction, the curvature radius of microlens 55a is shorter, and the focal length is also shorter in the Y direction.

FIGS. 19A, 19B, 19C, and 19D show the simulations of beam diameter near the focal point of microlens 55a in the above noted shape by means of a computer. For the reference, FIGS. 20A, 20B, 20C, and 20D show the similar simulations for microlens in a spherical shape of Rx=Ry=–0.1 mm. The values of "z" in the figures are expressed as the evaluation sites in the focus direction of microlens 55a by the distance from the beam irradiating surface of microlens 55a.

The surface shape of microlens 55a in the simulation may be calculated by the following equation (1).

$$Z = \frac{C_x^2 X^2 + C_y^2 Y^2}{1 + SQRT(1 - C_x^2 X^2 - C_y^2 Y^2)}$$

In the above equation, Cx means the curvature (=1/Rx) in X direction, Cy means the curvature (=1/Ry) in Y direction, X means the distance from optical axis O in X direction, and Y means the distance from optical axis O in Y direction.

From the comparison of FIGS. 19A to 19D, and FIGS. 20A to 20D, it is apparent in the pattern forming process according to the present invention that the employment of the toric lens as the microlens 55a that has a shorter focal length in the cross section parallel to Y direction than the focal length in the cross section parallel to X direction may reduce the distortion of the beam shape near the collecting site. Accordingly, images can be exposed on pattern forming material 150 with more clearness and without distortion. In addition, it is apparent that the inventive mode shown in FIGS. 19A to 19D may bring about a wider region with smaller beam diameter, i.e. longer focal depth.

When the larger or smaller distortion at the central region appears at the central region of micromirror 62 inversely with those set forth above, the employment of microlenses having a shorter focal length in the cross section parallel to X direction than the focal length in the cross section parallel to Y direction may make possible to expose images on pattern forming material 150 with more clearness and without distortion or distortion.

Aperture arrays 59 disposed near the collecting site of microlens array 55 are constructed such that each aperture 59a receives only the laser beam through the corresponding microlens 55a. Namely, aperture array 59 may afford the respective apertures with the insurance that the light incidence from the adjacent apertures 55a may be prevented and the extinction ratio may be enhanced.

Essentially, smaller diameter of apertures 59a provided for the above noted purpose may afford the effect to reduce the distortion of beam shape at the collecting site of microlens 55a. However, such a construction inevitably increases the optical quantity interrupted by the aperture array 59, resulting in lower efficiency of optical quantity. On the contrary, the non-spherical shape of microlenses 55a does not bring about the light interruption, thus the higher efficiency of optical quantity can be maintained.

In the pattern forming process explained above, microlens 55a of toric lens is applied which has different curvature radiuses in X and Y directions that respectively correspond to two diagonal directions of micromirror 62; alternatively, another microlens 55a' of toric lens may be applied which has different curvature radiuses in XX and YY directions that respectively correspond to two side directions of rectangular micromirror 62, as shown in FIGS. 38A and 38B that exhibit the front and side shapes with contour lines.

In the pattern forming process according to the present invention, the microlenses 55a may be non-spherical shape of secondary or higher order such as fourth or sixth. The employment of higher order non-spherical surface may lead to higher accuracy of beam shape.

In the mode set forth above, the end surface of irradiating side of microlens 55a is non-spherical or toric; alternatively, substantially the same effect may be derived by constructing one of the end surface as a spherical surface and the other surface as a cylindrical surface and thus providing the microlens.

Further, in the mode set forth above, each microlens 55a of microlens array 55 is non-spherical so as to compensate the aberration due to the distortion of reflective surface of micromirror 62; alternatively, substantially the same effect may be derived by providing each microlens of the microlens array with the distribution of refractive index so as to compensate the aberration due to the distortion of reflective surface of micromirror 62.

Figure 22A:
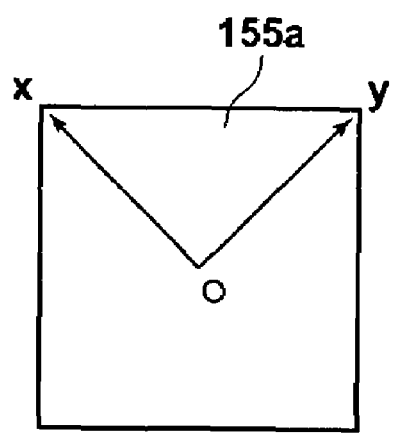
FIG. 22A is an exemplary front view that shows a microlens of a microlens array.
Figure 22B:
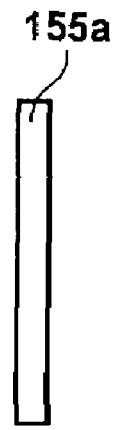
FIG. 22B is an exemplary side view that shows a microlens of a microlens array.

FIGS. 22A and 22B show exemplarily such a microlens 155a. FIGS. 22A and 22B respectively show the front shape and side shape of microlens 155a. The entire shape of microlens 155a is a planar plate as shown in FIGS. 22A and 22B. The X and Y directions in FIGS. 22A and 22B mean the same as set forth above.

Figure 23A:
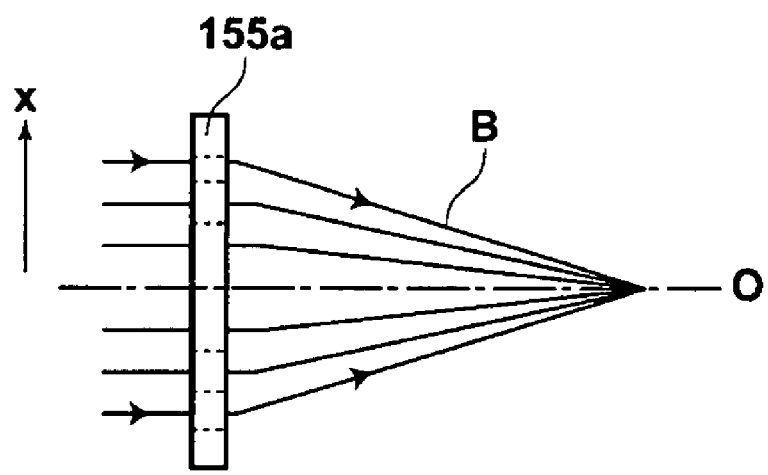
FIG. 23A is an exemplary view that schematically shows a laser collecting condition in the cross section of the microlens shown in FIGS. 22A and 22B.
Figure 23B:
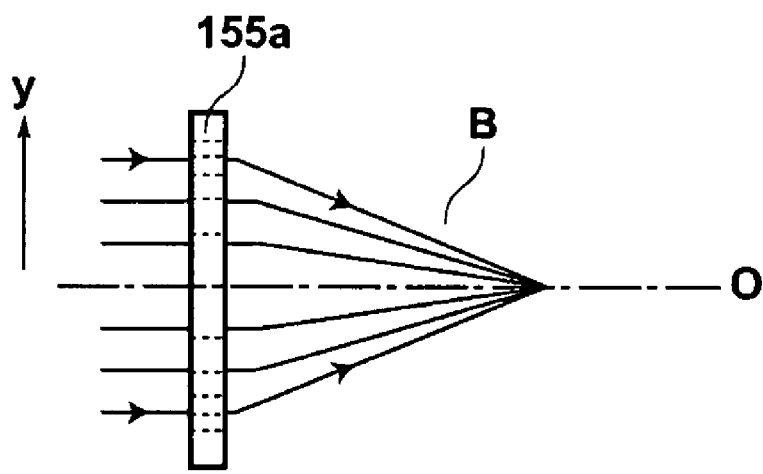
FIG. 23B is an exemplary view that schematically shows a laser collecting condition in another cross section of the microlens shown in FIG. 23A.

FIGS. 23A and 23B schematically show the condition to collect laser beam B by microlens 155a in the cross section parallel with X and Y directions respectively. The microlens 155a exhibits a refractive index distribution that the refractive index gradually increases from the optical axis O to outward direction; the broken lines in FIGS. 23A and 23B indicate the positions where the refractive index decreases a certain level from that of optical axis O. As shown in FIGS. 23A and 23B, comparing the cross section parallel to the X direction and the cross section parallel to the Y direction, the latter represents a rapid change in the refractive index distribution, and shorter focal length. Thus, the microlens array having such a refractive index distribution may provide the similar effect as the microlens array 55 set forth above.

In addition, the microlens having a non-spherical surface as shown in FIGS. 17A, 17B, 18A and 18B may be provided with such a refractive index distribution, and both of the surface shape and the refractive index distribution may compensate the aberration due to distortion of the reflective surface of micromirror 62.

In the respective microlens array set forth above, the aberration due to distortion of reflective surface of micromirror 62 in DMD 50 is compensated; similarly, in the pattern forming process according to the present invention that employs a spatial light modulator other than DMD, the possible aberration due to distortion may be compensated and the distortion of beam shape may be prevented when the distortion appears at the surface of imaging portion of the spatial light modulator.

The imaging optical system set forth above will be explained in the following.

In the exposing head, when laser beam is applied from the laser source 144, the cross section of luminous flux reflected to on-direction by DMD 50 is magnified several times, e.g. two times, by lens systems 454, 458. The magnified laser beam is collected by each microlens of microlens array 472 correspondingly with each imaging portion of DMD 50, then passes through the corresponding apertures of aperture array 476. The laser beam passed through the aperture is imaged on exposed surface 56 by lens systems 480 and 482.

In the imaging optical system, the laser beam reflected by DMD 50 is magnified into several times by magnifying lenses 454, 458, and is projected onto exposed surface 56, therefore, the entire image region is enlarged. When microlens array 472 and aperture array 476 are not disposed, one drawing size or spot size of each beam spot BS projected on exposed surface 56 is enlarged depending on the size of exposed area 468, thus MTF (modulation transfer function) property that is a measure of sharpness at exposing area 468 is decreased, as shown in FIG. 13B.

On the other hand, when microlens array 472 and aperture array 476 are disposed, the laser beam reflected by DMD 50 is collected correspondingly with each imaging portion of DMD 50 by each microlens of microlens array 472. Thereby, the spot size of each beam spot BS may be reduced into the desired size, e.g. 10 μm×10 μm even when the exposing area is magnified, as shown in FIG. 13C, and the decrease of MFT property may be prevented and the exposure may be carried out with higher accuracy. Inclination of exposing area 468 is caused by the DMD 50 that is disposed with inclination in order to eliminate the spaces between imaging portions.

Further, even when beam thickening exists due to aberration of microlenses, the beam shape may be arranged by the aperture array so as to form spots on exposed surface 56 with a constant size, and interference or cross talk between the adjacent imaging portions may be prevented by passing the beam through the aperture array provided correspondingly to each imaging portion.

In addition, employment of higher luminance laser source as laser source 144 may lead to prevention of partial entrance of luminous flux from adjacent imaging portions, since the angle of incident luminous flux that enters into each microlens of microlens array 472 from lens 458 is narrowed; namely, higher extinction ratio may be achieved.

—Other Optical System—

In the pattern forming process according to the present invention, the other optical system suitably selected from among conventional optical systems may be combined, for example, an optical system to compensate the optical quantity distribution may be employed additionally.

The optical system to compensate the optical quantity distribution alters the luminous flux width at each output site such that the ratio of the luminous flux width at the periphery region to the luminous flux width at the central region near the optical axis is higher in the output side than the input side, thus the optical quantity distribution at the exposed surface is compensated to be approximately constant when the parallel luminous flux from the light irradiation unit is irradiated to DMD. The optical system to compensate the optical quantity distribution will be explained with reference to figures in the following.

Initially, the optical system will be explained as for the case where the entire luminous flux widths H0 and H1 are the same between the input luminous flux and the output luminous flux, as shown in FIG. 23A. The portions denoted by reference numbers 51, 52 in FIG. 23A indicate imaginarily the input surface and output surface of the optical system to compensate the optical quantity distribution.

In the optical system to compensate the optical quantity distribution, it is assumed that the luminous flux width h0 of the luminous flux entered at central region near the optical axis Z1 and luminous flux width h1 of the luminous flux entered at peripheral region near are the same (h0=h1). The optical system to compensate the optical quantity distribution affects the laser beam that has the same luminous fluxes h0, h1 at the input side, and acts to magnify the luminous flux width h0 for the input luminous flux at the central region, and acts to reduce the luminous flux width h1 for the input luminous flux at the periphery region conversely. Namely, the optical system affects the output luminous flux width h10 at the central region and the output luminous flux width h11 at the periphery region to turn into h11<h10. In other words concerning the ratio of luminous flux width, (output luminous flux width at periphery region)/(output luminous flux width at central region) is smaller than the ratio of input, namely [h11/h10] is smaller than (h1/h0=1) or (h11/h10<1).

Owing to alternation of the luminous flux width, the luminous flux at the central region representing higher optical quantity may be supplied to the periphery region where the optical quantity is insufficient; thereby the optical quantity distribution is approximately uniformed at the exposed surface without decreasing the utilization efficiency. The level for uniformity is controlled such that the nonuniformity of optical quantity is 30% or less in the effective region for example, preferably is 20% or less.

Figure 24A:
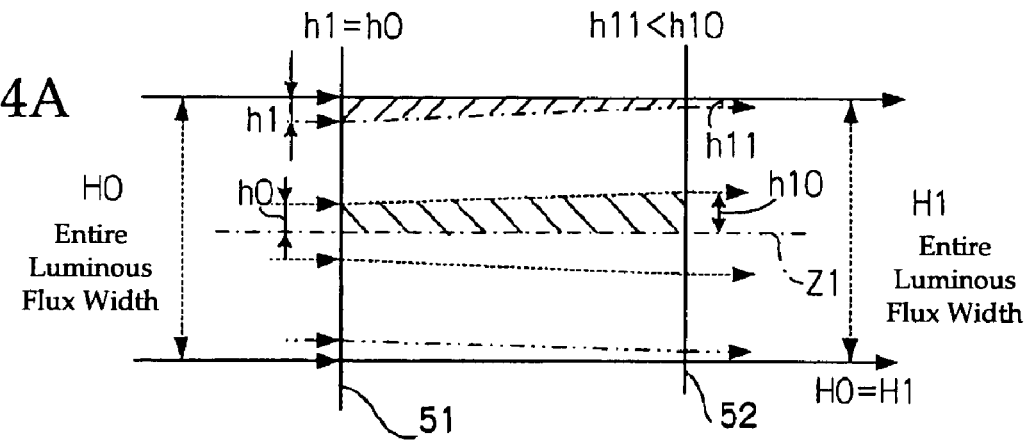
FIG. 24A is an exemplary view that explains the concept of compensation by an optical system of optical quantity distribution compensation.
Figure 24B:
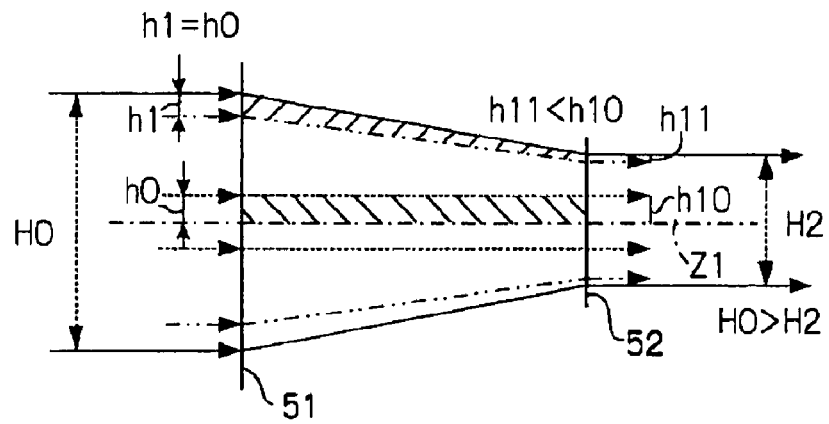
FIG. 24B is another exemplary view that explains the concept of compensation by an optical system of optical quantity distribution compensation.
Figure 24C:
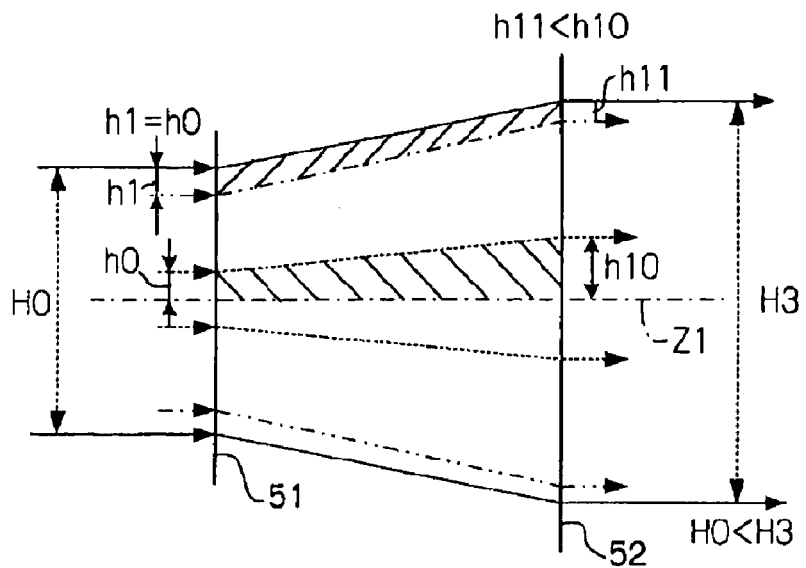
FIG. 24C is another exemplary view that explains the concept of compensation by an optical system of optical quantity distribution compensation.

When the luminous flux width is entirely altered for the input side and the output side, the operation and effect due to the optical system to compensate the optical quantity distribution are similar to those shown in FIGS. 24B, and 24C.

FIG. 24B shows the case that the entire optical flux bundle H0 is reduced and outputted as optical flux bundle H2 (H0>H2). In such a case, the optical system to compensate the optical quantity distribution also tends to process the laser beam, in which luminous flux width h0 is the same as h1 at input side, into that the luminous flux width h10 at the central region is larger than that of the periphery region and the luminous flux width h11 is smaller than that of the central region in the output side. Considering the reduction ratio of the luminous flux, the optical system affects to decrease the reduction ratio of input luminous flux at the central region compared to the peripheral region, and affects to increase the reduction ratio of input luminous flux at the peripheral region compared to the central region. In the case, (output luminous flux width at periphery region)/(output luminous flux width at central region) is also smaller than the ratio of input, namely [H11/H10] is smaller than (h1/h0=1) or (h11/h10<1).

FIG. 24C explains the case where the entire luminous flux width H0 at input side is magnified and output into width H3 (H0<H3). In such a case, the optical system to compensate the optical quantity distribution also tends to process the laser beam, in which luminous flux width h0 is the same as h1 at input side, into that the luminous flux width h10 at the central region is larger than that of the periphery region and the luminous flux width h11 is smaller than that of the central region in the output side. Considering the magnification ratio of the luminous flux, the optical system acts to increase the magnification ratio of input luminous flux at the central region compared to the peripheral region, and acts to decrease the magnification ratio of input luminous flux at the peripheral region compared to that at the central region. In the case, (output luminous flux width at periphery region)/(output luminous flux width at central region) is also smaller than the ratio of input, namely [H11/H10] is smaller than (h1/h0=1) or (h11/h10<1).

As such, the optical system to compensate the optical quantity distribution alters the luminous flux width at each output site, and lowers the ratio (output luminous flux width at periphery region)/(output luminous flux width at central region) at output side compared to the input side; therefore, the laser beam having the same luminous flux turns into the laser beam at output side that the luminous flux width at central region is larger than that at the peripheral region and the luminous flux at the peripheral region is smaller than that at the central region. Owing to such effect, the luminous flux at the central region may be supplied to the periphery region, thereby the optical quantity distribution is approximately uniformed at the luminous flux cross section without decreasing the utilization efficiency of the entire optical system.

Next, specific lens data of a pair of combined lenses to be utilized for the optical system to compensate the optical quantity distribution will be exemplarily set forth. In this discussion, the lens data will be explained in the case that the optical quantity distribution shows Gaussian distribution at the cross section of the output luminous flux, such as the case that the laser source is a laser array as set forth above. In a case that one semiconductor laser is connected to an input end of single mode optical fiber, the optical quantity distribution of output luminous flux from the optical fiber shows Gaussian distribution. The pattern forming process according to the present invention may be applied, in addition, to such a case that the optical quantity near the central region is significantly larger than the optical quantity at the peripheral region as in the case where the core diameter of multimode optical fiber is reduced and constructed similarly to a single mode optical fiber, for example.

The essential data for the lens are summarized in Table 1 below.

TABLE 1

Basic Lens Data

| Si (surface No.) | ri (curvature radius) | di (surface distance) | Ni (refractive index) |
|---|---|---|---|
| 0 1 | non-spherical | 5.000 | 1.52811 |
| 0 2 | ∞ | 50.000 | |
| 0 3 | ∞ | 7.000 | 1.52811 |
| 0 4 | non-spherical | | |

As demonstrated in Table 1, a pair of combined lenses is constructed from two non-spherical lenses of rotational symmetry. The surfaces of the lenses are defined that the surface of input side of the first lens disposed at the light input side is the first surface; the opposite surface at light output side is the second surface; the surface of input side of the second lens disposed at the light input side is the third surface; and the opposite surface at light output side is the fourth surface. The first and the fourth surfaces are non-spherical.

In Table 1, 'Si (surface No.)' indicates "i" th surface (i=1 to 4), 'ri (curvature radius)' indicates the curvature radius of the "i" th surface, di (surface distance) means the surface distance between "i" th surface and "i+1" surface. The unit of di (surface distance) is millimeter (mm). Ni (refractive index) means the refractive index of the optical element containing "i" th surface for the light of wavelength 405 nm.

In Table 2 below, the non-spherical data of the first and the fourth surface is summarized.

TABLE 2

| | non-spherical data | |
|---|---|---|
| | first surface | fourth surface |
| C | $-1.4098 \times 10^{-2}$ | $-9.8506 \times 10^{-3}$ |
| K | $-4.2192$ | $-3.6253 \times 10$ |
| a3 | $-1.0027 \times 10^{-4}$ | $-8.9980 \times 10^{-5}$ |
| a4 | $3.0591 \times 10^{-5}$ | $2.3060 \times 10^{-5}$ |
| a5 | $-4.5115 \times 10^{-7}$ | $-2.2860 \times 10^{-6}$ |
| a6 | $-8.2819 \times 10^{-9}$ | $8.7661 \times 10^{-8}$ |
| a7 | $4.1020 \times 10^{-12}$ | $4.4028 \times 10^{-10}$ |
| a8 | $1.2231 \times 10^{-13}$ | $1.3624 \times 10^{-12}$ |
| a9 | $5.3753 \times 10^{-16}$ | $3.3965 \times 10^{-15}$ |
| a10 | $1.6315 \times 10^{-18}$ | $7.4823 \times 10^{-18}$ |

The non-spherical data set forth above may be expressed by means of the coefficients of the following equation (A) that represent the non-spherical shape.

$$Z = \frac{C \cdot \rho^2}{1 + \sqrt{1 - K \cdot (C \cdot \rho)^2}} + \sum_{i=3}^{10} ai \cdot \rho^i \qquad (A)$$

In the above formula (A), the coefficients are defined as follows:
Z: length of perpendicular that extends from a point on non-spherical surface at height ρ from optical axis (mm) to tangent plane at vertex of non-spherical surface or plane vertical to optical axis;
ρ: distance from optical axis (mm);

K: coefficient for circular conic;

C: paraxial curvature (1/r, r: radius of paraxial curvature);

ai: "i" st non-spherical coefficient (i=3 to 10).

For example, "1.0E02" means "$1.0 \times 10^{-2}$".

Figure 25:
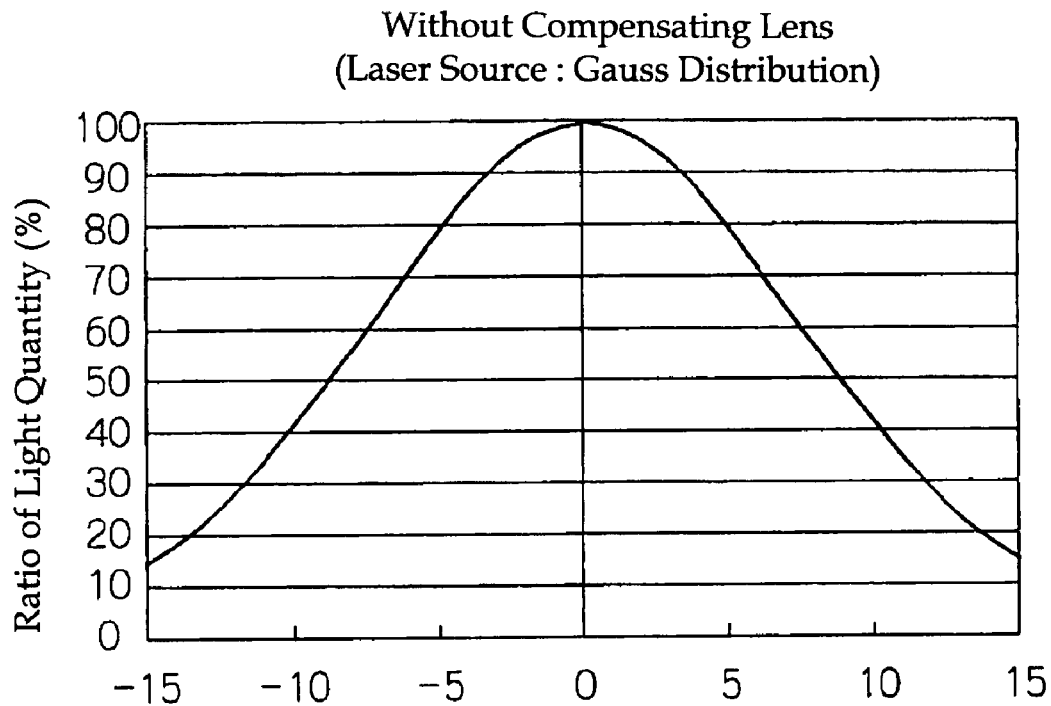
FIG. 25 is an exemplary graph that shows an optical quantity distribution of Gaussian distribution without compensation of optical quantity.
Figure 26:
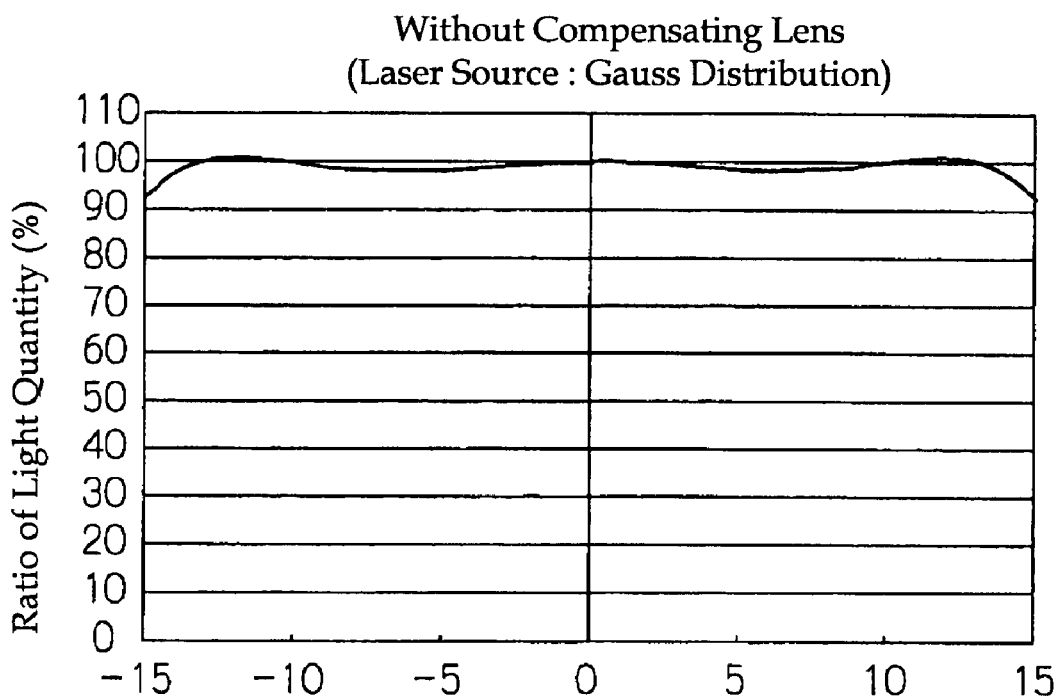
FIG. 26 is an exemplary graph that shows a compensated optical quantity distribution by an optical system of optical quantity distribution compensation.

FIG. 26 shows the optical quantity distribution of illumination light obtained by a pair of combined lenses shown in Table 1 and Table 2. The abscissa axis represents the distance from the optical axis, the ordinate axis represents the proportion of optical quantity (%). FIG. 25 shows the optical quantity distribution (Gaussian distribution) of illumination light without the compensation. As is apparent from FIGS. 25 and 26, the compensation by means of the optical system to compensate the optical quantity distribution brings about an approximately uniform optical quantity distribution significantly exceeding the optical quantity distribution obtained without the compensation, thus uniform exposing may be achieved by means of uniform laser beam without decreasing the optical utilization efficiency.

—Other Steps—

The other steps are not particularly limited and may be suitably selected from among the steps in known pattern forming steps, and examples thereof include developing, etching, and plating. Each of these steps may be used alone or may be combined with two or more.

In the developing step, a photosensitive layer in the pattern forming material is exposed in the exposing step, exposed areas of the photosensitive layer are hardened, and unhardened regions are removed, thereby developing the photosensitive layer surface to form a pattern.

The developing is preferably performed using, for example, a developing unit.

The developing unit is not particularly limited and may be suitably selected in accordance with the intended use as long as the developing unit can develop a photosensitive layer using a developer. Examples there of include a unit configured to spray the developer, a unit configured to apply the developer, and a unit configured to immerse a pattern forming material in the developer. Each of these developing units may be used alone or in combination with two or more.

The developing unit may be equipped with a developer exchange unit configured to exchange the developer, and a developer supplying unit configured to supply the developer.

The developer is not particularly limited and may be suitably selected in accordance with the intended use; examples of the developers include alkaline aqueous solutions, aqueous developing liquids, and organic solvents; among these, weak alkali aqueous solutions are preferable. The basic components of the weak alkali aqueous solutions are exemplified by lithium hydroxide, sodium hydroxide, potassium hydroxide, lithium carbonate, sodium carbonate, potassium carbonate, lithium hydrogencarbonate, sodium hydrogencarbonate, potassium hydrogencarbonate, sodium phosphate, potassium phosphate, sodium pyrophosphate, potassium pyrophosphate, and borax.

The weak alkali aqueous solution preferably exhibits a pH of about 8 to 12, more preferably about 9 to 11. Examples of such a solution are aqueous solutions of sodium carbonate and potassium carbonate at a concentration of 0.1% by mass to 5% by mass. The temperature of the developer may be properly selected depending on the developing ability of the developer; for example, the temperature of the developer is about 25° C. to 40° C.

The developer may be combined with surfactants, defoamers; organic bases such as ethylene diamine, ethanol amine, tetramethylene ammonium hydroxide, diethylene triamine, triethylene pentamine, morpholine, and triethanol amine; organic solvents to promote developing such as alcohols, ketones, esters, ethers, amides, and lactones. The developer set forth above may be an aqueous developer selected from aqueous solutions, aqueous alkali solutions, combined solutions of aqueous solutions and organic solvents, or an organic developer.

The etching may be carried out by a method selected properly from conventional etching methods.

The etching liquid used in the etching method is not particularly limited and may be suitably selected in accordance with the intended use; when the metal layer set forth above is formed of copper, exemplified are cupric chloride solution, ferric chloride solution, alkali etching solution, and hydrogen peroxide solution for the etching liquid; among these, ferric chloride solution is preferred in light of the etching factor.

The etching treatment and the removal of the pattern forming material may form a permanent pattern on the substrate. The permanent pattern is not particularly limited and may be suitably selected in accordance with the intended use; for example, the pattern is of interconnection.

The plating step may be performed by a method selected from conventional plating treatment methods.

Examples of the plating treatment include copper plating such as copper sulfate plating and copper pyrophosphate plating; solder plating such as high flow solder plating; nickel plating such as watt bath (nickel sulfate-nickel chloride) plating and nickel sulfamate plating; and gold plating such as hard gold plating and soft gold plating.

A permanent pattern may be formed by performing a plating treatment in the plating step, followed by removing the pattern forming material and optional etching treatment on unnecessary portions.

[Method for Producing Printed Wiring Board]

The pattern forming process according to the present invention may be successfully applied to the production of printed wiring boards, particularly in the production of printed wiring boards having through holes or via holes. The process for producing printed wiring boards based on the pattern forming process according to the present invention will be exemplarily explained in the following.

—Method for Producing Printed Wiring Board—

In process for producing printed wiring boards having through holes and/or via holes, a pattern may be formed by (1) laminating the pattern forming material on a substrate of a printed wiring board having holes such that the photosensitive layer faces the substrate thereby to form a laminate, (2) irradiating a light onto the regions for forming interconnection patterns and holes from the opposite side of the substrate of the laminate thereby to harden the photosensitive layer, (3) removing the support of the pattern forming material from the laminate, and (4) developing the photosensitive layer of the laminate to remove unhardened regions in the laminate.

Removing of the support of (3) may be carried out between the (1) and (2) instead of between (2) and (4) set forth above.

Then, using the formed pattern, etching treatment or plating treatment of the substrate of the printed wiring board by means of conventional subtractive or additive method e.g. semi-additive or full-additive method may produce a printed wiring board. Among these methods, the subtractive method is preferable in order to form printed wiring boards by industrially advantageous tenting. After the treatment, the hardened resin remaining on the substrate of the printed wiring board is peeled off, or copper thin film is etched after the peeling in the case of semi-additive process, thereafter the intended printed wiring board is obtained. In the case of multi-layer printed wiring board, the similar process with the printed wiring board may be applicable.

The process for producing printed wiring boards having through holes by means of the pattern forming material will be explained in the following.

Initially, the substrate of printed wiring board is prepared in which the surface of the substrate is covered with a metal plating layer. The substrate of printed wiring board may be a copper-laminated layer substrate, a substrate that is produced by forming a copper plating layer on an insulating substrate such as glass or epoxy resin, or a substrate that is laminated on these substrate and formed into a copper plating layer.

In a case where a protective layer exists on the pattern forming material, the protective film is peeled, and the photosensitive layer of the pattern forming material is contact bonded to the surface of the printed wiring board by means a pressure roller as a laminating process, thereby a laminate may be obtained that contains the substrate of the printed wiring board and the laminate set forth above.

The laminating temperature of the pattern forming material may be properly selected without particular limitations; the temperature may be about room temperature such as 15° C. to 30° C., or higher temperature such as 30° C. to 180° C., preferably it is substantially warm temperature such as 60° C. to 140° C.

The roll pressure of the contact bonding roll may be properly selected without particular limitations; preferably the pressure is 0.1 MPa to 1 MPa; the velocity of the contact bonding may be properly selected without particular limitations, preferably, the velocity is 1 meter/m to 3 meters/m.

The substrate of the printed wiring board may be preheated before the contact bonding; and the substrate may be laminated under a reduced pressure.

The laminate may be formed by laminating the pattern forming material on the substrate of the printed wiring board; alternatively by coating the solution of the photosensitive resin composition for pattern forming material directly on the substrate of the printed wiring board, followed by drying the solution, thereby laminating the photosensitive layer and the support on the substrate of the printed wiring board.

In the process, in accordance with the necessity, for example, when the light transmission of the support is insufficient, the support may be exfoliated before the exposing process.

In the case that the support exists on the support after the laser irradiation, the support is peeled from the laminate as the support peeling step.

The unhardened regions of the photosensitive layer on the substrate of the printed wiring board are dissolved away by means of an appropriate developer, a pattern is formed that contains a hardened layer for forming an interconnection pattern and a hardened layer for protecting a metal layer of through holes, and the metal layer is exposed at the substrate surface of the printed wiring board as the developing step.

Additional treatment to promote the hardening reaction, for example, may be performed by means of post-heating or post-exposing optionally. The developing may be of a wet method set forth above or a dry developing method.

Then, the metal layer exposed on the substrate surface of the printed wiring board is dissolved away by an etching liquid as an etching process. The apertures of the through holes are covered by hardened resin or tent film, therefore, the etching liquid does not infiltrate into the through holes to corrode the metal plating within the through holes, and the metal plating may maintain the specific shape, thus an interconnection pattern may be formed on the substrate of the printed wiring board.

The etching liquid may be properly selected depending on the application; cupric chloride solution, ferric chloride solution, alkali etching solution, and hydrogen peroxide solution are exemplified for the etching liquid when the metal layer set forth above is formed of copper; among these, ferric chloride solution is preferred in light of the etching factor.

Then, the hardened layer is removed from the substrate of the printed wiring board by means of a strong alkali aqueous solution for example as the removing step of hardened material.

The basic component of the strong alkali aqueous solution may be properly selected without particular limitations, examples of the basic component include sodium hydroxide and potassium hydroxide. The pH of the strong alkali aqueous solution may be about 12 to 14 for example, preferably about 13 to 14. The strong alkali aqueous solution may be an aqueous solution of sodium hydroxide or potassium hydroxide at a concentration of 1 to 10% by mass.

The printed wiring board may be of multi-layer construction. By the way, the pattern forming material set forth above may be applied to plating processes instead of the etching process set forth above. The plating method may be copper plating such as copper sulfate plating and copper pyrophosphate plating; solder plating such as high flow solder plating; nickel plating such as watt bath (nickel sulfate-nickel chloride) plating and nickel sulfamate plating; and gold plating such as hard gold plating and soft gold plating.

—Method for Producing Color Filter—

A photosensitive layer in the pattern forming material is laminated on a substrate such as a glass substrate while peeling off a protective film from the photosensitive layer, and a support is peeled off from the pattern forming material.

Next, the photosensitive layers are colored in red, green, blue, and black, respectively to thereby prepare a patter forming material having a red photosensitive layer, a pattern forming material having a green photosensitive layer, a pattern forming material having a blue photosensitive layer, and a pattern forming material having a black photosensitive layer. Using the pattern forming material having the red photosensitive layer for red pixels, the red photosensitive layer is laminated on the substrate surface to form a laminate on the substrate. Thereafter, the photosensitive layer is imagewisely exposed and developed to form red pixels. After forming the red pixels, the laminate is heated to harden unhardened regions. The process is similarly applied to green and blue pixels to form respective color pixels.

The laminate may be prepared by laminating the pattern forming material on the glass substrate. Alternatively, the laminate may be formed by directly applying the photosensitive resin composition solution for producing a pattern forming material over a surface of the glass substrate, drying the substrate surface, and forming a protective film on the glass substrate surface. When three types of pixels in red, green, and blue are arranged, any arrays such as a mosaic array, a triangle array, and four-pixel array may be employed.

The pattern forming material having the black photosensitive layer is laminated on a laminate surface with black pixels formed thereon, and the laminate is exposed from the back surface with no pixel formed thereon and developed to form a black matrix. The laminate with the black matrix formed thereon is heated to harden unhardened regions, thereby a color filter can be produced.

In the pattern forming process and the pattern forming apparatus of the present invention, a pattern forming material is used which is capable of suppressing generation of wrinkles and static electric charge on a substrate in a lamination step of laminating the pattern forming material on the substrate as well as capable of forming a fine and precise pattern, it is advantageous in that the photosensitive layer can be exposed with a light beam in a small optical energy amount because the pattern forming material enables to prevent photosensitivity of the photosensitive layer from decreasing in photosensitivity of the photosensitive layer, and the processing speed is increased because of increased exposure speed.

Since the pattern forming process of the present invention employs the pattern forming material of the present invention, it can be preferably used in forming various patterns, in forming permanent patterns such as interconnection pattern, in producing members having a liquid crystal structure such as color filters, column members, rib members, spacers, and partition members, and in forming patterns such as hologram, micromachine, and proof. The pattern forming process is particularly preferably used in forming a fine and precise interconnection pattern. Since the pattern forming apparatus of the present invention is provided with the pattern forming material of the present invention, it can be it can be preferably used in forming various patterns, in forming permanent patterns such as interconnection pattern, in producing members having a liquid crystal structure such as color filters, column members, rib members, spacers, and partition members, and in forming patterns such as hologram, micromachine, and proof. The pattern forming apparatus is particularly preferably used in forming a fine and precise interconnection pattern.

EXAMPLES

Hereafter, the present invention will be further described in detail referring to specific Examples and Comparative Examples, however, the present invention is not limited to the disclosed Examples.

Example 1

—Production of Pattern Forming Material—

A photosensitive resin composition solution composed of the following composition was applied over a surface of a polyethylene terephthalate film having a thickness of 16 μm (16QS52 manufactured by Toray Industries, Inc.) as the above-noted support, and the support surface was dried to form a photosensitive layer having a thickness of 15 μm on the support, thereby a pattern forming material was produced.

[Composition of Photosensitive Resin Composition Solution]

| | |
|---|---|
| Phenothiazine | 0.0049 parts by mass |
| Methacrylic acid/methylacrylate/styrene copolymer (copolymer composition (mass ratio): 29/19/52; mass average molecular mass: 65,000; acid value: 189) | 11.8 parts by mass |
| Polymerizable monomer represented by the following Structural Formula (75) | 5.6 parts by mass |

-continued

[Composition of Photosensitive Resin Composition Solution]

| | |
|---|---|
| ½ molar ratio adduct of hexamethylenediisocyanate and tetraethylene oxide monomethacrylate | 5.0 parts by mass |
| Dodecapropylene glycol diacrylate | 0.56 parts by mass |
| 2,2-bis(o-chlorophenyl)-4,4'5,5'-tetraphenylbiimidazole | 1.7 parts by mass |
| 10-butyl-2-chloroacridone | 0.09 parts by mass |
| Malachite green oxalate | 0.016 parts by mass |
| Leucocrystal violet | 0.1 parts by mass |
| Methylethylketone | 40 parts by mass |
| 1-methoxy-2-propanol | 20 parts by mass |
| Fluorochemical surfactant | 0.021 parts by mass |

(F780F manufactured by Dainippon Ink and Chemicals, Inc.)

It should be noted that the phenothiazine serves as the polymerization inhibitor stated above and is a compound having an aromatic ring, a heterocyclic ring, and an imino group in the molecule.

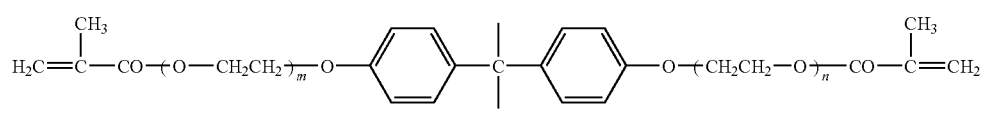

Structural Formula (75)

In the Structural Formula (75), m+n is an integer of 10.

On the photosensitive layer in the pattern forming material, a polypropylene film having a thickness of 12 μm (the number of fish-eyes each having an area of 2,000 μm$^2$ or more and a maximum height of 1 μm to 7 μm measured from the film surface was 185/m$^2$) was laminated as the above-noted protective film.

Next, a copper clad laminate (having a copper thickness of 12 μm and no through hole) was used as the above-noted substrate, the substrate surface was polished, washed, and dried. On the substrate surface, the pattern forming material was laminated using an autocut laminator (Mach-630up manufactured by Hakuto Co., Ltd.) while peeling off the protective film of the pattern forming material to thereby prepare a laminate in which the copper clad laminate, the photosensitive layer, and the polyethylene terephthalate film (support) were laminated in this order on the substrate.

The pressure bonding conditions of the laminate were set as follows:

Pressure roller temperature: 100° C., without preheating, tacking temperature: 50° C., tacking time: 4 seconds, air pressure of 0.4 MPa, and laminating rate of 2 m/min.

Table 3 shows the number of fish-eyes each having an area of 2,000 μm$^2$ or more and a maximum height of 1 μm to 7 μm measured from the film surface in the pattern forming material.

The pattern forming material was evaluated in terms of charged state at the time of peeling off the protective film, and the surface resistance value of the support was measured. Table 3 shows the results.

The laminate was evaluated in terms of presence or absence of laminate wrinkles, photosensitivity, resolution, and presence or absence of pattern defects. Table 3 shows the evaluation results.

<Number of Fish-Eyes>

The film used as a protective film was cut out into 40 cm×40 cm square piece, the film in the range of 0.02 m² to 0.05 m² of the cut piece was observed using an optical microscope at 100 times magnification to find fish-eyes. Found fish-eyes each having a maximum length of 80 μm or more were marked with a permanent marker.

Next, the area, maximum height from the film surface, and maximum length of the marked fish-eyes were measured using a laser microscope (VK-9500 manufactured by KEYENCE CORPORATION). The number of fish-eyes each having an area of 2,000 μm or more and a maximum height of 1 μm to 7 μm was counted, and the counted number of fish-eyes was converted as the number of fish-eyes contained in 1 m² of the film. Table 3 shows the results.

<Evaluation on Charged State>

The pattern forming material rolled in a roll shape was left and stored under the conditions of 23° C. and a relative humidity of 10% for 7 days, and then the protective film was peeled off from the pattern forming material at a peeling rate of 10 m/min. For the charged amount of the pattern forming material after peeling-off the protective film, the peeled surface of the protective film was visually checked to evaluate presence or absence of dust adherence. It is preferable that static charge is not generated and no dust adherence occurs on the peeled surface of the protective film.

<Surface Resistance>

The pattern forming material was left and stored under the conditions of 10° C. and a relative humidity of 35% for 6 hours, and then the surface resistance of the support surface on which the photosensitive layer was not laminated was measured using a surface resistance meter (R8340 ultra high resistance meter, R12704 resistivity chamber manufactured by ADVANTEST CORPORATION). Table 3 shows the measurement results.

<Presence or Absence of Generated Wrinkles Found by Means of Autocut Laminator>

Using an autocut laminator (Mach-630up manufactured by Hakuto Co., Ltd.), 10 sheets of the pattern forming material were sequentially laminated under the conditions of pressure roller temperature: 100° C., without preheating, tacking temperature: 50° C., tacking time: 4 seconds, air pressure of 0.4 MPa, and laminating rate of 2 m/min. The tenthly laminated sheet was used as a sample and visually checked in terms of presence or absence of generated wrinkles and evaluated based on the following criteria. Table 3 shows the evaluation results.

A: No wrinkle was found in the sample.
B: Wrinkles were found at 1 to 2 sites in the sample.
C: Wrinkles were found at 3 to 5 sites in the sample.
D: Wrinkles were found at 6 or more sites in the sample.

<Resolution>

(1) Measurement of Shortest Developing Time

The support was peeled off from the laminate, 1% by mass sodium carbonate aqueous solution of 30° C. was sprayed over the entire surface of the photosensitive layer on the copper clad laminate under a pressure of 0.15 MPa, the time required from the start of spraying the sodium carbonate aqueous solution till the photosensitive layer on the copper clad laminate was dissolved and removed was measured, and the required time was taken as the shortest developing time.

(2) Measurement of Photosensitivity

The photosensitive layer of the pattern forming material in the laminate was exposed by irradiating the pattern forming material with a light beam in different optical energy amounts ranging from 0.1 mJ/cm² to 100 mJ/cm² at intervals of $2^{1/2}$ times from the support side using a pattern forming apparatus equipped with a laser light source having a wavelength of 405 nm as the light irradiation unit to thereby harden part of regions of the photosensitive layer. After the laminate was left at room temperature for 10 minutes, the support was peeled off from the laminate, a sodium carbonate aqueous solution (30° C., 1% by mass) was sprayed over the surface of the photosensitive layer formed on the copper clad laminate under a spray pressure of 0.15 MPa for twice the shortest developing time determined in the measurement of the shortest developing time (1) to dissolve and remove the unhardened regions. Then, the thickness of the hardened region other than the regions removed in the developing was measured. Next, the relation between the optical amount of irradiation and the thickness of the hardened layer was plotted to obtain a photosensitivity curve. Based on the thus obtained photosensitivity curve, the optical energy amount output when the thickness of the hardened regions was 15 μm was taken as the smallest optical energy amount (photosensitivity) required to harden the photosensitive layer. Table 3 shows the results.

<Resolution>

A laminate was prepared in the same manner and under the same conditions as used in the evaluation of the shortest developing time (1) described above, and the laminate was left intact at room temperature (23° C., 55% RH) for 10 minutes. The obtained laminate was exposed from the support side using the pattern forming apparatus at respective line widths of a line/space=1/1 ranging from a line width of 5 μm to 20 μm at 5 μm intervals. The exposure dose used when the laminate was exposed at the respective line widths was the optical energy amount required to harden the photosensitive layer in the pattern forming material determined in the measurement of photosensitivity (2). The laminate was left intact at room temperature for 10 minutes, and then the polyethylene terephthalate film (support) was peeled off from the laminate. A sodium carbonate aqueous solution (30° C., 1% by mass) was sprayed as the above-noted developer over the entire surface of the photosensitive layer formed on the copper clad laminate under a spray pressure of 0.15 MPa for twice the shortest developing time determined in the measurement of the shortest developing time (1) to thereby dissolve and remove unhardened regions. The surface of the thus obtained copper clad laminate with the hardened resin pattern formed thereon was observed using an optical microscope, and within the lines of the hardened resin pattern, the smallest line width involving no abnormality such as blocked line portions and wavy line portions was measured. The smallest line width was taken as the resolution. The smaller value of resolution indicates the more excellent resolution. Table 3 shows the results.

<Pattern Defect>

The surface (50 μm×50 μm) of the pattern formed in the measurement of resolution was observed to take an image using a scanning electron microscope (SEM) to evaluate the shape of the surface of the formed resist based on the following evaluation criteria. Table 3 shows the results.

—Evaluation Criteria—

A . . . No defect was found, or 1 to 5 defects were found, however, the defects did not affect the shape of the formed pattern, and disconnection was not observed in the etched interconnection pattern.

B . . . . Defects more than 5 were found, the defects caused shape abnormality at end faces of the pattern.

Example 2

A pattern forming material and a laminate were produced in the same manner as in Example 1 except that the protective film was changed to a polypropylene film having a thickness of 12 μm (the number of fish-eyes having an area of 2,000 μm$^2$ or more and a maximum height of 1 μm to 7 μm measured from the film surface was 14/m$^2$).

With respect to the pattern forming material, the charged state at the time of peeling off the protective film and the surface resistance value of the support were measured. Table 3 shows the measurement results.

Further, the laminate was evaluated in terms of presence or absence of laminate wrinkles, photosensitivity, resolution, and presence or absence of pattern defects. Table 3 shows the evaluation results.

Example 3

A pattern forming material and a laminate were produced in the same manner as in Example 1 except that a conductive layer was formed on the support surface on which the photosensitive layer was not laminated according to the following method.

With respect to the pattern forming material, the charged state at the time of peeling off the protective film and the surface resistance value of the support were measured. Table 3 shows the measurement results.

Further, the laminate was evaluated in terms of presence or absence of laminate wrinkles, photosensitivity, resolution, and presence or absence of pattern defects. Table 3 shows the evaluation results.

—Formation of Conductive Layer—

Sixty five parts by weight of stannic chloride hydrate and 1.5 parts by weight of antimony trichloride were dissolved in 1,000 parts by weight of ethanol to obtain a uniformly dissolved solution. A sodium hydroxide aqueous solution of 1N was delivered by drops into the uniformly dissolved solution until the pH thereof was 3, and a co-precipitate prepared between colloidal tin dioxide and antimony oxide was left intact at 50° C. for 24 hours to obtain a red brown colloidal precipitate. After the precipitate was centrifugalized, water was added thereto to remove excessive ions, followed by three times of washing by means of centrifugation. Then, 100 parts by weight of the precipitate was mixed with 1,000 parts by weight of water, and the mixture was sprayed in a baking furnace heated at 650° C. to thereby obtain a bluish conductive material (metal oxide fine particles) having an average particle diameter of 0.15 μm. The conductive material was dispersed for 5 hours using a paint shaker (manufactured by Toyo Seizai Seisakusho) to obtain a conductive material dispersion.

| [Conductive Material Dispersion] | |
| --- | --- |
| Conductive material (metal oxide fine particles) obtained in the method described above | 200 parts by weight |

| -continued | |
| --- | --- |
| [Conductive Material Dispersion] | |
| Saran F-310 (vinylidene chloride copolymer manufactured by Asahi Dow Co., Ltd.) | 10 parts by weight |
| Methylethylketone | 150 parts by weight |

A coating solution for forming a conductive layer composed of the following composition was prepared using the conductive fine particle dispersion. The coating solution was applied over a surface of a polyethylene terephthalate film having a thickness of 100 μm such that the amount of dry coating was 1.3 g/m$^2$. Then, the film surface was dried at 130° C. for 2 minutes.

| [Coating solution for forming a conductive layer] | |
| --- | --- |
| Conductive fine particle dispersion described above | 15 parts by weight |
| Saran F-310 (vinylidene chloride copolymer manufactured by Asahi Dow Co., Ltd.) | 3 parts by weight |
| Methylethylketone | 100 parts by weight |
| Cyclohexanon | 20 parts by weight |
| m-cresol | 5 parts by weight |

Further, a hydrophobic polymer solution composed of the following composition was applied over a surface of the conductive layer such that the amount of dry coating was 0.2 g/m$^2$. Then, the conductive layer surface was dried at 130° C. for 1 minute to form a hydrophobic polymer layer.

| [Hydrophobic polymer solution] | |
| --- | --- |
| Cellulose triacetate | 1 part by weight |
| Methylene dichloride | 60 parts by weight |
| Ethylene dichloride | 40 parts by weight |
| Erucic acid amide | 0.01 parts by weight |

The electrical surface resistance value of the support with the conductive layer and the hydrophobic polymer layer formed thereon was measured using an insulation resistance meter (VE-30 manufactured by Kawaguchi Denkyoku K.K.), and the electrical surface resistance was $7 \times 10^8 \Omega$ under the conditions of 25° C. and 25% RH.

Example 4

A pattern forming material and a laminate were produced in the same manner as in Example 1 except that a compound represented by the following Structural Formula (76) was added, instead of dodecapropylene glycol diacrylate, in the photosensitive resin composition solution.

With respect to the pattern forming material, the charged state at the time of peeling off the protective film and the surface resistance value of the support were measured. Table 3 shows the measurement results.

Further, the laminate was evaluated in terms of presence or absence of laminate wrinkles, photosensitivity, resolution, and presence or absence of pattern defects. Table 3 shows the evaluation results.

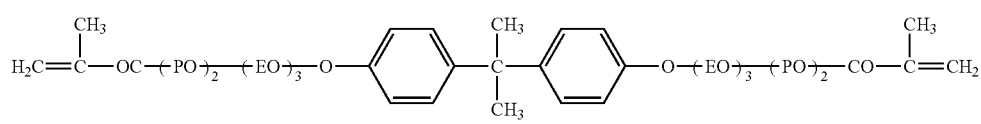

Structural Formula (76)

Example 5

A pattern forming material and a laminate were produced in the same manner as in Example 2 except that a polyethylene terephthalate film having a thickness of 16 μm (R340G manufactured by Mitsubishi Chemical Polyester Co., Ltd.) was used as a support, and trimethylolpropane polyethylene glycol trimethacrylate (the total number of ethylene glycol chains: 15) was added instead of dodecapropylene glycol diacrylate to the photosensitive resin composition solution.

With respect to the pattern forming material, the charged state at the time of peeling off the protective film and the surface resistance value of the support were measured. Table 3 shows the measurement results.

Further, the laminate was evaluated in terms of presence or absence of laminate wrinkles, photosensitivity, resolution, and presence or absence of pattern defects. Table 3 shows the evaluation results.

Example 6

A pattern forming material and a laminate were prepared in the same manner as in Example 1 except that the exposing device used in Example 1 was changed to the pattern forming apparatus to be described below.

With respect to the pattern forming material, the charged state at the time of peeling off the protective film and the surface resistance value of the support were measured. Table 3 shows the measurement results.

Further, the laminate was evaluated in terms of presence or absence of laminate wrinkles, photosensitivity, resolution, and presence or absence of pattern defects. Table 3 shows the evaluation results.

<<Pattern Forming Apparatus>>

In Example 6, a pattern forming apparatus was used which was equipped with a combined laser source as shown in FIGS. 27A to 32 as the above-noted light irradiation unit, DMD 50 provided with a micromirror array of 1,024 rows in the main-scanning direction and 768 lines in the sub-scanning direction as shown in FIGS. 4A and 4B as the above-noted light modulating unit and configured to control and drive only the array of 1,024 rows×256 lines, a microlens array 472 in which microlenses 474 each having a toric surface on one surface thereof as shown in FIG. 13 were disposed in an array, and optical systems 480 and 482 each configured to image the laser beam emitted through the microlens array 472 on a pattern forming material.

For the toric surface of the respective microlenses, the following one was used.

First, to compensate the distortion at irradiating surface of the microlenses 474 as the imaging parts of the DMD 50, the distortion of the irradiation surface was measured. FIG. 14 shows the measurement result. FIG. 14 shows that the positions having the same height as that of the reflective surface are connected by a contour line. The pitch between the respective contour lines is 5 nm. The X direction and Y direction in FIG. 14 are two diagonal directions of the micromirror 62, and the micromirror 62 rotates around the rotation axis which extends in the Y direction. FIGS. 15A and 15B respectively show the positional displacement of height of the reflective surface of the micromirror 62 along the X direction and the Y direction.

As shown in FIGS. 14, 15A, and 15B, distortion is found at the reflective surface of the micromirror 62. Particularly when focusing attention on the central part of the micromirror 62, it is found that the distortion of the reflective surface in one diagonal direction (Y direction) is larger than that of another diagonal direction (X direction). This means that when the distortion remains as it is, the shape of the laser beam B is distorted at the site that the laser beam B is collected by microlenses 55a of microlens array 55.

FIGS. 16A and 16B show the front shape and side shape of the entire microlens array 55 in detail. In FIGS. 16A and 16B, various parts of the microlens array are indicated as a unit of mm (millimeter). In the pattern forming process according to the present invention, micromirrors of 1,024 rows×256 lines of DMD 50 are driven as explained above; microlens arrays 55 are correspondingly constructed as 1,024 arrays in length direction and 256 arrays in width direction. In FIG. 16A, the site of each microlens is expressed as "j" th line and "k" th row.

FIGS. 17A and 17B respectively show the front shape and side shape of one microlens 55a of microlens array 55. FIG. 17A also shows the contour lines of microlens 55a. The end surface of each microlens 55a of irradiating side is of a non-spherical shape to compensate the distortion aberration of reflective surface of micromirrors 62. Specifically, microlens 55a is a toric lens; the curvature radius of optical X direction Rx is −0.125 mm, and the curvature radius of optical Y direction Ry is −0.1 mm.

Thus, the collecting condition of laser beam B within the cross section parallel to the X and Y directions are approximately as shown in FIGS. 18A and 18B respectively. Namely, when comparing the laser beam B within the cross section parallel to the X direction with the laser beam B within the cross section parallel to the Y direction, the curvature radius of microlens 55a is shorter, and the focal length is also shorter in the Y direction.

FIGS. 19A, 19B, 19C, and 19D show the simulations of beam diameter near the focal point of microlens 55a in the above noted shape by means of a computer. For the reference, FIGS. 20A, 20B, 20C, and 20D show the similar simulations for microlens in a spherical shape of Rx=Ry=−0.1 mm. The values of "z" in the figures are expressed as the evaluation sites in the focus direction of microlens 55a by the distance from the beam irradiating surface of microlens 55a.

The surface shape of microlens 55a in the simulation may be calculated by the following equation.

$$Z = \frac{C_x^2 X^2 + C_y^2 Y^2}{1 + SQRT(1 - C_x^2 X^2 - C_y^2 Y^2)}$$

In the above equation, Cx means the curvature (=1/Rx) in X direction, Cy means the curvature (=1/Ry) in Y direction, X means the distance from optical axis O in X direction, and Y means the distance from optical axis O in Y direction.

From the comparison of FIGS. 19A to 19D, and FIGS. 20A to 20D, it is apparent in the pattern forming process according to the present invention that the employment of the toric lens for the microlens 55a that has a shorter focal length in the cross section parallel to Y direction than the focal length in the cross section parallel to X direction may reduce the distortion of the beam shape near the collecting site. Accordingly, images can be exposed on pattern forming material 150 with more clearness and without distortion. In addition, it is apparent that the inventive mode shown in FIGS. 19A to 19D may bring about a wider region with smaller beam diameter, i.e. longer focal depth.

The aperture array 59 disposed near the focal point of the microlens array 55 is arranged such that only light beams passes through the microlenses 55a corresponding to respective apertures 59a are incident into the respective apertures 59a. In other words, by setting the aperture array 59, it is possible to prevent light beams from adjacent microlenses 55a which are not corresponding to the respective apertures 59a from being incident into the respective apertures 59a and to enhance the extinction ratio.

Comparative Example 1

A pattern forming material and a laminated were produced in the same manner as in Example 1 except that the protective film used in Example 1 was changed to a polypropylene film having a thickness of 12 μm (the number of fish-eyes each having an area of 2,000 μm² or more and a maximum height of 1 μm to 7 μm measured from the film surface was 20/m²).

With respect to the pattern forming material, the charged state at the time of peeling off the protective film and the surface resistance value of the support were measured. Table 3 shows the measurement results.

Further, the laminate was evaluated in terms of presence or absence of laminate wrinkles, photosensitivity, resolution, and presence or absence of pattern defects. Table 3 shows the evaluation results.

The results shown in Table 3 demonstrated that the pattern forming materials of Examples 1 to 5 in which 50/m² or more fish-eyes each having an area of 2,000 μm² or more and a maximum height of 1 μm to 7 μm resided in the respective protective films were respectively excellent in applicability of autocut lamination without causing dust adherence because of electrification at the time of peeling off the respective protective films and enabled to form a fine and precise pattern without causing pattern defect after developing as compared to the pattern forming material of Comparative Example 1 having fish-eyes less than 50/m². It was found that the resolution of pattern forming material was enhanced particularly when the pattern forming apparatus having microlenses each having a toric surface utilized in Example 6 was used.

INDUSTRIAL APPLICABILITY

Since the pattern forming material of the present invention is capable of suppressing generation of wrinkles and static electric charge on a substrate in a lamination step of laminating the pattern forming material on the substrate as well as capable of forming a fine and precise pattern, the pattern forming material can be preferably used in forming various patterns, in forming permanent patterns such as interconnection pattern, in producing members having a liquid crystal structure such as color filters, column members, rib members, spacers, and partition members, and in forming patterns such as hologram, micromachine, and proof. Since the pattern forming apparatus is provided with the pattern forming material of the present invention and the pattern forming process of the present invention uses the pattern forming material of the present invention, they can be preferably used in forming various patterns, in forming permanent patterns such as interconnection pattern, in producing members having a liquid crystal structure such as color filters, column members, rib members, spacers, and partition members, and in forming patterns such as hologram, micromachine, and proof.

The invention claimed is:

1. A pattern forming material, comprising:
    a support,
    a photosensitive layer, and
    a protective film,
    the photosensitive layer and the protective film being formed in this order on the support,
    wherein the number of fish-eyes each having an area of 2,000 μm² or more and a maximum height measured

TABLE 3

| | Protective film | | Support | Generation of wrinkles | | | |
| --- | --- | --- | --- | --- | --- | --- | --- |
| | No. of fish-eyes *1 | Charged state at the time of peeling off the protective layer *2 | Surface resistance (Ω/□) *3 | caused by autocut lamination | Photosensitivity (mJ/cm²) | Resolution (μm) | Pattern defect |
| Ex. 1 | 185 | Not charged | 6 × 10¹⁷ | A | 5 | 15 | A |
| Ex. 2 | 714 | Not charged | 6 × 10¹⁷ | A | 5 | 15 | A |
| Ex. 3 | 185 | Not charged | 7 × 10¹⁵ | A | 5 | 15 | A |
| Ex. 4 | 714 | Not charged | 6 × 10¹⁷ | A | 5 | 15 | A |
| Ex. 5 | 714 | Not charged | 4 × 10¹⁵ | A | 5 | 15 | A |
| Ex. 6 | 185 | Not charged | 6 × 10¹⁷ | A | 5 | 12 | A |
| Compara. Ex. 1 | 20 | Charged | 6 × 10¹⁷ | C | 5 | 15 | B |

*1: The number of fish-eyes each having an area of 2,000 μm² or more and a maximum height of 1 μm to 7 μm measured from the film surface contained in 1 m² of the protective film
*2: Presence or absence of dust adherence induced by electrification on the peeled surface
*3: 10° C. and 35% RH from the film surface of 1 μm to 7 μm residing in the protective film is 50/m² to 1,000/m², and wherein each of the fish-eyes is a region surrounded by the outer circumference of an interference fringe or a Newton ring appearing around a foreign substance in the protective film when the protective film is irradiated with a transmissive light beam.

2. The pattern forming material according to claim 1, wherein the maximum length of the fish-eyes is from about 80 μm to about 130 μm.

3. The pattern forming material according to claim 1, wherein the protective film comprises at least one selected from polypropylene resins, ethylene-propylene copolymer resins, and polyethylene terephthalate resins.

4. The pattern forming material according to claim 1, wherein the support is a polyethylene terephthalate film.

5. The pattern forming material according to claim 1, wherein at least a surface of the support on which the photosensitive layer is not laminated comprises a conductive material; and the surface electrical resistance value of the support surface is $1 \times 10^{18} \Omega/\square$ or less under the environment of a temperature of 10° C. and a relative humidity of 35%.

6. The pattern forming material according to claim 1, wherein the support is a polyethylene terephthalate film containing a conductive material.

7. The pattern forming material according to claim 1, wherein the photosensitive layer comprises a binder, a polymerizable compound, a photopolymerization initiator, and a photosensitizer; and the photosensitizer is a condensed ring compound.

8. The pattern forming material according to claim 7, wherein the polymerizable compound comprises at least one selected from compounds each containing a propylene oxide group, compounds each containing an ethylene oxide group, compounds each containing a urethane group, and compounds each containing an aryl group.

9. The pattern forming material according to claim 7, wherein the binder comprises a copolymer of at least any one of a styrene and a styrene derivative.

10. The pattern forming material according to claim 1, wherein the photosensitive layer comprises a polymerization inhibitor.

11. The pattern forming material according to claim 1, wherein when the photosensitive layer is exposed and developed, the minimum optical energy of a light beam used for exposing the photosensitive layer so as not to change the thickness of exposed sites after the exposure and developing is 10 mJ/cm² or less.

12. A pattern forming process, comprising:
exposing a photosensitive layer in a pattern forming material,
wherein the pattern forming material is a pattern forming material
which comprises a support, a photosensitive layer, and a protective film, the photosensitive layer and the protective film being formed in this order on the support; and
the number of fish-eyes each having an area of 2,000 μm² or more and a maximum height measured from the film surface of 1 μm to 7 μm residing in the protective film is 50 /m² to 1,000/m², and
wherein each of the fish-eyes is a region surrounded by the outer circumference of an interference fringe or a Newton ring appearing around a foreign substance in the protective film when the protective film is irradiated with a transmissive light beam.

13. The pattern forming process according to claim 12, wherein after the light beam is modulated by the light modulating unit, the photosensitive layer is exposed through a microlens array having an array of microlenses each having a non-spherical surface capable of compensating the aberration due to distortion at irradiating surface of an imaging portion in the light modulating unit.

14. The pattern forming process according to claim 13, wherein the non-spherical surface is a toric surface.

15. The pattern forming process according to claim 12 wherein after exposing the photosensitive layer, the photosensitive layer is developed.

16. The pattern forming process according to claim 15, wherein after developing the photosensitive layer, a permanent pattern is formed on the surface of the photosensitive layer.

* * * * *